(12) United States Patent
Kim et al.

(10) Patent No.: US 9,240,862 B2
(45) Date of Patent: Jan. 19, 2016

(54) APPARATUS FOR TRANSMITTING BROADCAST SIGNALS, APPARATUS FOR RECEIVING BROADCAST SIGNALS, METHOD FOR TRANSMITTING BROADCAST SIGNALS AND METHOD FOR RECEIVING BROADCAST SIGNALS

(71) Applicant: LG Electronics Inc., Seoul (KR)

(72) Inventors: Jinwoo Kim, Seoul (KR); Jongwoong Shin, Seoul (KR); Woosuk Ko, Seoul (KR); Jaeho Hwang, Seoul (KR); Sungryong Hong, Seuol (KR)

(73) Assignee: LG ELECTRONICS INC., Seoul (KR)

(*) Notice: Subject to any disclaimer, the term of this patent is extended or adjusted under 35 U.S.C. 154(b) by 0 days.

(21) Appl. No.: 14/548,956

(22) Filed: Nov. 20, 2014

(65) Prior Publication Data

US 2015/0155967 A1     Jun. 4, 2015

Related U.S. Application Data

(60) Provisional application No. 61/910,123, filed on Nov. 29, 2013, provisional application No. 61/910,124, filed on Nov. 29, 2013, provisional application No. 61/910,125, filed on Nov. 29, 2013, provisional application No. 61/910,128, filed on Nov. 29, 2013.

(51) Int. Cl.
*H04L 27/00*     (2006.01)
*H04L 1/00*     (2006.01)
(Continued)

(52) U.S. Cl.
CPC ............. *H04L 1/0042* (2013.01); *H04H 20/72* (2013.01); *H04H 60/07* (2013.01); *H04L 1/0045* (2013.01); *H04L 5/0048* (2013.01); *H04L 27/2627* (2013.01); *H04L 27/2649* (2013.01); *H04L 5/0007* (2013.01)

(58) Field of Classification Search
CPC .. H04L 1/0042; H04L 27/2649; H04L 1/0045; H04L 5/0007; H04L 27/2627; H04H 20/72; H04H 20/57
USPC .......................................................... 375/295
See application file for complete search history.

(56) References Cited

U.S. PATENT DOCUMENTS

2009/0103649 A1*   4/2009   Vare et al. ...................... 375/295
2010/0085985 A1*   4/2010   Pekonen et al. ............... 370/474
(Continued)

FOREIGN PATENT DOCUMENTS

EP     2629444 A1     8/2013

*Primary Examiner* — Juan A Torres
(74) *Attorney, Agent, or Firm* — Dentons US LLP

(57) ABSTRACT

A method and an apparatus for transmitting broadcast signals thereof. The apparatus comprises an encoder for encoding service data corresponding to each of a plurality of data transmission path, wherein each of the data transmission path carries at least one service component for broadcast services, an encoder for encoding signaling data, wherein the signaling data includes static data and dynamic data, a frame builder for building signal frames, wherein each of signal frames includes the encoded service data and the encoded signaling data, wherein each of signal frames belongs to one of the broadcast services, wherein the static data remain constant in the signal frames belonging to the broadcast service in a duration of a super frame and the dynamic data changes by the signal frames, a modulator for modulating the signal frames by an OFDM (Orthogonal Frequency Division Multiplex) scheme and a transmitter for transmitting the broadcast signals carrying the modulated signal frames.

10 Claims, 42 Drawing Sheets

(51) Int. Cl.
  *H04L 27/26* (2006.01)
  *H04H 20/72* (2008.01)
  *H04H 60/07* (2008.01)
  *H04L 5/00* (2006.01)

(56) References Cited

U.S. PATENT DOCUMENTS

| | | | |
|---|---|---|---|
| 2010/0086087 A1* | 4/2010 | Pekonen et al. | 375/346 |
| 2010/0226426 A1* | 9/2010 | Tupala et al. | 375/240.01 |
| 2010/0246719 A1* | 9/2010 | Ko et al. | 375/303 |
| 2010/0262708 A1 | 10/2010 | Bouazizi et al. | |
| 2010/0290561 A1* | 11/2010 | Ko et al. | 375/298 |
| 2010/0309384 A1* | 12/2010 | Asjadi | 348/725 |
| 2010/0309853 A1* | 12/2010 | Richardson et al. | 370/329 |
| 2011/0131464 A1* | 6/2011 | Ko et al. | 714/752 |
| 2011/0167464 A1 | 7/2011 | Yun et al. | |
| 2011/0286535 A1* | 11/2011 | Ko et al. | 375/259 |
| 2012/0300690 A1* | 11/2012 | Vare et al. | 370/312 |
| 2013/0163556 A1* | 6/2013 | Lee et al. | 370/330 |
| 2013/0223402 A1* | 8/2013 | Feng et al. | 370/330 |

* cited by examiner

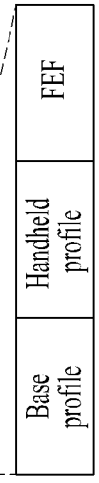
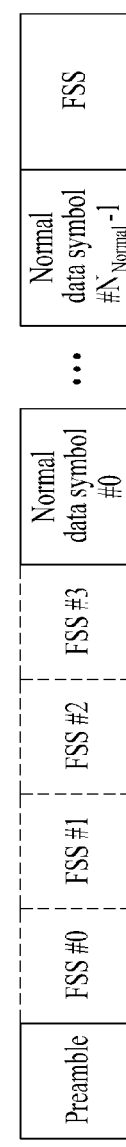
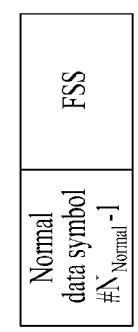
FIG. 10(a)
FIG. 10(b)
FIG. 10(c)
FIG. 10(d)

| Content | Bits |
|---|---|
| PHY_PROFILE | 3 |
| FFT_SIZE | 2 |
| GI_FRACTION | 3 |
| EAC_FLAG | 1 |
| PILOT_MODE | 1 |
| PAPR_FLAG | 1 |
| FRU_CONFIGURE | 3 |
| RESERVED | 7 |

FIG. 13

| Content | Bits |
|---|---|
| PREAMBLE_DATA<br>NUM_FRAME_FRU<br>PAYLOAD_TYPE<br>NUM_FSS<br>SYSTEM_VERSION | 20<br>2<br>3<br>2<br>8 |
| CELL_ID<br>NETWORK_ID<br>SYSTEM_ID | 16<br>16<br>16 |
| for i = 0:3<br>    FRU_PHY_PROFILE<br>    FRU_FRAME_LENGTH<br>    FRU_GI_FRACTION<br>    RESERVED<br>end | <br>3<br>2<br>3<br>4<br> |
| PLS2_FEC_TYPE<br>PLS2_MOD<br>PLS2_SIZE_CELL<br>PLS2_STAT_SIZE_BIT<br>PLS2_SYN_SIZE_BIT<br>PLS2_REP_FLAG<br>PLS2_REP_SIZE_CELL<br>PLS2_NEXT_FEC_TYPE<br>PLS2_NEXT_MODE<br>PLS2_NEXT_REP_FLAG<br>PLS2_NEXT_REP_SIZE_CELL<br>PLS2_NEXT_REP_STAT_SIZE_BIT<br>PLS2_NEXT_REP_DYN_SIZE_BIT<br>PLS2_AP_MODE<br>PLS2_AP_SIZE_CELL<br>PLS2_NEXT_AP_MODE<br>PLS2_NEXT_AP_SIZE_CELL | 2<br>3<br>15<br>14<br>14<br>1<br>15<br>2<br>3<br>1<br>15<br>14<br>14<br>2<br>15<br>2<br>15 |
| RESERVED<br>CRC 32 | 32<br>32 |

FIG. 14

| Content | Bits |
|---|---|
| FIC_FLAG | 1 |
| AUX_FLAG | 1 |
| NUM_DP | 6 |
| for i = 1 : NUM_DP | |
|     DP_ID | 6 |
|     DP_TYPE | 3 |
|     DP_GROUP_ID | 8 |
|     BASE_DP_ID | 6 |
|     DP_FEC_TYPE | 2 |
|     DP_COD | 4 |
|     DP_MOD | 4 |
|     DP_SSD_FLAG | 1 |
|     if PHY_PROFILE = '010' | |
|         DP_MIMO | 3 |
|     end | |
|     DP_TI_TYPE | 1 |
|     DP_TI_LENGTH | 2 |
|     DP_TI_BYPASS | 1 |
|     DP_FRAME_INTERVAL | 2 |
|     DP_FIRST_FRAME_IDX | 5 |
|     DP_NUM_BLOCK_MAX | 10 |
|     DP_PAYLOAD_TYPE | 2 |
|     DP_INBAND_MODE | 2 |
|     DP_PROTOCOL_TYPE | 2 |
|     DP_CRC_MODE | 2 |
|     if DP_PAYLOAD_TYPE == TS('00') | |
|         DNP_MODE | 2 |
|         ISSY_MODE | 2 |
|         HC_MODE_TS | 2 |
|         if HC_MODE_TS == '01' or '10' | |
|             PID | 13 |
|         end | |
|     if DP_PAYLOAD_TYPE == IP('01') | |
|         HC_MODE_IP | 2 |
|     end | |
|     RESERVED | 8 |
| end | |
| if FIC_FLAG == 1 | |
|     FIC_VERSION | 8 |
|     FIC_LENGTH_BYTE | 13 |
|     RESERVED | 8 |
| end | |
| if AUX_FLAG == 1 | |
|     NUM_AUX | 4 |
|     AUX_CONFIG_RFU | 8 |
|     for -1 : NUM_AUX | |
|         AUX_STREAM_TYPE | 4 |
|         AUX_PRIVATE_CONF | 28 |
|     end | |
| end | |

| Content | | Bit |
|---|---|---|
| FRAME_INDEX | | 5 |
| PLS_CHANGE_COUNTER | | 4 |
| FIC_CHANGE_COUNTER | | 4 |
| RESERVED | | 16 |
| for i = 1: NUM_DP | | |
| | DP_ID | 6 |
| | DP_START | 15 (or 13) |
| | DP_NUM_BLOCK | 10 |
| end | RESERVED | 8 |
| EAC_FLAG | | 1 |
| EAS_WAKE_UP_VERSION_NUM | | 8 |
| if EAC_FLAG == 1 | | |
| | EAC_LENGTH_BYTE | 12 |
| else | | |
| | EAC_COUNTER | 12 |
| end | | |
| for i=1:NUM_AUX | | |
| | AUX_PRIVATE_DYN | 48 |
| end | | |
| CRC 32 | | 32 |

FIG. 29 single PLS-post payload :

M separated blocks :

Encoding by mother code :

Transmitting block :

- Bit from PLS-post-STAT
- Bit from PLS-post-DYN
- Dummy data
- parity bits

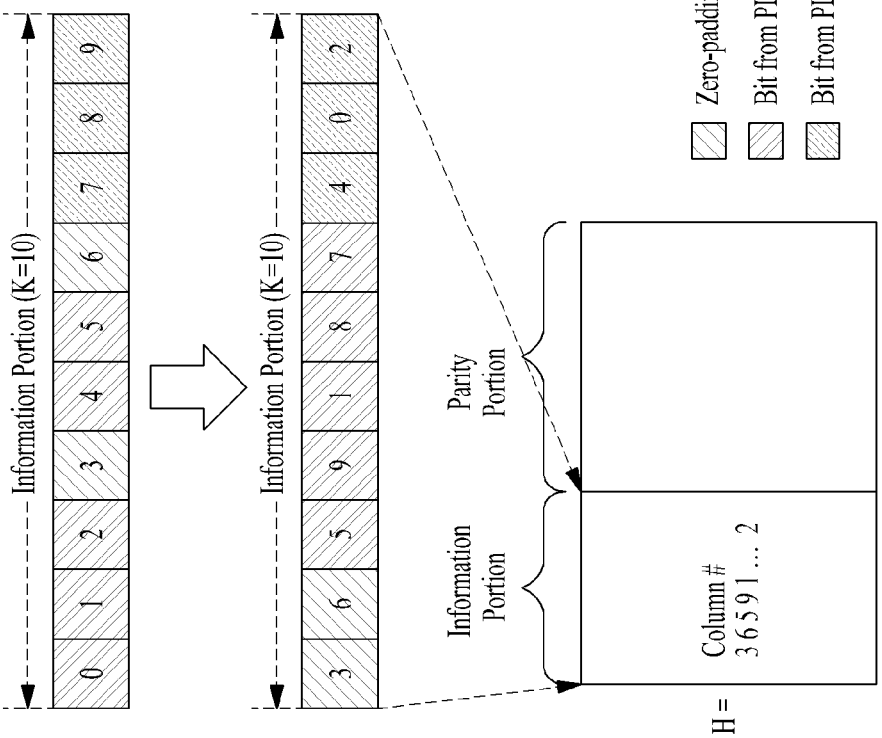

FIG. 37

Original QC-IRA column table (Table 1)

```
36 1190 1299 652 1265 78 2095 1412 2925 336 481 1886 2860 306 2935 1352 2685 2578 1971 1720 750 2011 572 717 1871
36 721 1730 2237 258 2419 2024 1197 262 1091 193 2030 2319 1996 2141 2970 3043 2506 2220 241 1610 1863 3089 714 2517
2772 2557 363 1517 402 190 1847 1633 698 555 2680 1277 2107 1496 1029 2362 3227 3156 2941 2906 2297 1038 645 502 2303
1405 2312 1031 816
542 1119 1863 1000
1552 1307 2136 135
619 1357 281 2840
1624 1887 895 646
802 92 2796 1295
2598 1127 270 247
1232 1452 2397 1180
1593 2042 176 1186
```

Codeword shortening order (Table 2)

| Shortening order | 1 | 2 | 3 | 4 | 5 | 6 | 7 | 8 | 9 | 10 | 11 | 12 |
|---|---|---|---|---|---|---|---|---|---|---|---|---|
| Column position | 2 | 5 | 7 | 3 | 11 | 10 | 12 | 6 | 8 | 9 | 4 | 1 |

Modified QC-IRA column table (Table 3)

```
36 721 1730 2237 258 2419 2024 1197 262 1091 193 2030 2319 1996 2141 2970 3043 2506 2220 241 1610 1863 3089 714 2517
542 1119 1863 1000
619 1357 281 2840
2772 2557 363 1517 402 190 1847 1633 698 555 2680 1277 2107 1496 1029 2362 3227 3156 2941 2906 2297 1038 645 502 2303
1232 1452 2397 1180
2598 1127 270 247
1593 2042 176 1186
1552 1307 2136 135
1624 1887 895 646
802 92 2796 1295
1405 2312 1031 816
36 1190 1299 652 1265 78 2095 1412 2925 336 481 1886 2860 306 2935 1352 2685 2578 1971 1720 750 2011 572 717 1871
```

FIG. 40(a)
Signaling Payload
FIG. 40(b)
Normal Encoding
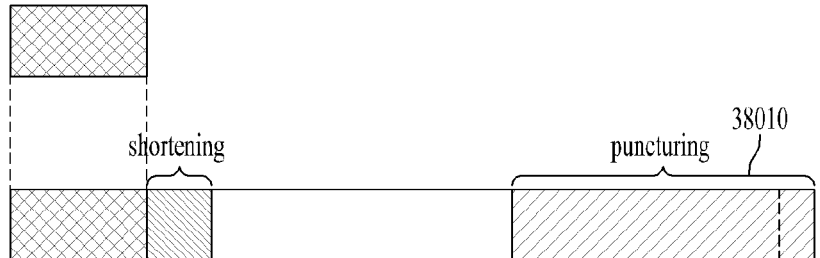
FIG. 40(c)
Normal encoder output
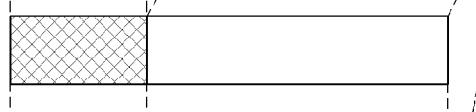
FIG. 40(d)
AP Encoder output
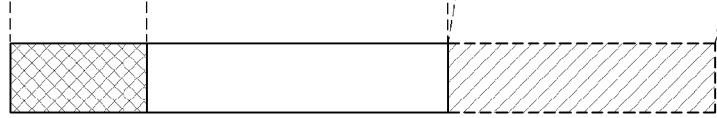
 Effective data portion in LDPC Code
 Shortening portion in LDPC Code
 Puncturing data portion in LDPC Code FIG. 41(a)
Signaling Payload
FIG. 41(b)
PS Encoding
FIG. 41(c)
PS Encoder output
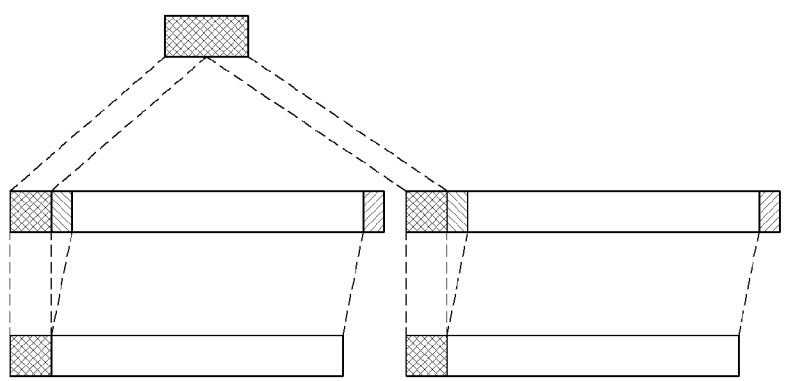
 Shortening portion in LDPC Code
 Puncturing portion in LDPC Code

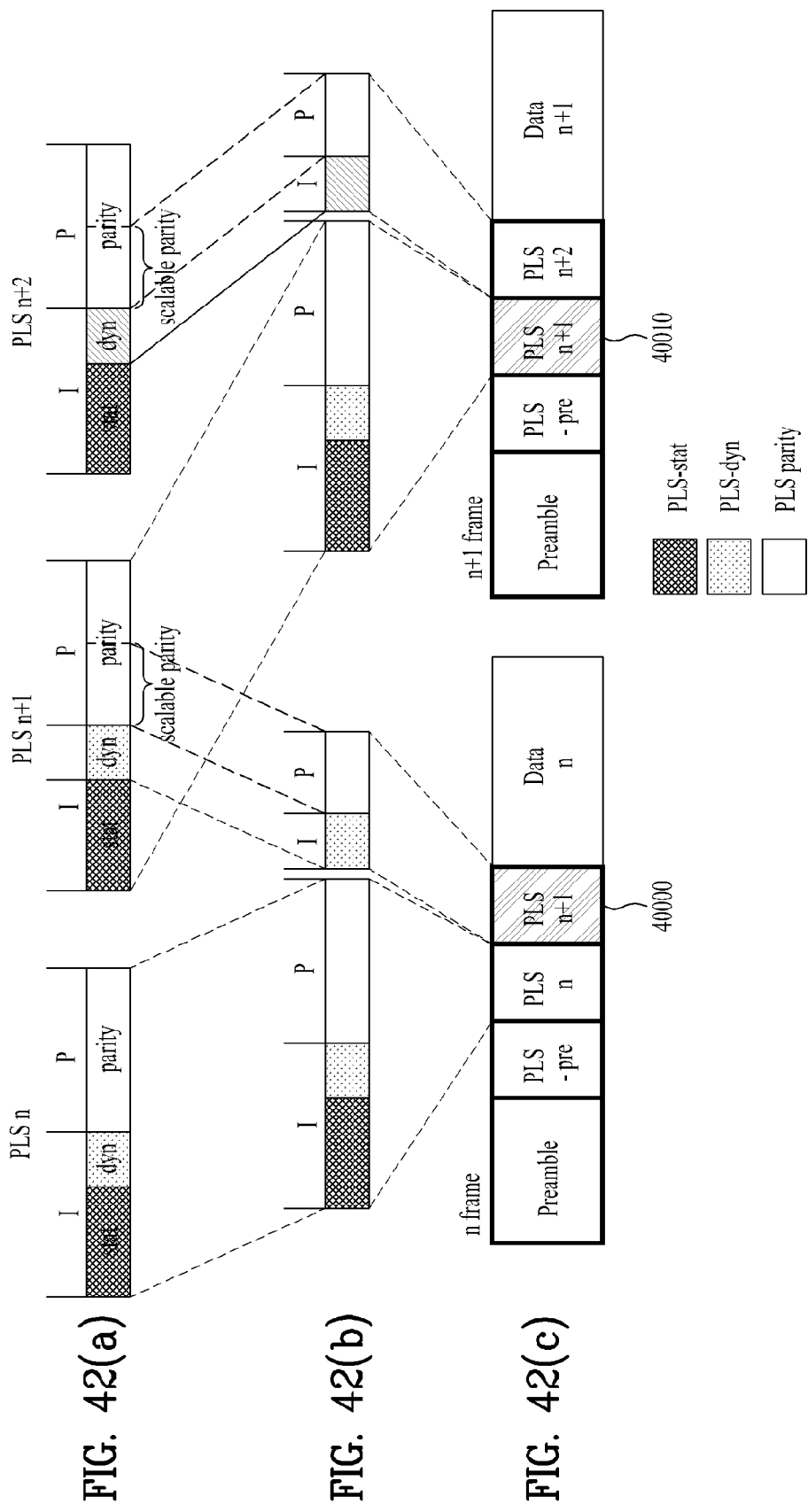

FIG. 46(a)

Permutation pattern of interleaving group for PLS1

| $N_{group}$ | $\pi_s(j)$ $(0 \leq j < N_{group})$ | | | | | | | | | | | |
|---|---|---|---|---|---|---|---|---|---|---|---|---|
| | $\pi_s(0)$ | $\pi_s(1)$ | $\pi_s(2)$ | $\pi_s(3)$ | $\pi_s(4)$ | $\pi_s(5)$ | $\pi_s(6)$ | $\pi_s(7)$ | $\pi_s(8)$ | $\pi_s(9)$ | $\pi_s(10)$ | $\pi_s(11)$ |
| 12 | 0 | 3 | 4 | 1 | 6 | 9 | 10 | 7 | 5 | 8 | 2 | 11 |

FIG. 46(b)

Permutation order of parity group to be punctured for PLS1

| Mother Code type | Order of parity group to be punctured, $\{\pi_p(j)\}, (0 \leq j < Q_{ldpc} = 36)$ | | | | | | | | | | | | | | | | | | |
|---|---|---|---|---|---|---|---|---|---|---|---|---|---|---|---|---|---|---|---|
| | $\pi_p(1)$ | $\pi_p(2)$ | $\pi_p(3)$ | $\pi_p(4)$ | $\pi_p(5)$ | $\pi_p(6)$ | $\pi_p(7)$ | $\pi_p(8)$ | $\pi_p(9)$ | $\pi_p(10)$ | $\pi_p(11)$ | $\pi_p(12)$ | $\pi_p(13)$ | $\pi_p(14)$ | $\pi_p(15)$ | $\pi_p(16)$ | $\pi_p(17)$ | $\pi_p(18)$ | |
| | $\pi_p(19)$ | $\pi_p(20)$ | $\pi_p(21)$ | $\pi_p(22)$ | $\pi_p(23)$ | $\pi_p(24)$ | $\pi_p(25)$ | $\pi_p(26)$ | $\pi_p(27)$ | $\pi_p(28)$ | $\pi_p(29)$ | $\pi_p(30)$ | $\pi_p(31)$ | $\pi_p(32)$ | $\pi_p(33)$ | $\pi_p(34)$ | $\pi_p(35)$ | $\pi_p(36)$ | |
| 4K - 1/4 | 0 | 2 | 3 | 4 | 8 | 13 | 15 | 16 | 18 | 21 | 22 | 24 | 29 | 30 | 34 | 6 | 1 | 5 |
| | 7 | 9 | 10 | 11 | 12 | 14 | 17 | 19 | 20 | 23 | 25 | 26 | 27 | 28 | 31 | 32 | 33 | 35 |

FIG. 47(a)

Permutation order of parity group to be punctured for 4K-1/4

| Mother Code type | Order of parity group to be punctured, $\{\pi_p(j)\}, (0 \leq j < Q_{ldpc} = 36)$ | | | | | | | | | | | | | | | | | |
|---|---|---|---|---|---|---|---|---|---|---|---|---|---|---|---|---|---|---|
| | $\pi_p(1)$ | $\pi_p(2)$ | $\pi_p(3)$ | $\pi_p(4)$ | $\pi_p(5)$ | $\pi_p(6)$ | $\pi_p(7)$ | $\pi_p(8)$ | $\pi_p(9)$ | $\pi_p(10)$ | $\pi_p(11)$ | $\pi_p(12)$ | $\pi_p(13)$ | $\pi_p(14)$ | $\pi_p(15)$ | $\pi_p(16)$ | $\pi_p(17)$ | $\pi_p(18)$ |
| 4K-1/4 | 0 | 3 | 5 | 7 | 9 | 14 | 19 | 20 | 22 | 25 | 28 | 29 | 33 | 35 | 12 | 16 | 1 | 26 |
| | $\pi_p(19)$ | $\pi_p(20)$ | $\pi_p(21)$ | $\pi_p(22)$ | $\pi_p(23)$ | $\pi_p(24)$ | $\pi_p(25)$ | $\pi_p(26)$ | $\pi_p(27)$ | $\pi_p(28)$ | $\pi_p(29)$ | $\pi_p(30)$ | $\pi_p(31)$ | $\pi_p(32)$ | $\pi_p(33)$ | $\pi_p(34)$ | $\pi_p(35)$ | $\pi_p(36)$ |
| | 30 | 18 | 17 | 6 | 11 | 32 | 23 | 10 | 24 | 2 | 4 | 8 | 13 | 15 | 21 | 27 | 31 | 34 |

FIG. 47(b)

Permutation order of parity group to be punctured for 7K-3/10

| Mother Code type | Order of parity group to be punctured, $\{\pi_p(j)\}, (0 \leq j < Q_{ldpc} = 56)$ | | | | | | | | | | | | | | | | | |
|---|---|---|---|---|---|---|---|---|---|---|---|---|---|---|---|---|---|---|
| | $\pi_p(1)$ | $\pi_p(2)$ | $\pi_p(3)$ | $\pi_p(4)$ | $\pi_p(5)$ | $\pi_p(6)$ | $\pi_p(7)$ | $\pi_p(8)$ | $\pi_p(9)$ | $\pi_p(10)$ | $\pi_p(11)$ | $\pi_p(12)$ | $\pi_p(13)$ | $\pi_p(14)$ | $\pi_p(15)$ | $\pi_p(16)$ | $\pi_p(17)$ | $\pi_p(18)$ |
| 7K-3/10 | 1 | 5 | 7 | 9 | 15 | 17 | 20 | 22 | 23 | 28 | 34 | 39 | 40 | 42 | 44 | 45 | 48 | 51 |
| | $\pi_p(19)$ | $\pi_p(20)$ | $\pi_p(21)$ | $\pi_p(22)$ | $\pi_p(23)$ | $\pi_p(24)$ | $\pi_p(25)$ | $\pi_p(26)$ | $\pi_p(27)$ | $\pi_p(28)$ | $\pi_p(29)$ | $\pi_p(30)$ | $\pi_p(31)$ | $\pi_p(32)$ | $\pi_p(33)$ | $\pi_p(34)$ | $\pi_p(35)$ | $\pi_p(36)$ |
| | 32 | 2 | 11 | 26 | 31 | 25 | 0 | 29 | 53 | 14 | 50 | 19 | 12 | 47 | 36 | 55 | 43 | 3 |
| | $\pi_p(37)$ | $\pi_p(38)$ | $\pi_p(39)$ | $\pi_p(40)$ | $\pi_p(41)$ | $\pi_p(42)$ | $\pi_p(43)$ | $\pi_p(44)$ | $\pi_p(45)$ | $\pi_p(46)$ | $\pi_p(47)$ | $\pi_p(48)$ | $\pi_p(49)$ | $\pi_p(50)$ | $\pi_p(51)$ | $\pi_p(52)$ | $\pi_p(53)$ | $\pi_p(54)$ |
| | 4 | 6 | 8 | 10 | 13 | 16 | 18 | 21 | 24 | 27 | 30 | 33 | 35 | 37 | 38 | 41 | 46 | 49 |
| | $\pi_p(55)$ | $\pi_p(56)$ | | | | | | | | | | | | | | | | |
| | 52 | 54 | | | | | | | | | | | | | | | | |

APPARATUS FOR TRANSMITTING BROADCAST SIGNALS, APPARATUS FOR RECEIVING BROADCAST SIGNALS, METHOD FOR TRANSMITTING BROADCAST SIGNALS AND METHOD FOR RECEIVING BROADCAST SIGNALS

This application claims the benefit of U.S. Provisional Application No. 61/910,123 filed on Nov. 29, 2013, U.S. Provisional Application No. 61/910,124 filed on Nov. 29, 2013, U.S. Provisional Application No. 61/910,125 filed on Nov. 29, 2013, U.S. Provisional Application No. 61/910,128 filed on Nov. 29, 2013, which is hereby incorporated by reference as if fully set forth herein.

BACKGROUND OF THE INVENTION

1. Field of the Invention

The present invention relates to an apparatus for transmitting broadcast signals, an apparatus for receiving broadcast signals and methods for transmitting and receiving broadcast signals.

2. Discussion of the Related Art

As analog broadcast signal transmission comes to an end, various technologies for transmitting/receiving digital broadcast signals are being developed. A digital broadcast signal may include a larger amount of video/audio data than an analog broadcast signal and further include various types of additional data in addition to the video/audio data.

That is, a digital broadcast system can provide HD (high definition) images, multi-channel audio and various additional services. However, data transmission efficiency for transmission of large amounts of data, robustness of transmission/reception networks and network flexibility in consideration of mobile reception equipment need to be improved for digital broadcast.

SUMMARY OF THE INVENTION

Accordingly, the present invention is directed to an apparatus for transmitting broadcast signals and an apparatus for receiving broadcast signals for future broadcast services and methods for transmitting and receiving broadcast signals for future broadcast services.

An object of the present invention is to provide an apparatus and method for transmitting broadcast signals to multiplex data of a broadcast transmission/reception system providing two or more different broadcast services in a time domain and transmit the multiplexed data through the same radio frequency (RF) signal bandwidth and an apparatus and method for receiving broadcast signals corresponding thereto.

Another object of the present invention is to provide an apparatus for transmitting broadcast signals, an apparatus for receiving broadcast signals and methods for transmitting and receiving broadcast signals to classify data corresponding to services by components, transmit data corresponding to each component as a data pipe, receive and process the data Still another object of the present invention is to provide an apparatus for transmitting broadcast signals, an apparatus for receiving broadcast signals and methods for transmitting and receiving broadcast signals to signal signaling information necessary to provide broadcast signals.

TECHNICAL SOLUTION

To achieve the object and other advantages and in accordance with the purpose of the invention, as embodied and broadly described herein, a method for transmitting broadcast signals, the method comprises encoding service data corresponding to each of a plurality of data transmission path, wherein each of the data transmission path carries at least one service component for broadcast services, encoding signaling data, wherein the signaling data includes static data and dynamic data, building signal frames, wherein each of signal frames includes the encoded service data and the encoded signaling data, wherein each of signal frames belongs to one of the broadcast services, wherein the static data remain constant in the signal frames belonging to the broadcast service in a duration of a super frame and the dynamic data changes by the signal frames, modulating the signal frames by an OFDM (Orthogonal Frequency Division Multiplex) scheme and transmitting the broadcast signals carrying the modulated signal frames.

Advantageous Effects

The present invention can process data according to service characteristics to control QoS (Quality of Services) for each service or service component, thereby providing various broadcast services.

The present invention can achieve transmission flexibility by transmitting various broadcast services through the same RF signal bandwidth.

The present invention can improve data transmission efficiency and increase robustness of transmission/reception of broadcast signals using a multiple-input multiple-output (MIMO) system.

According to the present invention, it is possible to provide broadcast signal transmission and reception methods and apparatus capable of receiving digital broadcast signals without error even with mobile reception equipment or in an indoor environment.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIGS. 10(a), 10(b), 10(c) and 10(d) illustrate a frame structure according to an embodiment of the present invention.

FIG. 13 illustrates PLS1 data according to an embodiment of the present invention.

FIG. 14 illustrates PLS2 data according to an embodiment of the present invention.

FIG. 29 illustrates interleaved XFECBLOCKs from each interleaving array according to an embodiment of the present invention.

FIGS. 36(a), 36(b), 36(c) and 36(d) illustrate a scheme of encoding PLS data according to an embodiment of the present invention.

FIG. 37 illustrates a codeword rearranged according to the method described in FIG. 36.

FIGS. 40(a), 40(b), 40(c) and 40(d) are views illustrating a procedure for encoding adaptation parity according to another embodiment of the present invention.

FIGS. 41(a), 41(b) and 41(c) are views illustrating a payload splitting mode for splitting PLS data input to the PLS FEC encoder module before LDPC-encoding the input PLS data according to another embodiment of the present invention.

FIGS. 42(a), 42(b) and 42(c) are views illustrating a procedure for performing PLS repetition and outputting a frame according to another embodiment of the present invention.

FIGS. 46(a) and 46(b) show tables that represents permutation pattern for PLS1 data and permutation order for PLS1 data which are described in FIG. 35 to FIG. 37.

FIGS. 47(a) and 47(b) show a table that represents permutation order for PLS2 which is described in FIG. 35 to FIG. 37.

DETAILED DESCRIPTION OF THE INVENTION

Figure 1:
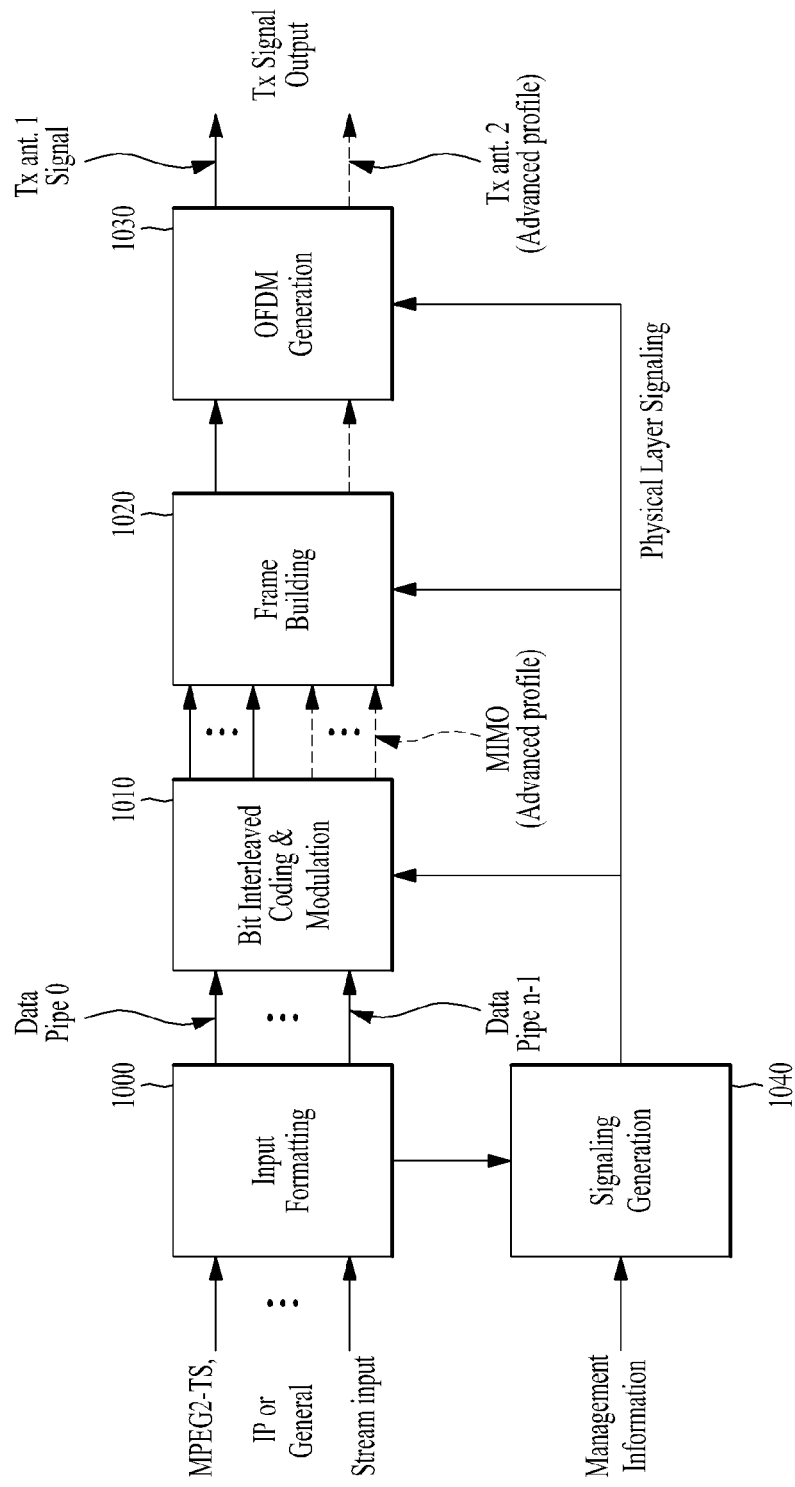
FIG. 1 illustrates a structure of an apparatus for transmitting broadcast signals for future broadcast services according to an embodiment of the present invention.

Reference will now be made in detail to the preferred embodiments of the present invention, examples of which are illustrated in the accompanying drawings. The detailed description, which will be given below with reference to the accompanying drawings, is intended to explain exemplary embodiments of the present invention, rather than to show the only embodiments that can be implemented according to the present invention. The following detailed description includes specific details in order to provide a thorough understanding of the present invention. However, it will be apparent to those skilled in the art that the present invention may be practiced without such specific details.

Although most terms used in the present invention have been selected from general ones widely used in the art, some terms have been arbitrarily selected by the applicant and their meanings are explained in detail in the following description as needed. Thus, the present invention should be understood based upon the intended meanings of the terms rather than their simple names or meanings.

The present invention provides apparatuses and methods for transmitting and receiving broadcast signals for future broadcast services. Future broadcast services according to an embodiment of the present invention include a terrestrial broadcast service, a mobile broadcast service, a UHDTV service, etc. The present invention may process broadcast signals for the future broadcast services through non-MIMO (Multiple Input Multiple Output) or MIMO according to one embodiment. A non-MIMO scheme according to an embodiment of the present invention may include a MISO (Multiple Input Single Output) scheme, a SISO (Single Input Single Output) scheme, etc.

While MISO or MIMO uses two antennas in the following for convenience of description, the present invention is applicable to systems using two or more antennas.

The present invention may defines three physical layer (PHY) profiles—base, handheld and advanced profiles—each optimized to minimize receiver complexity while attaining the performance required for a particular use case. The physical layer (PHY) profiles are subsets of all configurations that a corresponding receiver should implement.

The three PHY profiles share most of the functional blocks but differ slightly in specific blocks and/or parameters. Additional PHY profiles can be defined in the future. For the system evolution, future profiles can also be multiplexed with the existing profiles in a single RF channel through a future extension frame (FEF). The details of each PHY profile are described below.

1. Base Profile

The base profile represents a main use case for fixed receiving devices that are usually connected to a roof-top antenna. The base profile also includes portable devices that could be transported to a place but belong to a relatively stationary reception category. Use of the base profile could be extended to handheld devices or even vehicular by some improved implementations, but those use cases are not expected for the base profile receiver operation.

Target signal to noise ratio (SNR) range of reception is from approximately 10 to 20 dB, which includes the 15 dB SNR reception capability of the existing broadcast system (e.g. ATSC A/53). The receiver complexity and power consumption is not as critical as in the battery-operated handheld devices, which will use the handheld profile. Key system parameters for the base profile are listed in below table 1.

TABLE 1

| | |
|---|---|
| low density parity check (LDPC) codeword length | 16 k, 64 k bits |
| Constellation size | 4~10 bpcu (bits per channel use) |
| Time de-interleaving memory size | ≤$2^{19}$ data cells |
| Pilot patterns | Pilot pattern for fixed reception |
| fast Fourier transform (FFT) size | 16 k, 32 k points |

2. Handheld Profile

The handheld profile is designed for use in handheld and vehicular devices that operate with battery power. The devices can be moving with pedestrian or vehicle speed. The power consumption as well as the receiver complexity is very important for the implementation of the devices of the handheld profile. The target SNR range of the handheld profile is approximately 0 to 10 dB, but can be configured to reach below 0 dB when intended for deeper indoor reception.

In addition to low SNR capability, resilience to the Doppler Effect caused by receiver mobility is the most important performance attribute of the handheld profile. Key system parameters for the handheld profile are listed in the below table 2.

TABLE 2

| | |
|---|---|
| LDPC codeword length | 16 k bits |
| Constellation size | 2~8 bpcu |
| Time de-interleaving memory size | ≤$2^{18}$ data cells |
| Pilot patterns | Pilot patterns for mobile and indoor reception |
| FFT size | 8 k, 16 k points |

3. Advanced Profile

The advanced profile provides highest channel capacity at the cost of more implementation complexity. This profile requires using MIMO transmission and reception, and UHDTV service is a target use case for which this profile is specifically designed. The increased capacity can also be used to allow an increased number of services in a given bandwidth, e.g., multiple SDTV or HDTV services.

The target SNR range of the advanced profile is approximately 20 to 30 dB. MIMO transmission may initially use existing elliptically-polarized transmission equipment, with extension to full-power cross-polarized transmission in the future. Key system parameters for the advanced profile are listed in below table 3.

TABLE 3

| | |
|---|---|
| LDPC codeword length | 16 k, 64 k bits |
| Constellation size | 8~12 bpcu |
| Time de-interleaving memory size | ≤$2^{19}$ data cells |
| Pilot patterns | Pilot pattern for fixed reception |
| FFT size | 16 k, 32 k points |

In this case, the base profile can be used as a profile for both the terrestrial broadcast service and the mobile broadcast service. That is, the base profile can be used to define a concept of a profile which includes the mobile profile. Also, the advanced profile can be divided advanced profile for a base profile with MIMO and advanced profile for a handheld profile with MIMO. Moreover, the three profiles can be changed according to intention of the designer.

The following terms and definitions may apply to the present invention. The following terms and definitions can be changed according to design.

auxiliary stream: sequence of cells carrying data of as yet undefined modulation and coding, which may be used for future extensions or as required by broadcasters or network operators base data pipe: data pipe that carries service signaling data baseband frame (or BBFRAME): set of Kbch bits which form the input to one FEC encoding process (BCH and LDPC encoding)

cell: modulation value that is carried by one carrier of the OFDM transmission coded block: LDPC-encoded block of PLS1 data or one of the LDPC-encoded blocks of PLS2 data data pipe: logical channel in the physical layer that carries service data or related metadata, which may carry one or multiple service(s) or service component(s).

data pipe unit: a basic unit for allocating data cells to a DP in a frame.

data symbol: OFDM symbol in a frame which is not a preamble symbol (the frame signaling symbol and frame edge symbol is included in the data symbol)

DP_ID: this 8-bit field identifies uniquely a DP within the system identified by the SYSTEM_ID dummy cell: cell carrying a pseudo-random value used to fill the remaining capacity not used for PLS signaling, DPs or auxiliary streams emergency alert channel: part of a frame that carries EAS information data frame: physical layer time slot that starts with a preamble and ends with a frame edge symbol frame repetition unit: a set of frames belonging to same or different physical layer profile including a FEF, which is repeated eight times in a super-frame fast information channel: a logical channel in a frame that carries the mapping information between a service and the corresponding base DP FECBLOCK: set of LDPC-encoded bits of a DP data FFT size: nominal FFT size used for a particular mode, equal to the active symbol period Ts expressed in cycles of the elementary period T frame signaling symbol: OFDM symbol with higher pilot density used at the start of a frame in certain combinations of FFT size, guard interval and scattered pilot pattern, which carries a part of the PLS data frame edge symbol: OFDM symbol with higher pilot density used at the end of a frame in certain combinations of FFT size, guard interval and scattered pilot pattern frame-group: the set of all the frames having the same PHY profile type in a super-frame.

future extension frame: physical layer time slot within the super-frame that could be used for future extension, which starts with a preamble Futurecast UTB system: proposed physical layer broadcasting system, of which the input is one or more MPEG2-TS or IP or general stream(s) and of which the output is an RF signal input stream: A stream of data for an ensemble of services delivered to the end users by the system.

normal data symbol: data symbol excluding the frame signaling symbol and the frame edge symbol PHY profile: subset of all configurations that a corresponding receiver should implement PLS: physical layer signaling data consisting of PLS1 and PLS2

PLS1: a first set of PLS data carried in the FSS symbols having a fixed size, coding and modulation, which carries basic information about the system as well as the parameters needed to decode the PLS2

NOTE: PLS1 data remains constant for the duration of a frame-group.

PLS2: a second set of PLS data transmitted in the FSS symbol, which carries more detailed PLS data about the system and the DPs PLS2 dynamic data: PLS2 data that may dynamically change frame-by-frame PLS2 static data: PLS2 data that remains static for the duration of a frame-group preamble signaling data: signaling data carried by the preamble symbol and used to identify the basic mode of the system preamble symbol: fixed-length pilot symbol that carries basic PLS data and is located in the beginning of a frame NOTE: The preamble symbol is mainly used for fast initial band scan to detect the system signal, its timing, frequency offset, and FFT-size.

reserved for future use: not defined by the present document but may be defined in future super-frame: set of eight frame repetition units time interleaving block (TI block): set of cells within which time interleaving is carried out, corresponding to one use of the time interleaver memory TI group: unit over which dynamic capacity allocation for a particular DP is carried out, made up of an integer, dynamically varying number of XFECBLOCKs NOTE: The TI group may be mapped directly to one frame or may be mapped to multiple frames. It may contain one or more TI blocks.

Type 1 DP: DP of a frame where all DPs are mapped into the frame in TDM fashion

Type 2 DP: DP of a frame where all DPs are mapped into the frame in FDM fashion

XFECBLOCK: set of Ncells cells carrying all the bits of one LDPC FECBLOCK

FIG. 1 illustrates a structure of an apparatus for transmitting broadcast signals for future broadcast services according to an embodiment of the present invention.

The apparatus for transmitting broadcast signals for future broadcast services according to an embodiment of the present invention can include an input formatting block 1000, a BICM (Bit interleaved coding & modulation) block 1010, a frame structure block 1020, an OFDM (Orthogonal Frequency Division Multiplexing) generation block 1030 and a signaling generation block 1040. A description will be given of the operation of each module of the apparatus for transmitting broadcast signals.

IP stream/packets and MPEG2-TS are the main input formats, other stream types are handled as General Streams. In addition to these data inputs, Management Information is input to control the scheduling and allocation of the corresponding bandwidth for each input stream. One or multiple TS stream(s), IP stream(s) and/or General Stream(s) inputs are simultaneously allowed.

The input formatting block 1000 can demultiplex each input stream into one or multiple data pipe(s), to each of which an independent coding and modulation is applied. The data pipe (DP) is the basic unit for robustness control, thereby affecting quality-of-service (QoS). One or multiple service(s) or service component(s) can be carried by a single DP. Details of operations of the input formatting block 1000 will be described later.

The data pipe is a logical channel in the physical layer that carries service data or related metadata, which may carry one or multiple service(s) or service component(s).

Also, the data pipe unit: a basic unit for allocating data cells to a DP in a frame.

In the BICM block 1010, parity data is added for error correction and the encoded bit streams are mapped to complex-value constellation symbols. The symbols are interleaved across a specific interleaving depth that is used for the corresponding DP. For the advanced profile, MIMO encoding is performed in the BICM block 1010 and the additional data path is added at the output for MIMO transmission. Details of operations of the BICM block 1010 will be described later.

The Frame Building block 1020 can map the data cells of the input DPs into the OFDM symbols within a frame. After mapping, the frequency interleaving is used for frequency-domain diversity, especially to combat frequency-selective fading channels. Details of operations of the Frame Building block 1020 will be described later.

After inserting a preamble at the beginning of each frame, the OFDM Generation block 1030 can apply conventional OFDM modulation having a cyclic prefix as guard interval. For antenna space diversity, a distributed MISO scheme is applied across the transmitters. In addition, a Peak-to-Average Power Reduction (PAPR) scheme is performed in the time domain. For flexible network planning, this proposal provides a set of various FFT sizes, guard interval lengths and corresponding pilot patterns. Details of operations of the OFDM Generation block 1030 will be described later.

The Signaling Generation block 1040 can create physical layer signaling information used for the operation of each functional block. This signaling information is also transmitted so that the services of interest are properly recovered at the receiver side. Details of operations of the Signaling Generation block 1040 will be described later.

Figure 2A:
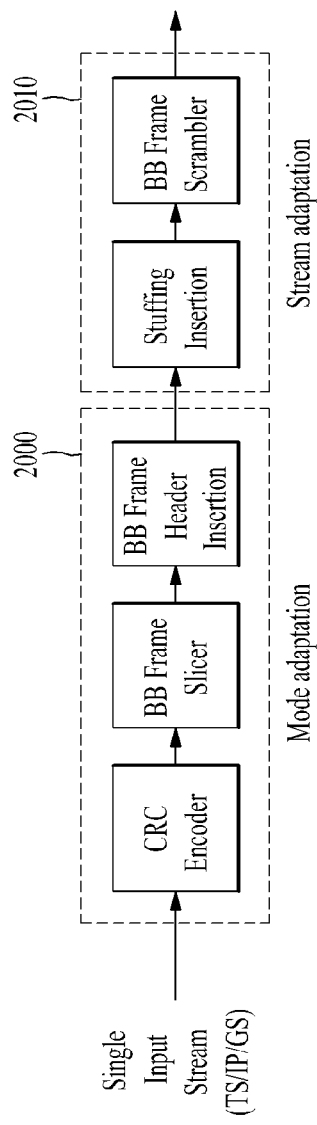
FIGS. 2(a) and 2(b) illustrate an input formatting block according to one embodiment of the present invention.
Figure 2B:
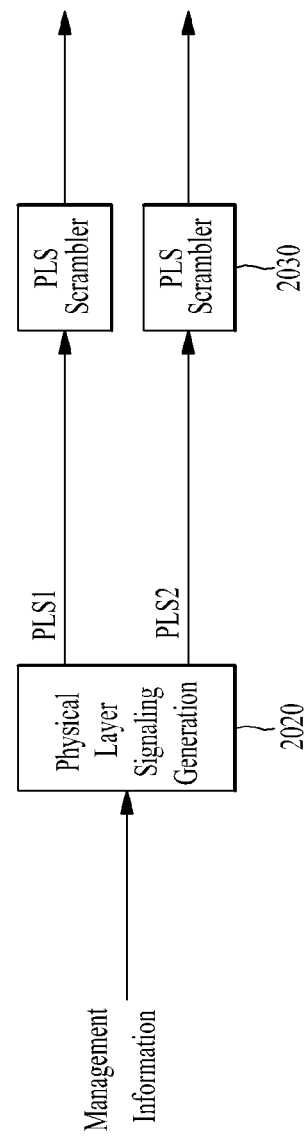
Figure 3:
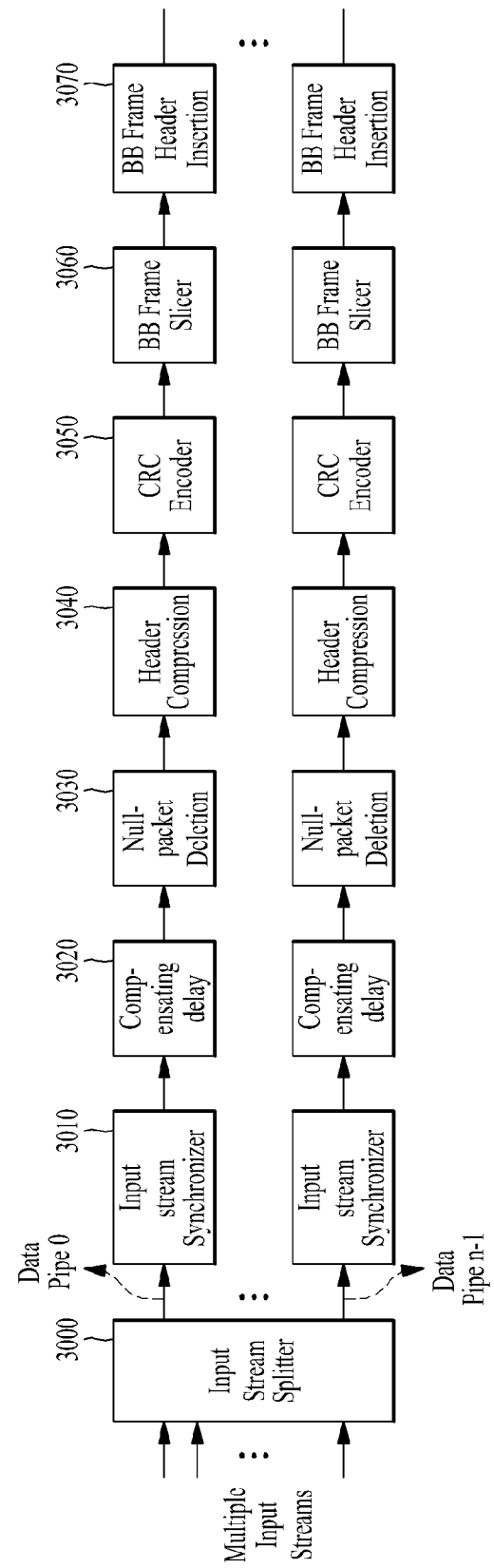
FIG. 3 illustrates an input formatting block according to another embodiment of the present invention.
Figure 4:
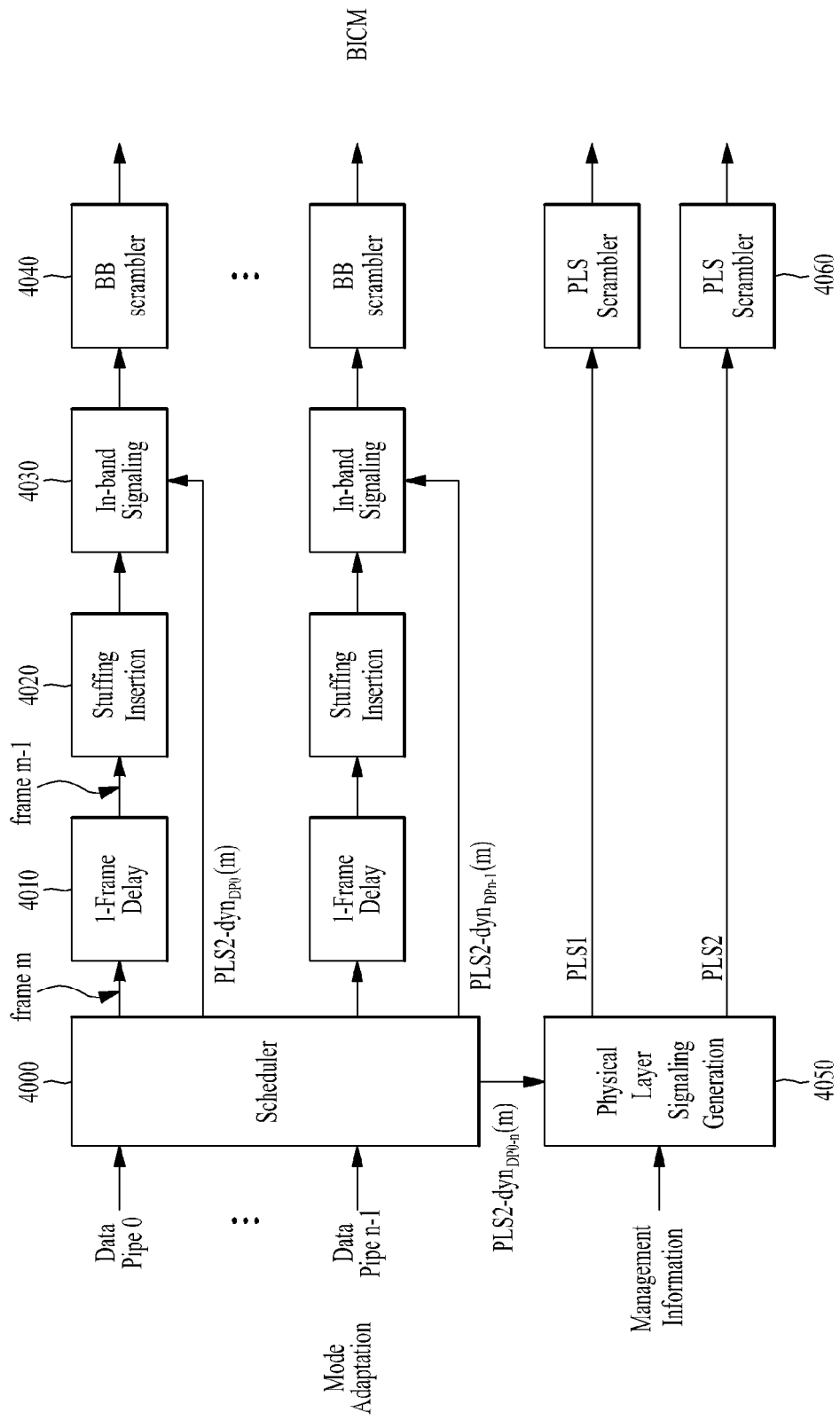
FIG. 4 illustrates an input formatting block according to another embodiment of the present invention.

FIGS. 2, 3 and 4 illustrate the input formatting block 1000 according to embodiments of the present invention. A description will be given of each figure.

FIG. 2 illustrates an input formatting block according to one embodiment of the present invention. FIG. 2 shows an input formatting module when the input signal is a single input stream.

The input formatting block illustrated in FIG. 2 corresponds to an embodiment of the input formatting block 1000 described with reference to FIG. 1.

The input to the physical layer may be composed of one or multiple data streams. Each data stream is carried by one DP. The mode adaptation modules slice the incoming data stream into data fields of the baseband frame (BBF). The system supports three types of input data streams: MPEG2-TS, Internet protocol (IP) and Generic stream (GS). MPEG2-TS is characterized by fixed length (188 byte) packets with the first byte being a sync-byte (0x47). An IP stream is composed of variable length IP datagram packets, as signaled within IP packet headers. The system supports both IPv4 and IPv6 for the IP stream. GS may be composed of variable length packets or constant length packets, signaled within encapsulation packet headers.

(a) shows a mode adaptation block 2000 and a stream adaptation 2010 for signal DP and (b) shows a PLS generation block 2020 and a PLS scrambler 2030 for generating and processing PLS data. A description will be given of the operation of each block.

The Input Stream Splitter splits the input TS, IP, GS streams into multiple service or service component (audio, video, etc.) streams. The mode adaptation module 2010 is comprised of a CRC Encoder, BB (baseband) Frame Slicer, and BB Frame Header Insertion block.

The CRC Encoder provides three kinds of CRC encoding for error detection at the user packet (UP) level, i.e., CRC-8, CRC-16, and CRC-32. The computed CRC bytes are appended after the UP. CRC-8 is used for TS stream and CRC-32 for IP stream. If the GS stream doesn't provide the CRC encoding, the proposed CRC encoding should be applied.

BB Frame Slicer maps the input into an internal logical-bit format. The first received bit is defined to be the MSB. The BB Frame Slicer allocates a number of input bits equal to the available data field capacity. To allocate a number of input bits equal to the BBF payload, the UP packet stream is sliced to fit the data field of BBF.

BB Frame Header Insertion block can insert fixed length BBF header of 2 bytes is inserted in front of the BB Frame. The BBF header is composed of STUFFI (1 bit), SYNCD (13 bits), and RFU (2 bits). In addition to the fixed 2-Byte BBF header, BBF can have an extension field (1 or 3 bytes) at the end of the 2-byte BBF header.

The stream adaptation 2010 is comprised of stuffing insertion block and BB scrambler.

The stuffing insertion block can insert stuffing field into a payload of a BB frame. If the input data to the stream adaptation is sufficient to fill a BB-Frame, STUFFI is set to '0' and the BBF has no stuffing field. Otherwise STUFFI is set to '1' and the stuffing field is inserted immediately after the BBF header. The stuffing field comprises two bytes of the stuffing field header and a variable size of stuffing data.

The BB scrambler scrambles complete BBF for energy dispersal. The scrambling sequence is synchronous with the BBF. The scrambling sequence is generated by the feed-back shift register.

The PLS generation block 2020 can generate physical layer signaling (PLS) data. The PLS provides the receiver with a means to access physical layer DPs. The PLS data consists of PLS1 data and PLS2 data.

The PLS1 data is a first set of PLS data carried in the FSS symbols in the frame having a fixed size, coding and modulation, which carries basic information about the system as well as the parameters needed to decode the PLS2 data. The PLS1 data provides basic transmission parameters including parameters required to enable the reception and decoding of the PLS2 data. Also, the PLS1 data remains constant for the duration of a frame-group.

The PLS2 data is a second set of PLS data transmitted in the FSS symbol, which carries more detailed PLS data about the system and the DPs. The PLS2 contains parameters that provide sufficient information for the receiver to decode the desired DP. The PLS2 signaling further consists of two types of parameters, PLS2 Static data (PLS2-STAT data) and PLS2 dynamic data (PLS2-DYN data). The PLS2 Static data is PLS2 data that remains static for the duration of a frame-group and the PLS2 dynamic data is PLS2 data that may dynamically change frame-by-frame.

Details of the PLS data will be described later.

The PLS scrambler 2030 can scramble the generated PLS data for energy dispersal.

The above-described blocks may be omitted or replaced by blocks having similar or identical functions.

FIG. 3 illustrates an input formatting block according to another embodiment of the present invention.

The input formatting block illustrated in FIG. 3 corresponds to an embodiment of the input formatting block 1000 described with reference to FIG. 1.

FIG. 3 shows a mode adaptation block of the input formatting block when the input signal corresponds to multiple input streams.

The mode adaptation block of the input formatting block for processing the multiple input streams can independently process the multiple input streams.

Referring to FIG. 3, the mode adaptation block for respectively processing the multiple input streams can include an input stream splitter 3000, an input stream synchronizer 3010, a compensating delay block 3020, a null packet deletion block 3030, a head compression block 3040, a CRC encoder 3050, a BB frame slicer 3060 and a BB header insertion block 3070. Description will be given of each block of the mode adaptation block.

Operations of the CRC encoder 3050, BB frame slicer 3060 and BB header insertion block 3070 correspond to those of the CRC encoder, BB frame slicer and BB header insertion block described with reference to FIG. 2 and thus description thereof is omitted.

The input stream splitter 3000 can split the input TS, IP, GS streams into multiple service or service component (audio, video, etc.) streams.

The input stream synchronizer 3010 may be referred as ISSY. The ISSY can provide suitable means to guarantee Constant Bit Rate (CBR) and constant end-to-end transmission delay for any input data format. The ISSY is always used for the case of multiple DPs carrying TS, and optionally used for multiple DPs carrying GS streams.

The compensating delay block 3020 can delay the split TS packet stream following the insertion of ISSY information to allow a TS packet recombining mechanism without requiring additional memory in the receiver.

The null packet deletion block 3030, is used only for the TS input stream case. Some TS input streams or split TS streams may have a large number of null-packets present in order to accommodate VBR (variable bit-rate) services in a CBR TS stream. In this case, in order to avoid unnecessary transmission overhead, null-packets can be identified and not transmitted. In the receiver, removed null-packets can be re-inserted in the exact place where they were originally by reference to a deleted null-packet (DNP) counter that is inserted in the transmission, thus guaranteeing constant bit-rate and avoiding the need for time-stamp (PCR) updating.

The head compression block 3040 can provide packet header compression to increase transmission efficiency for TS or IP input streams. Because the receiver can have a priori information on certain parts of the header, this known information can be deleted in the transmitter.

For Transport Stream, the receiver has a-priori information about the sync-byte configuration (0x47) and the packet length (188 Byte). If the input TS stream carries content that has only one PID, i.e., for only one service component (video, audio, etc.) or service sub-component (SVC base layer, SVC enhancement layer, MVC base view or MVC dependent views), TS packet header compression can be applied (optionally) to the Transport Stream. IP packet header compression is used optionally if the input steam is an IP stream.

The above-described blocks may be omitted or replaced by blocks having similar or identical functions.

FIG. 4 illustrates an input formatting block according to another embodiment of the present invention.

The input formatting block illustrated in FIG. 4 corresponds to an embodiment of the input formatting block 1000 described with reference to FIG. 1.

FIG. 4 illustrates a stream adaptation block of the input formatting module when the input signal corresponds to multiple input streams.

Referring to FIG. 4, the mode adaptation block for respectively processing the multiple input streams can include a scheduler 4000, an 1-Frame delay block 4010, a stuffing insertion block 4020, an in-band signaling 4030, a BB Frame scrambler 4040, a PLS generation block 4050 and a PLS scrambler 4060. Description will be given of each block of the stream adaptation block.

Operations of the stuffing insertion block 4020, the BB Frame scrambler 4040, the PLS generation block 4050 and the PLS scrambler 4060 correspond to those of the stuffing insertion block, BB scrambler, PLS generation block and the PLS scrambler described with reference to FIG. 2 and thus description thereof is omitted.

The scheduler 4000 can determine the overall cell allocation across the entire frame from the amount of FECBLOCKs of each DP. Including the allocation for PLS, EAC and FIC, the scheduler generate the values of PLS2-DYN data, which is transmitted as in-band signaling or PLS cell in FSS of the frame. Details of FECBLOCK, EAC and FIC will be described later.

The 1-Frame delay block 4010 can delay the input data by one transmission frame such that scheduling information about the next frame can be transmitted through the current frame for in-band signaling information to be inserted into the DPs.

The in-band signaling 4030 can insert un-delayed part of the PLS2 data into a DP of a frame.

The above-described blocks may be omitted or replaced by blocks having similar or identical functions.

Figure 5A:
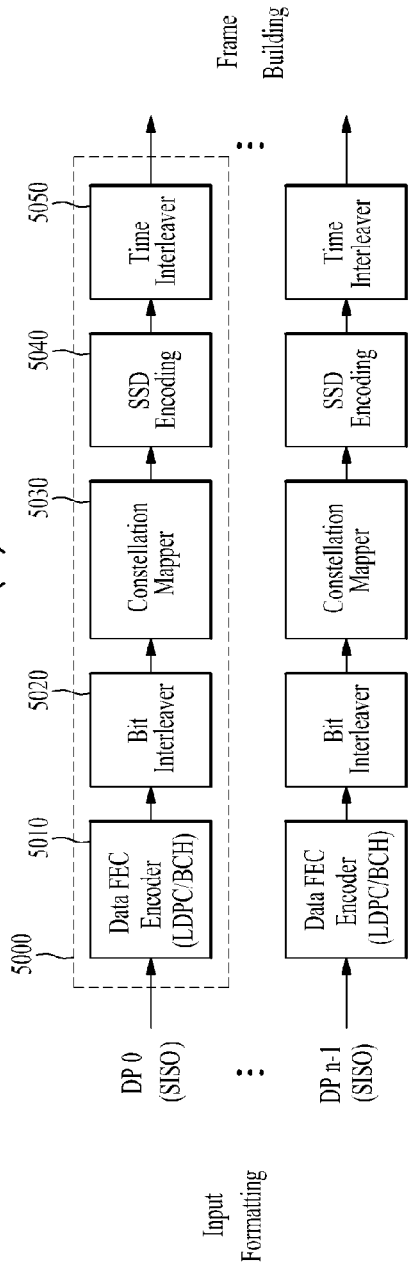
FIGS. 5(a) and 5(b) illustrate a BICM block according to an embodiment of the present invention.
Figure 5B:
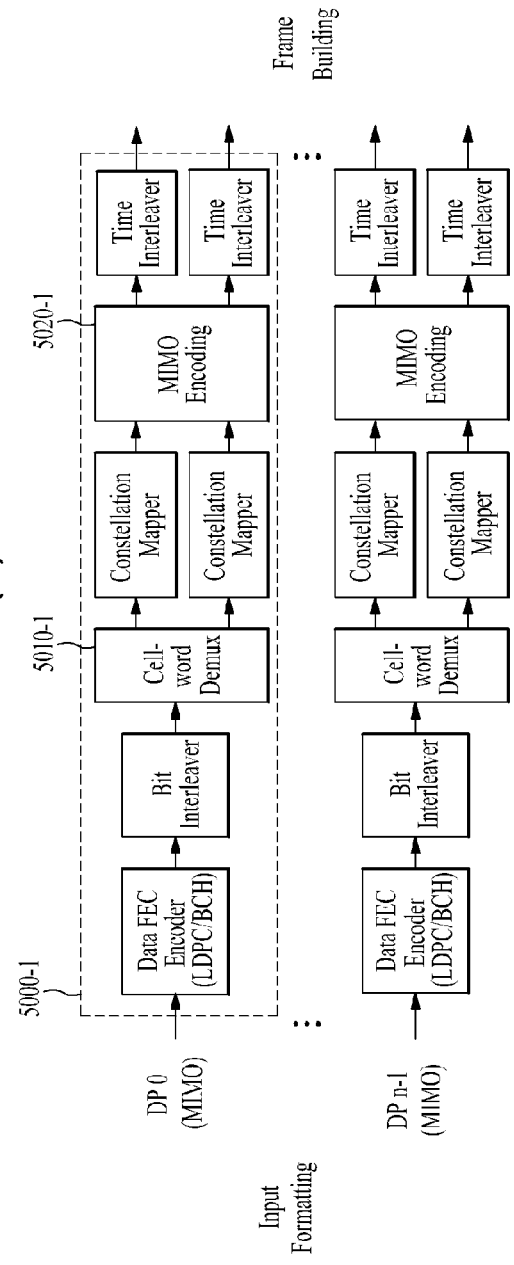

FIG. 5 illustrates a BICM block according to an embodiment of the present invention.

The BICM block illustrated in FIG. 5 corresponds to an embodiment of the BICM block 1010 described with reference to FIG. 1.

As described above, the apparatus for transmitting broadcast signals for future broadcast services according to an embodiment of the present invention can provide a terrestrial broadcast service, mobile broadcast service, UHDTV service, etc.

Since QoS (quality of service) depends on characteristics of a service provided by the apparatus for transmitting broadcast signals for future broadcast services according to an embodiment of the present invention, data corresponding to respective services needs to be processed through different schemes. Accordingly, the a BICM block according to an embodiment of the present invention can independently process DPs input thereto by independently applying SISO, MISO and MIMO schemes to the data pipes respectively corresponding to data paths. Consequently, the apparatus for transmitting broadcast signals for future broadcast services according to an embodiment of the present invention can control QoS for each service or service component transmitted through each DP.

(a) shows the BICM block shared by the base profile and the handheld profile and (b) shows the BICM block of the advanced profile.

The BICM block shared by the base profile and the handheld profile and the BICM block of the advanced profile can include plural processing blocks for processing each DP.

A description will be given of each processing block of the BICM block for the base profile and the handheld profile and the BICM block for the advanced profile.

A processing block 5000 of the BICM block for the base profile and the handheld profile can include a Data FEC encoder 5010, a bit interleaver 5020, a constellation mapper 5030, an SSD (Signal Space Diversity) encoding block 5040 and a time interleaver 5050.

The Data FEC encoder 5010 can perform the FEC encoding on the input BBF to generate FECBLOCK procedure using outer coding (BCH), and inner coding (LDPC). The outer coding (BCH) is optional coding method. Details of operations of the Data FEC encoder 5010 will be described later.

The bit interleaver 5020 can interleave outputs of the Data FEC encoder 5010 to achieve optimized performance with combination of the LDPC codes and modulation scheme while providing an efficiently implementable structure. Details of operations of the bit interleaver 5020 will be described later.

The constellation mapper 5030 can modulate each cell word from the bit interleaver 5020 in the base and the handheld profiles, or cell word from the Cell-word demultiplexer 5010-1 in the advanced profile using either QPSK, QAM-16, non-uniform QAM (NUQ-64, NUQ-256, NUQ-1024) or non-uniform constellation (NUC-16, NUC-64, NUC-256, NUC-1024) to give a power-normalized constellation point, el. This constellation mapping is applied only for DPs. Observe that QAM-16 and NUQs are square shaped, while NUCs have arbitrary shape. When each constellation is rotated by any multiple of 90 degrees, the rotated constellation exactly overlaps with its original one. This "rotation-sense" symmetric property makes the capacities and the average powers of the real and imaginary components equal to each other. Both NUQs and NUCs are defined specifically for each code rate and the particular one used is signaled by the parameter DP_MOD filed in PLS2 data.

The SSD encoding block 5040 can precode cells in two (2D), three (3D), and four (4D) dimensions to increase the reception robustness under difficult fading conditions.

The time interleaver 5050 can operates at the DP level. The parameters of time interleaving (TI) may be set differently for each DP. Details of operations of the time interleaver 5050 will be described later.

A processing block 5000-1 of the BICM block for the advanced profile can include the Data FEC encoder, bit interleaver, constellation mapper, and time interleaver. However, the processing block 5000-1 is distinguished from the processing block 5000 further includes a cell-word demultiplexer 5010-1 and a MIMO encoding block 5020-1.

Also, the operations of the Data FEC encoder, bit interleaver, constellation mapper, and time interleaver in the processing block 5000-1 correspond to those of the Data FEC encoder 5010, bit interleaver 5020, constellation mapper 5030, and time interleaver 5050 described and thus description thereof is omitted.

The cell-word demultiplexer 5010-1 is used for the DP of the advanced profile to divide the single cell-word stream into dual cell-word streams for MIMO processing. Details of operations of the cell-word demultiplexer 5010-1 will be described later.

The MIMO encoding block 5020-1 can processing the output of the cell-word demultiplexer 5010-1 using MIMO encoding scheme. The MIMO encoding scheme was optimized for broadcasting signal transmission. The MIMO technology is a promising way to get a capacity increase but it depends on channel characteristics. Especially for broadcasting, the strong LOS component of the channel or a difference in the received signal power between two antennas caused by different signal propagation characteristics makes it difficult to get capacity gain from MIMO. The proposed MIMO encoding scheme overcomes this problem using a rotation-based pre-coding and phase randomization of one of the MIMO output signals.

MIMO encoding is intended for a 2×2 MIMO system requiring at least two antennas at both the transmitter and the receiver. Two MIMO encoding modes are defined in this proposal; full-rate spatial multiplexing (FR-SM) and full-rate full-diversity spatial multiplexing (FRFD-SM). The FR-SM encoding provides capacity increase with relatively small complexity increase at the receiver side while the FRFD-SM encoding provides capacity increase and additional diversity gain with a great complexity increase at the receiver side. The proposed MIMO encoding scheme has no restriction on the antenna polarity configuration.

MIMO processing is required for the advanced profile frame, which means all DPs in the advanced profile frame are processed by the MIMO encoder. MIMO processing is applied at DP level. Pairs of the Constellation Mapper outputs NUQ (e1,i and e2,i) are fed to the input of the MIMO Encoder. Paired MIMO Encoder output (g1,i and g2,i) is transmitted by the same carrier k and OFDM symbol l of their respective TX antennas.

The above-described blocks may be omitted or replaced by blocks having similar or identical functions.

Figure 6:
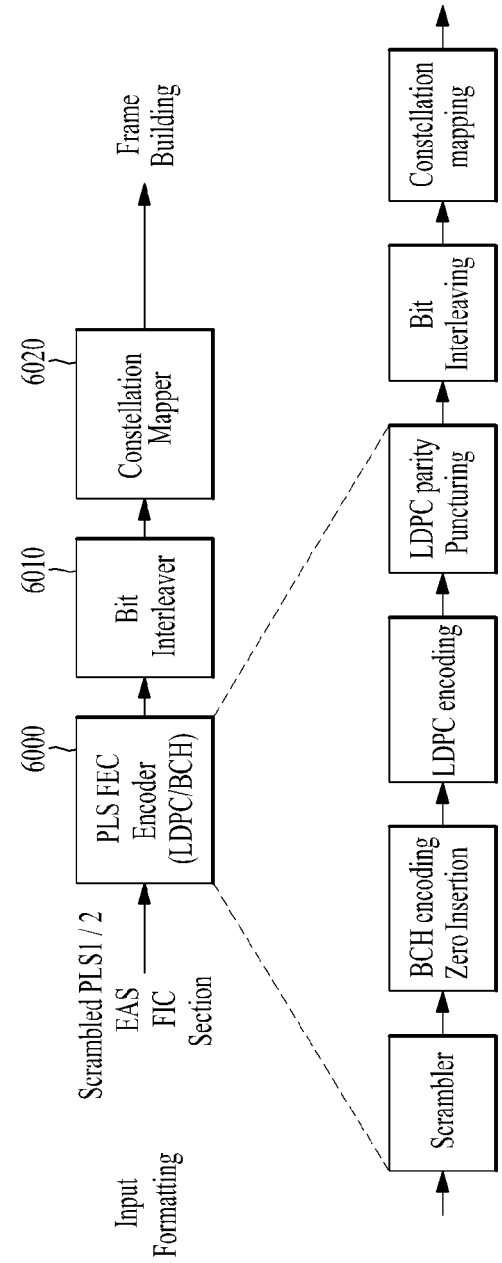
FIG. 6 illustrates a BICM block according to another embodiment of the present invention.

FIG. 6 illustrates a BICM block according to another embodiment of the present invention.

The BICM block illustrated in FIG. 6 corresponds to an embodiment of the BICM block 1010 described with reference to FIG. 1.

FIG. 6 illustrates a BICM block for protection of physical layer signaling (PLS), emergency alert channel (EAC) and fast information channel (FIC). EAC is a part of a frame that carries EAS information data and FIC is a logical channel in a frame that carries the mapping information between a service and the corresponding base DP. Details of the EAC and FIC will be described later.

Referring to FIG. 6, the BICM block for protection of PLS, EAC and FIC can include a PLS FEC encoder 6000, a bit interleaver 6010 and a constellation mapper 6020.

Also, the PLS FEC encoder 6000 can include a scrambler, BCH encoding/zero insertion block, LDPC encoding block and LDPC parity puncturing block. Description will be given of each block of the BICM block.

The PLS FEC encoder 6000 can encode the scrambled PLS 1/2 data, EAC and FIC section.

The scrambler can scramble PLS1 data and PLS2 data before BCH encoding and shortened and punctured LDPC encoding.

The BCH encoding/zero insertion block can perform outer encoding on the scrambled PLS 1/2 data using the shortened BCH code for PLS protection and insert zero bits after the BCH encoding. For PLS1 data only, the output bits of the zero insertion may be permitted before LDPC encoding.

The LDPC encoding block can encode the output of the BCH encoding/zero insertion block using LDPC code. To generate a complete coded block, Cldpc, parity bits, Pldpc are encoded systematically from each zero-inserted PLS information block, Ildpc and appended after it.

$$C_{ldpc} = [I_{ldpc} P_{ldpc}] = [i_0, i_1, \ldots, i_{K_{ldpc}-1}, p_0, p_1, \ldots, p_{N_{ldpc}-K_{ldpc}-1}]$$ [Math figure 1]

The LDPC code parameters for PLS1 and PLS2 are as following table 4.

TABLE 4

| Signaling Type | $K_{sig}$ | $K_{bch}$ | $N_{bch\_parity}$ | $K_{ldpc}$ (=$N_{bch}$) | $N_{ldpc}$ | $N_{ldpc\_parity}$ | code rate | $Q_{ldpc}$ |
|---|---|---|---|---|---|---|---|---|
| PLS1 | 342 | 1020 | 60 | 1080 | 4320 | 3240 | 1/4 | 36 |
| PLS2 | <1021 | | | | | | | |
| | >1020 | 2100 | | 2160 | 7200 | 5040 | 3/10 | 56 |

The LDPC parity puncturing block can perform puncturing on the PLS1 data and PLS 2 data.

When shortening is applied to the PLS1 data protection, some LDPC parity bits are punctured after LDPC encoding. Also, for the PLS2 data protection, the LDPC parity bits of PLS2 are punctured after LDPC encoding. These punctured bits are not transmitted.

The bit interleaver 6010 can interleave the each shortened and punctured PLS1 data and PLS2 data.

The constellation mapper 6020 can map the bit interleaved PLS1 data and PLS2 data onto constellations.

The above-described blocks may be omitted or replaced by blocks having similar or identical functions.

Figure 7:
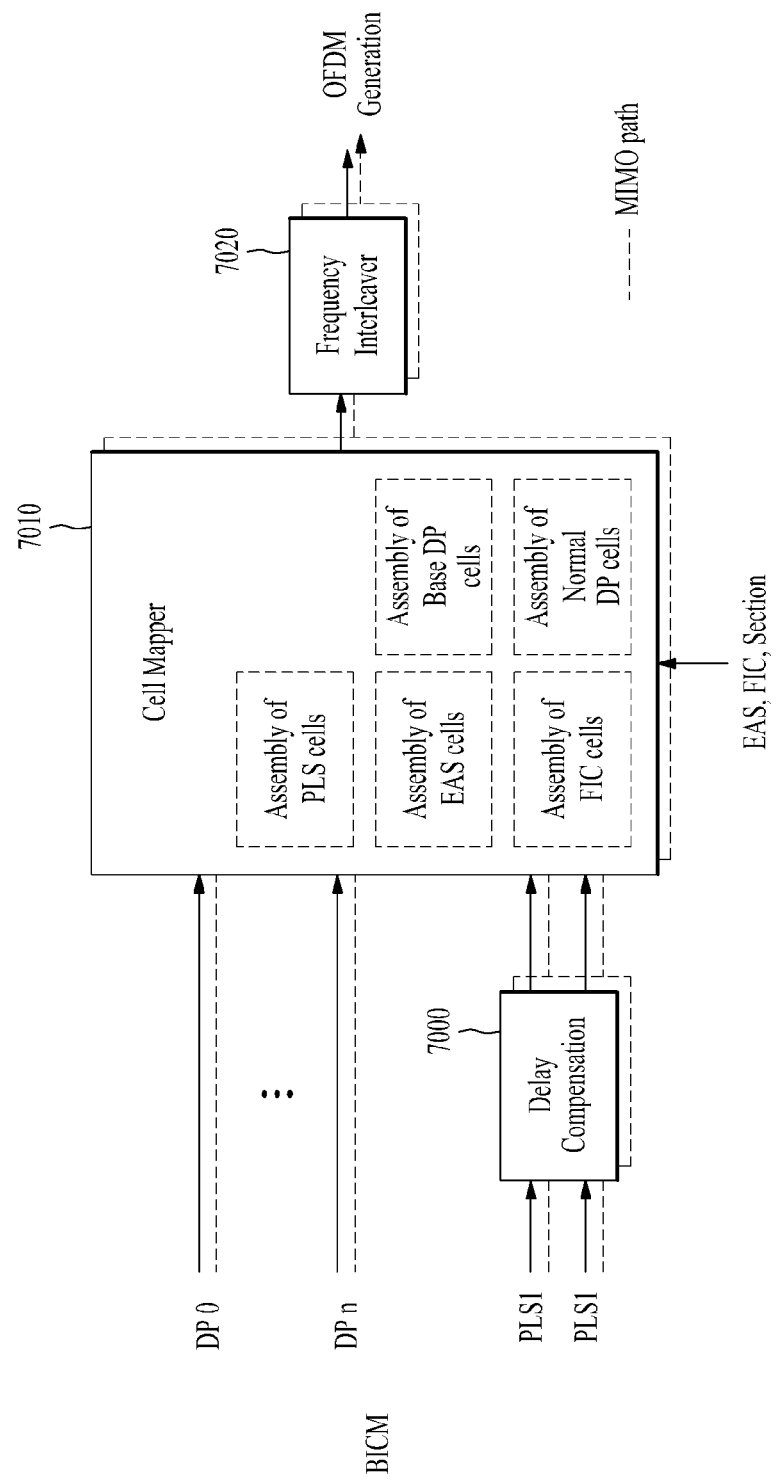
FIG. 7 illustrates a frame building block according to one embodiment of the present invention.

FIG. 7 illustrates a frame building block according to one embodiment of the present invention.

The frame building block illustrated in FIG. 7 corresponds to an embodiment of the frame building block 1020 described with reference to FIG. 1.

Referring to FIG. 7, the frame building block can include a delay compensation block 7000, a cell mapper 7010 and a frequency interleaver 7020. Description will be given of each block of the frame building block.

The delay compensation block 7000 can adjust the timing between the data pipes and the corresponding PLS data to ensure that they are co-timed at the transmitter end. The PLS data is delayed by the same amount as data pipes are by addressing the delays of data pipes caused by the Input Formatting block and BICM block. The delay of the BICM block is mainly due to the time interleaver 5050. In-band signaling data carries information of the next TI group so that they are carried one frame ahead of the DPs to be signaled. The Delay Compensating block delays in-band signaling data accordingly.

The cell mapper 7010 can map PLS, EAC, FIC, DPs, auxiliary streams and dummy cells into the active carriers of the OFDM symbols in the frame. The basic function of the cell mapper 7010 is to map data cells produced by the TIs for each of the DPs, PLS cells, and EAC/FIC cells, if any, into arrays of active OFDM cells corresponding to each of the OFDM symbols within a frame. Service signaling data (such as PSI (program specific information)/SI) can be separately gathered and sent by a data pipe. The Cell Mapper operates according to the dynamic information produced by the scheduler and the configuration of the frame structure. Details of the frame will be described later.

The frequency interleaver 7020 can randomly interleave data cells received from the cell mapper 7010 to provide frequency diversity. Also, the frequency interleaver 7020 can operate on very OFDM symbol pair comprised of two sequential OFDM symbols using a different interleaving-seed order to get maximum interleaving gain in a single frame.

The above-described blocks may be omitted or replaced by blocks having similar or identical functions.

Figure 8:
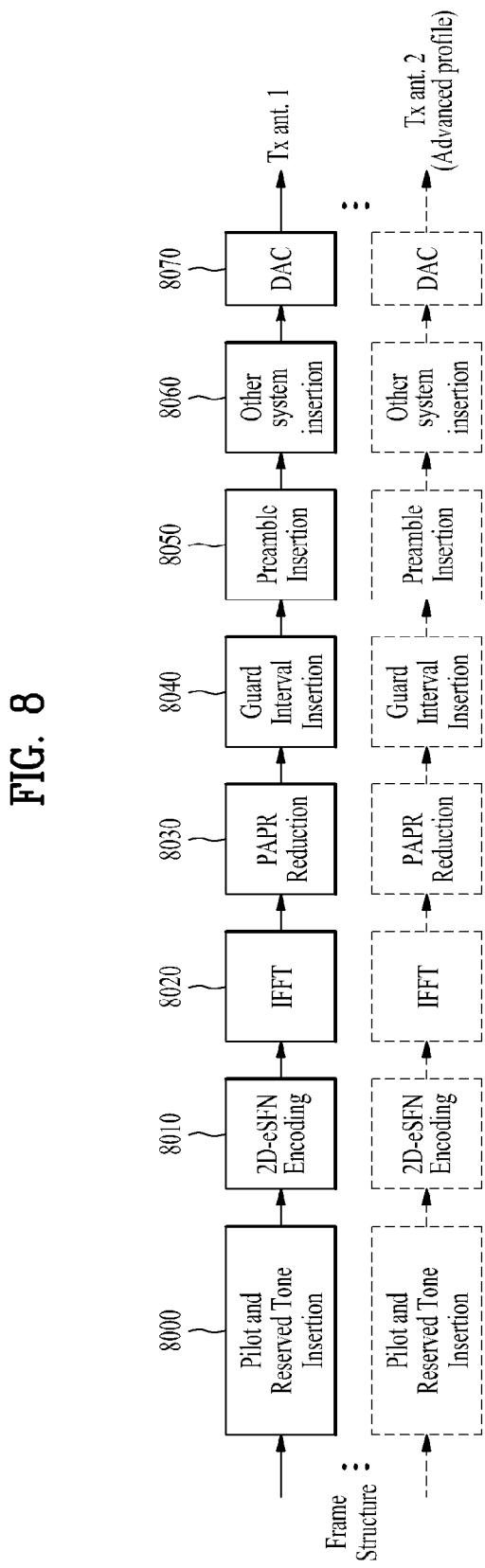
FIG. 8 illustrates an OFMD generation block according to an embodiment of the present invention.

FIG. 8 illustrates an OFMD generation block according to an embodiment of the present invention.

The OFMD generation block illustrated in FIG. 8 corresponds to an embodiment of the OFMD generation block 1030 described with reference to FIG. 1.

The OFDM generation block modulates the OFDM carriers by the cells produced by the Frame Building block, inserts the pilots, and produces the time domain signal for transmission. Also, this block subsequently inserts guard intervals, and applies PAPR (Peak-to-Average Power Radio) reduction processing to produce the final RF signal.

Referring to FIG. 8, the frame building block can include a pilot and reserved tone insertion block 8000, a 2D-eSFN encoding block 8010, an IFFT (Inverse Fast Fourier Transform) block 8020, a PAPR reduction block 8030, a guard interval insertion block 8040, a preamble insertion block 8050, other system insertion block 8060 and a DAC block 8070. Description will be given of each block of the frame building block.

The pilot and reserved tone insertion block 8000 can insert pilots and the reserved tone.

Various cells within the OFDM symbol are modulated with reference information, known as pilots, which have transmitted values known a priori in the receiver. The information of pilot cells is made up of scattered pilots, continual pilots, edge pilots, FSS (frame signaling symbol) pilots and FES (frame edge symbol) pilots. Each pilot is transmitted at a particular boosted power level according to pilot type and pilot pattern. The value of the pilot information is derived from a reference sequence, which is a series of values, one for each transmitted carrier on any given symbol. The pilots can be used for frame synchronization, frequency synchronization, time synchronization, channel estimation, and transmission mode identification, and also can be used to follow the phase noise.

Reference information, taken from the reference sequence, is transmitted in scattered pilot cells in every symbol except the preamble, FSS and FES of the frame. Continual pilots are inserted in every symbol of the frame. The number and location of continual pilots depends on both the FFT size and the scattered pilot pattern. The edge carriers are edge pilots in every symbol except for the preamble symbol. They are inserted in order to allow frequency interpolation up to the edge of the spectrum. FSS pilots are inserted in FSS(s) and FES pilots are inserted in FES. They are inserted in order to allow time interpolation up to the edge of the frame.

The system according to an embodiment of the present invention supports the SFN network, where distributed MISO scheme is optionally used to support very robust transmission mode. The 2D-eSFN is a distributed MISO scheme that uses multiple TX antennas, each of which is located in the different transmitter site in the SFN network.

The 2D-eSFN encoding block 8010 can process a 2D-eSFN processing to distorts the phase of the signals transmitted from multiple transmitters, in order to create both time and frequency diversity in the SFN configuration. Hence, burst errors due to low flat fading or deep-fading for a long time can be mitigated.

The IFFT block 8020 can modulate the output from the 2D-eSFN encoding block 8010 using OFDM modulation scheme. Any cell in the data symbols which has not been designated as a pilot (or as a reserved tone) carries one of the data cells from the frequency interleaver. The cells are mapped to OFDM carriers.

The PAPR reduction block 8030 can perform a PAPR reduction on input signal using various PAPR reduction algorithm in the time domain.

The guard interval insertion block 8040 can insert guard intervals and the preamble insertion block 8050 can insert preamble in front of the signal. Details of a structure of the preamble will be described later. The other system insertion block 8060 can multiplex signals of a plurality of broadcast transmission/reception systems in the time domain such that data of two or more different broadcast transmission/reception systems providing broadcast services can be simultaneously transmitted in the same RF signal bandwidth. In this case, the two or more different broadcast transmission/reception systems refer to systems providing different broadcast services. The different broadcast services may refer to a terrestrial broadcast service, mobile broadcast service, etc. Data related to respective broadcast services can be transmitted through different frames.

The DAC block 8070 can convert an input digital signal into an analog signal and output the analog signal. The signal output from the DAC block 8070 can be transmitted through multiple output antennas according to the physical layer profiles. A Tx antenna according to an embodiment of the present invention can have vertical or horizontal polarity.

The above-described blocks may be omitted or replaced by blocks having similar or identical functions according to design.

Figure 9:
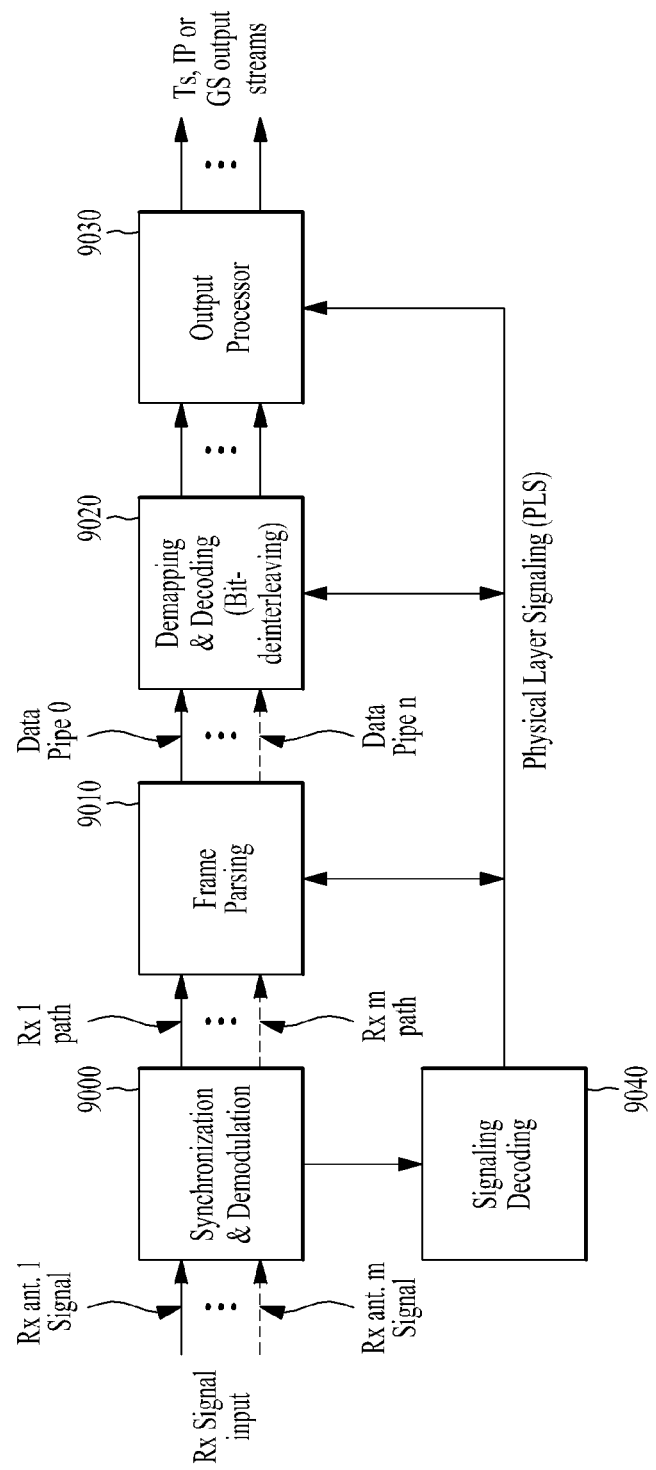
FIG. 9 illustrates a structure of an apparatus for receiving broadcast signals for future broadcast services according to an embodiment of the present invention.

FIG. 9 illustrates a structure of an apparatus for receiving broadcast signals for future broadcast services according to an embodiment of the present invention.

The apparatus for receiving broadcast signals for future broadcast services according to an embodiment of the present invention can correspond to the apparatus for transmitting broadcast signals for future broadcast services, described with reference to FIG. 1.

The apparatus for receiving broadcast signals for future broadcast services according to an embodiment of the present invention can include a synchronization & demodulation module 9000, a frame parsing module 9010, a demapping & decoding module 9020, an output processor 9030 and a signaling decoding module 9040. A description will be given of operation of each module of the apparatus for receiving broadcast signals.

The synchronization & demodulation module 9000 can receive input signals through m Rx antennas, perform signal detection and synchronization with respect to a system corresponding to the apparatus for receiving broadcast signals and carry out demodulation corresponding to a reverse procedure of the procedure performed by the apparatus for transmitting broadcast signals.

The frame parsing module can parse input signal frames and extract data through which a service selected by a user is transmitted. If the apparatus for transmitting broadcast signals performs interleaving, the frame parsing module can carry out deinterleaving corresponding to a reverse procedure of interleaving. In this case, the positions of a signal and data that need to be extracted can be obtained by decoding data output from the signaling decoding module to restore scheduling information generated by the apparatus for transmitting broadcast signals.

The demapping & decoding module can convert the input signals into bit domain data and then deinterleave the same as necessary. The demapping & decoding module can perform demapping for mapping applied for transmission efficiency and correct an error generated on a transmission channel through decoding. In this case, the demapping & decoding module can obtain transmission parameters necessary for demapping and decoding by decoding the data output from the signaling decoding module.

The output processor can perform reverse procedures of various compression/signal processing procedures which are applied by the apparatus for transmitting broadcast signals to improve transmission efficiency. In this case, the output processor can acquire necessary control information from data output from the signaling decoding module. The output of the output processor corresponds to a signal input to the apparatus for transmitting broadcast signals and may be MPEG-TSs, IP streams (v4 or v6) and generic streams.

The signaling decoding module can obtain PLS information from the signal demodulated by the synchronization & demodulation module 9000. As described above, the frame parsing module, demapping & decoding module and output processor can execute functions thereof using the data output from the signaling decoding module.

FIG. 10 illustrates a frame structure according to an embodiment of the present invention.

FIG. 10 shows an example configuration of the frame types and FRUs in a super-frame. (a) shows a super frame according to an embodiment of the present invention, (b) shows FRU (Frame Repetition Unit) according to an embodiment of the present invention, (c) shows frames of variable PHY profiles in the FRU and (d) shows a structure of a frame.

A super-frame may be composed of eight FRUs. The FRU is a basic multiplexing unit for TDM of the frames, and is repeated eight times in a super-frame.

Each frame in the FRU belongs to one of the PHY profiles, (base, handheld, advanced) or FEF. The maximum allowed number of the frames in the FRU is four and a given PHY profile can appear any number of times from zero times to four times in the FRU (e.g., base, base, handheld, advanced). PHY profile definitions can be extended using reserved values of the PHY_PROFILE in the preamble, if required.

The FEF part is inserted at the end of the FRU, if included. When the FEF is included in the FRU, the minimum number of FEFs is 8 in a super-frame. It is not recommended that FEF parts be adjacent to each other.

One frame is further divided into a number of OFDM symbols and a preamble. As shown in (d), the frame comprises a preamble, one or more frame signaling symbols (FSS), normal data symbols and a frame edge symbol (FES).

The preamble is a special symbol that enables fast Futurecast UTB system signal detection and provides a set of basic transmission parameters for efficient transmission and reception of the signal. The detailed description of the preamble will be will be described later.

The main purpose of the FSS(s) is to carry the PLS data. For fast synchronization and channel estimation, and hence fast decoding of PLS data, the FSS has more dense pilot pattern than the normal data symbol. The FES has exactly the same pilots as the FSS, which enables frequency-only interpolation within the FES and temporal interpolation, without extrapolation, for symbols immediately preceding the FES.

Figures 11, 12:
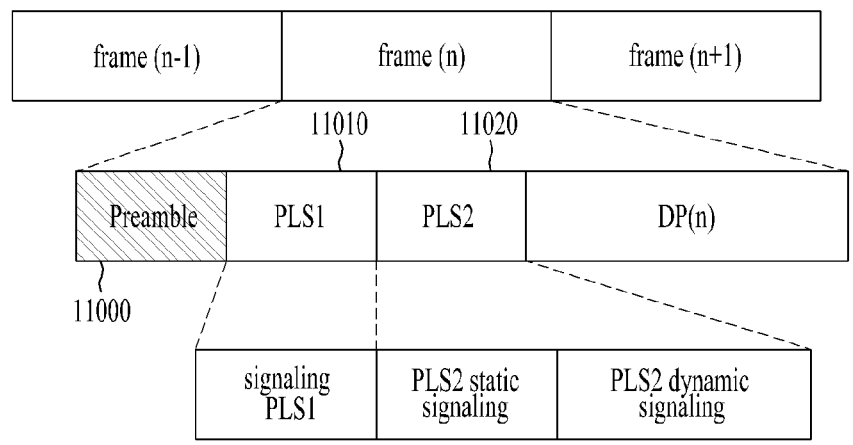
FIG. 11 illustrates a signaling hierarchy structure of the frame according to an embodiment of the present invention.
FIG. 12 illustrates preamble signaling data according to an embodiment of the present invention.

FIG. 11 illustrates a signaling hierarchy structure of the frame according to an embodiment of the present invention.

FIG. 11 illustrates the signaling hierarchy structure, which is split into three main parts: the preamble signaling data 11000, the PLS1 data 11010 and the PLS2 data 11020. The purpose of the preamble, which is carried by the preamble symbol in every frame, is to indicate the transmission type and basic transmission parameters of that frame. The PLS1 enables the receiver to access and decode the PLS2 data, which contains the parameters to access the DP of interest. The PLS2 is carried in every frame and split into two main parts: PLS2-STAT data and PLS2-DYN data. The static and dynamic portion of PLS2 data is followed by padding, if necessary.

FIG. 12 illustrates preamble signaling data according to an embodiment of the present invention.

Preamble signaling data carries 21 bits of information that are needed to enable the receiver to access PLS data and trace DPs within the frame structure. Details of the preamble signaling data are as follows:

PHY_PROFILE: This 3-bit field indicates the PHY profile type of the current frame. The mapping of different PHY profile types is given in below table 5.

TABLE 5

| Value | PHY profile |
|---|---|
| 000 | Base profile |
| 001 | Handheld profile |
| 010 | Advanced profiled |
| 011~110 | Reserved |
| 111 | FEF |

FFT_SIZE: This 2 bit field indicates the FFT size of the current frame within a frame-group, as described in below table 6.

TABLE 6

| Value | FFT size |
|---|---|
| 00 | 8 k FFT |
| 01 | 16 k FFT |
| 10 | 32 k FFT |
| 11 | Reserved |

GI_FRACTION: This 3 bit field indicates the guard interval fraction value in the current super-frame, as described in below table 7.

TABLE 7

| Value | GI_FRACTION |
| --- | --- |
| 000 | 1/5 |
| 001 | 1/10 |
| 010 | 1/20 |
| 011 | 1/40 |
| 100 | 1/80 |
| 101 | 1/160 |
| 110~111 | Reserved |

EAC_FLAG: This 1 bit field indicates whether the EAC is provided in the current frame. If this field is set to '1', emergency alert service (EAS) is provided in the current frame. If this field set to '0', EAS is not carried in the current frame. This field can be switched dynamically within a super-frame.

PILOT_MODE: This 1-bit field indicates whether the pilot mode is mobile mode or fixed mode for the current frame in the current frame-group. If this field is set to '0', mobile pilot mode is used. If the field is set to '1', the fixed pilot mode is used.

PAPR_FLAG: This 1-bit field indicates whether PAPR reduction is used for the current frame in the current frame-group. If this field is set to value '1', tone reservation is used for PAPR reduction. If this field is set to '0', PAPR reduction is not used.

FRU_CONFIGURE: This 3-bit field indicates the PHY profile type configurations of the frame repetition units (FRU) that are present in the current super-frame. All profile types conveyed in the current super-frame are identified in this field in all preambles in the current super-frame. The 3-bit field has a different definition for each profile, as show in below table 8.

TABLE 8

| | Current PHY_PROFILE = '000' (base) | Current PHY_PROFILE = '001' (handheld) | Current PHY_PROFILE = '010' (advanced) | Current PHY_PROFILE = '111' (FEF) |
| --- | --- | --- | --- | --- |
| FRU_CONFIGURE = 000 | Only base profile present | Only handheld profile present | Only advanced profile present | Only FEF present |
| FRU_CONFIGURE = 1XX | Handheld profile present | Base profile present | Base profile present | Base profile present |
| FRU_CONFIGURE = X1X | Advanced profile present | Advanced profile present | Handheld profile present | Handheld profile present |
| FRU_CONFIGURE = XX1 | FEF present | FEF present | FEF present | Advanced profile present |

RESERVED: This 7-bit field is reserved for future use.

FIG. 13 illustrates PLS1 data according to an embodiment of the present invention.

PLS1 data provides basic transmission parameters including parameters required to enable the reception and decoding of the PLS2. As above mentioned, the PLS1 data remain unchanged for the entire duration of one frame-group. The detailed definition of the signaling fields of the PLS1 data are as follows:

PREAMBLE_DATA: This 20-bit field is a copy of the preamble signaling data excluding the EAC_FLAG.

NUM_FRAME_FRU: This 2-bit field indicates the number of the frames per FRU.

PAYLOAD_TYPE: This 3-bit field indicates the format of the payload data carried in the frame-group. PAYLOAD_TYPE is signaled as shown in table 9.

TABLE 9

| value | Payload type |
| --- | --- |
| 1XX | TS stream is transmitted |
| X1X | IP stream is transmitted |
| XX1 | GS stream is transmitted |

NUM_FSS: This 2-bit field indicates the number of FSS symbols in the current frame.

SYSTEM_VERSION: This 8-bit field indicates the version of the transmitted signal format. The SYSTEM_VERSION is divided into two 4-bit fields, which are a major version and a minor version.

Major version: The MSB four bits of SYSTEM_VERSION field indicate major version information. A change in the major version field indicates a non-backward-compatible change. The default value is '0000'. For the version described in this standard, the value is set to '0000'.

Minor version: The LSB four bits of SYSTEM_VERSION field indicate minor version information. A change in the minor version field is backward-compatible.

CELL_ID: This is a 16-bit field which uniquely identifies a geographic cell in an ATSC network. An ATSC cell coverage area may consist of one or more frequencies, depending on the number of frequencies used per Futurecast UTB system. If the value of the CELL_ID is not known or unspecified, this field is set to '0'.

NETWORK_ID: This is a 16-bit field which uniquely identifies the current ATSC network.

SYSTEM_ID: This 16-bit field uniquely identifies the Futurecast UTB system within the ATSC network. The Futurecast UTB system is the terrestrial broadcast system whose input is one or more input streams (TS, IP, GS) and whose output is an RF signal. The Futurecast UTB system carries one or more PHY profiles and FEF, if any. The same Futurecast UTB system may carry different input streams and use different RF frequencies in different geographical areas, allowing local service insertion. The frame structure and scheduling is controlled in one place and is identical for all transmissions within a Futurecast UTB system. One or more Futurecast UTB systems may have the same SYSTEM_ID meaning that they all have the same physical layer structure and configuration.

The following loop consists of FRU_PHY_PROFILE, FRU_FRAME_LENGTH, FRU_GI_FRACTION, and RESERVED which are used to indicate the FRU configuration and the length of each frame type. The loop size is fixed so that four PHY profiles (including a FEF) are signaled within the FRU. If NUM_FRAME_FRU is less than 4, the unused fields are filled with zeros.

FRU_PHY_PROFILE: This 3-bit field indicates the PHY profile type of the (i+1)th (i is the loop index) frame of the associated FRU. This field uses the same signaling format as shown in the table 8.

FRU_FRAME_LENGTH: This 2-bit field indicates the length of the (i+1)th frame of the associated FRU. Using FRU_FRAME_LENGTH together with FRU_GI_FRACTION, the exact value of the frame duration can be obtained.

FRU_GI_FRACTION: This 3-bit field indicates the guard interval fraction value of the (i+1)th frame of the associated FRU. FRU_GI_FRACTION is signaled according to the table 7.

RESERVED: This 4-bit field is reserved for future use.

The following fields provide parameters for decoding the PLS2 data.

PLS2_FEC_TYPE: This 2-bit field indicates the FEC type used by the PLS2 protection. The FEC type is signaled according to table 10. The details of the LDPC codes will be described later.

TABLE 10

| Content | PLS2 FEC type |
|---------|---------------|
| 00 | 4K-1/4 and 7K-3/10 LDPC codes |
| 01~11 | Reserved |

PLS2_MOD: This 3-bit field indicates the modulation type used by the PLS2. The modulation type is signaled according to table 11.

TABLE 11

| Value | PLS2_MODE |
|-------|-----------|
| 000 | BPSK |
| 001 | QPSK |
| 010 | QAM-16 |
| 011 | NUQ-64 |
| 100~111 | Reserved |

PLS2_SIZE_CELL: This 15-bit field indicates Ctotal_partial_block, the size (specified as the number of QAM cells) of the collection of full coded blocks for PLS2 that is carried in the current frame-group. This value is constant during the entire duration of the current frame-group.

PLS2_STAT_SIZE_BIT: This 14-bit field indicates the size, in bits, of the PLS2-STAT for the current frame-group. This value is constant during the entire duration of the current frame-group.

PLS2_DYN_SIZE_BIT: This 14-bit field indicates the size, in bits, of the PLS2-DYN for the current frame-group. This value is constant during the entire duration of the current frame-group.

PLS2_REP_FLAG: This 1-bit flag indicates whether the PLS2 repetition mode is used in the current frame-group. When this field is set to value '1', the PLS2 repetition mode is activated. When this field is set to value '0', the PLS2 repetition mode is deactivated.

PLS2_REP_SIZE_CELL: This 15-bit field indicates Ctotal_partial_block, the size (specified as the number of QAM cells) of the collection of partial coded blocks for PLS2 carried in every frame of the current frame-group, when PLS2 repetition is used. If repetition is not used, the value of this field is equal to 0. This value is constant during the entire duration of the current frame-group.

PLS2_NEXT_FEC_TYPE: This 2-bit field indicates the FEC type used for PLS2 that is carried in every frame of the next frame-group. The FEC type is signaled according to the table 10.

PLS2_NEXT_MOD: This 3-bit field indicates the modulation type used for PLS2 that is carried in every frame of the next frame-group. The modulation type is signaled according to the table 11.

PLS2_NEXT_REP_FLAG: This 1-bit flag indicates whether the PLS2 repetition mode is used in the next frame-group. When this field is set to value '1', the PLS2 repetition mode is activated. When this field is set to value '0', the PLS2 repetition mode is deactivated.

PLS2_NEXT_REP_SIZE_CELL: This 15-bit field indicates Ctotal_full_block. The size (specified as the number of QAM cells) of the collection of full coded blocks for PLS2 that is carried in every frame of the next frame-group, when PLS2 repetition is used. If repetition is not used in the next frame-group, the value of this field is equal to 0. This value is constant during the entire duration of the current frame-group.

PLS2_NEXT_REP_STAT_SIZE_BIT: This 14-bit field indicates the size, in bits, of the PLS2-STAT for the next frame-group. This value is constant in the current frame-group.

PLS2_NEXT_REP_DYN_SIZE_BIT: This 14-bit field indicates the size, in bits, of the PLS2-DYN for the next frame-group. This value is constant in the current frame-group.

PLS2_AP_MODE: This 2-bit field indicates whether additional parity is provided for PLS2 in the current frame-group. This value is constant during the entire duration of the current frame-group. The below table 12 gives the values of this field. When this field is set to '00', additional parity is not used for the PLS2 in the current frame-group.

TABLE 12

| Value | PLS2-AP mode |
|-------|--------------|
| 00 | AP is not provided |
| 01 | AP1 mode |
| 10~11 | Reserved |

PLS2_AP_SIZE_CELL: This 15-bit field indicates the size (specified as the number of QAM cells) of the additional parity bits of the PLS2. This value is constant during the entire duration of the current frame-group.

PLS2_NEXT_AP_MODE: This 2-bit field indicates whether additional parity is provided for PLS2 signaling in every frame of next frame-group. This value is constant during the entire duration of the current frame-group. The table 12 defines the values of this field PLS2_NEXT_AP_SIZE_CELL: This 15-bit field indicates the size (specified as the number of QAM cells) of the additional parity bits of the PLS2 in every frame of the next frame-group. This value is constant during the entire duration of the current frame-group.

RESERVED: This 32-bit field is reserved for future use.

CRC_32: A 32-bit error detection code, which is applied to the entire PLS1 signaling.

FIG. 14 illustrates PLS2 data according to an embodiment of the present invention.

FIG. 14 illustrates PLS2-STAT data of the PLS2 data. The PLS2-STAT data are the same within a frame-group, while the PLS2-DYN data provide information that is specific for the current frame.

The details of fields of the PLS2-STAT data are as follows:

FIC_FLAG: This 1-bit field indicates whether the FIC is used in the current frame-group. If this field is set to '1', the FIC is provided in the current frame. If this field set to '0', the FIC is not carried in the current frame. This value is constant during the entire duration of the current frame-group.

AUX_FLAG: This 1-bit field indicates whether the auxiliary stream(s) is used in the current frame-group. If this field is set to '1', the auxiliary stream is provided in the current frame. If this field set to '0', the auxiliary stream is not carried in the current frame. This value is constant during the entire duration of current frame-group.

NUM_DP: This 6-bit field indicates the number of DPs carried within the current frame. The value of this field ranges from 1 to 64, and the number of DPs is NUM_DP+1.

DP_ID: This 6-bit field identifies uniquely a DP within a PHY profile.

DP_TYPE: This 3-bit field indicates the type of the DP. This is signaled according to the below table 13.

TABLE 13

| Value | DP Type |
|---|---|
| 000 | DP Type 1 |
| 001 | DP Type 2 |
| 010~111 | reserved |

DP_GROUP_ID: This 8-bit field identifies the DP group with which the current DP is associated. This can be used by a receiver to access the DPs of the service components associated with a particular service, which will have the same DP_GROUP_ID.

BASE_DP_ID: This 6-bit field indicates the DP carrying service signaling data (such as PSI/SI) used in the Management layer. The DP indicated by BASE_DP_ID may be either a normal DP carrying the service signaling data along with the service data or a dedicated DP carrying only the service signaling data DP_FEC_TYPE: This 2-bit field indicates the FEC type used by the associated DP. The FEC type is signaled according to the below table 14.

TABLE 14

| Value | FEC_TYPE |
|---|---|
| 00 | 16 k LDPC |
| 01 | 64 k LDPC |
| 10~11 | Reserved |

DP_COD: This 4-bit field indicates the code rate used by the associated DP. The code rate is signaled according to the below table 15.

TABLE 15

| Value | Code rate |
|---|---|
| 0000 | 5/15 |
| 0001 | 6/15 |
| 0010 | 7/15 |
| 0011 | 8/15 |
| 0100 | 9/15 |
| 0101 | 10/15 |
| 0110 | 11/15 |
| 0111 | 12/15 |
| 1000 | 13/15 |
| 1001~1111 | Reserved |

DP_MOD: This 4-bit field indicates the modulation used by the associated DP. The modulation is signaled according to the below table 16.

TABLE 16

| Value | Modulation |
|---|---|
| 0000 | QPSK |
| 0001 | QAM-16 |
| 0010 | NUQ-64 |
| 0011 | NUQ-256 |
| 0100 | NUQ-1024 |
| 0101 | NUC-16 |
| 0110 | NUC-64 |
| 0111 | NUC-256 |
| 1000 | NUC-1024 |
| 1001~1111 | reserved |

DP_SSD_FLAG: This 1-bit field indicates whether the SSD mode is used in the associated DP. If this field is set to value '1', SSD is used. If this field is set to value '0', SSD is not used.

The following field appears only if PHY_PROFILE is equal to '010', which indicates the advanced profile:

DP_MIMO: This 3-bit field indicates which type of MIMO encoding process is applied to the associated DP. The type of MIMO encoding process is signaled according to the table 17.

TABLE 17

| Value | MIMO encoding |
|---|---|
| 000 | FR-SM |
| 001 | FRFD-SM |
| 010~111 | reserved |

DP_TI_TYPE: This 1-bit field indicates the type of time-interleaving. A value of '0' indicates that one TI group corresponds to one frame and contains one or more TI-blocks. A value of '1' indicates that one TI group is carried in more than one frame and contains only one TI-block.

DP_TI_LENGTH: The use of this 2-bit field (the allowed values are only 1, 2, 4, 8) is determined by the values set within the DP_TI_TYPE field as follows:

If the DP_TI_TYPE is set to the value '1', this field indicates PI, the number of the frames to which each TI group is mapped, and there is one TI-block per TI group (NTI=1). The allowed PI values with 2-bit field are defined in the below table 18.

If the DP_TI_TYPE is set to the value '0', this field indicates the number of TI-blocks NTI per TI group, and there is one TI group per frame (PI=1). The allowed PI values with 2-bit field are defined in the below table 18.

TABLE 18

| 2-bit field | $P_I$ | $N_{TI}$ |
|---|---|---|
| 00 | 1 | 1 |
| 01 | 2 | 2 |
| 10 | 4 | 3 |
| 11 | 8 | 4 |

DP_FRAME_INTERVAL: This 2-bit field indicates the frame interval (IJUMP) within the frame-group for the associated DP and the allowed values are 1, 2, 4, 8 (the corresponding 2-bit field is '00', '01', '10', or '11', respectively). For DPs that do not appear every frame of the frame-group, the value of this field is equal to the interval between successive frames. For example, if a DP appears on the frames 1, 5, 9, 13, etc., this field is set to '4'. For DPs that appear in every frame, this field is set to '1'.

DP_TI_BYPASS: This 1-bit field determines the availability of time interleaver 5050. If time interleaving is not used for a DP, it is set to '1'. Whereas if time interleaving is used it is set to '0'.

DP_FIRST_FRAME_IDX: This 5-bit field indicates the index of the first frame of the super-frame in which the current DP occurs. The value of DP_FIRST_FRAME_IDX ranges from 0 to 31

DP_NUM_BLOCK_MAX: This 10-bit field indicates the maximum value of DP_NUM_BLOCKS for this DP. The value of this field has the same range as DP_NUM_BLOCKS.

DP_PAYLOAD_TYPE: This 2-bit field indicates the type of the payload data carried by the given DP. DP_PAYLOAD_TYPE is signaled according to the below table 19.

TABLE 19

| Value | Payload Type |
| --- | --- |
| 00 | TS. |
| 01 | IP |
| 10 | GS |
| 11 | reserved |

DP_INBAND_MODE: This 2-bit field indicates whether the current DP carries in-band signaling information. The in-band signaling type is signaled according to the below table 20.

TABLE 20

| Value | In-band mode |
| --- | --- |
| 00 | In-band signaling is not carried. |
| 01 | INBAND-PLS is carried only |
| 10 | INBAND-ISSY is carried only |
| 11 | INBAND-PLS and INBAND-ISSY are carried |

DP_PROTOCOL_TYPE: This 2-bit field indicates the protocol type of the payload carried by the given DP. It is signaled according to the below table 21 when input payload types are selected.

TABLE 21

| Value | If DP_PAYLOAD_TYPE Is TS | If DP_PAYLOAD_TYPE Is IP | If DP_PAYLOAD_TYPE Is GS |
| --- | --- | --- | --- |
| 00 | MPEG2-TS | IPv4 | (Note) |
| 01 | Reserved | IPv6 | Reserved |
| 10 | Reserved | Reserved | Reserved |
| 11 | Reserved | Reserved | Reserved |

DP_CRC_MODE: This 2-bit field indicates whether CRC encoding is used in the Input Formatting block. The CRC mode is signaled according to the below table 22.

TABLE 22

| Value | CRC mode |
| --- | --- |
| 00 | Not used |
| 01 | CRC-8 |
| 10 | CRC-16 |
| 11 | CRC-32 |

DNP_MODE: This 2-bit field indicates the null-packet deletion mode used by the associated DP when DP_PAYLOAD_TYPE is set to TS ('00'). DNP_MODE is signaled according to the below table 23. If DP_PAYLOAD_TYPE is not TS ('00'), DNP_MODE is set to the value '00'.

TABLE 23

| Value | Null-packet deletion mode |
| --- | --- |
| 00 | Not used |
| 01 | DNP-NORMAL |
| 10 | DNP-OFFSET |
| 11 | reserved |

ISSY_MODE: This 2-bit field indicates the ISSY mode used by the associated DP when DP_PAYLOAD_TYPE is set to TS ('00'). The ISSY_MODE is signaled according to the below table 24 If DP_PAYLOAD_TYPE is not TS ('00'), ISSY_MODE is set to the value '00'.

TABLE 24

| Value | ISSY mode |
| --- | --- |
| 00 | Not used |
| 01 | ISSY-UP |
| 10 | ISSY-BBF |
| 11 | reserved |

HC_MODE_TS: This 2-bit field indicates the TS header compression mode used by the associated DP when DP_PAYLOAD_TYPE is set to TS ('00'). The HC_MODE_TS is signaled according to the below table 25.

TABLE 25

| Value | Header compression mode |
| --- | --- |
| 00 | HC_MODE_TS 1 |
| 01 | HC_MODE_TS 2 |
| 10 | HC_MODE_TS 3 |
| 11 | HC_MODE_TS 4 |

HC_MODE_IP: This 2-bit held indicates the IP header compression mode when DP_PAYLOAD_TYPE is set to IP ('01'). The HC_MODE_IP is signaled according to the below table 26.

TABLE 26

| Value | Header compression mode |
| --- | --- |
| 00 | No compression |
| 01 | HC_MODE_IP 1 |
| 10~11 | reserved |

PID: This 13-bit field indicates the PID number for TS header compression when DP_PAYLOAD_TYPE is set to TS ('00') and HC_MODE_TS is set to '01' or '10'.

RESERVED: This 8-bit field is reserved for future use.

The following field appears only if FIC_FLAG is equal to '1':

FIC_VERSION: This 8-bit field indicates the version number of the FIC.

FIC_LENGTH_BYTE: This 13-bit field indicates the length, in bytes, of the FIC.

RESERVED: This 8-bit field is reserved for future use.

The following field appears only if AUX_FLAG is equal to '1':

NUM_AUX: This 4-bit field indicates the number of auxiliary streams. Zero means no auxiliary streams are used.

AUX_CONFIG_RFU: This 8-bit field is reserved for future use.

AUX_STREAM_TYPE: This 4-bit is reserved for future use for indicating the type of the current auxiliary stream.

AUX_PRIVATE_CONFIG: This 28-bit field is reserved for future use for signaling auxiliary streams.

Figures 15, 16:
FIG. 15 illustrates PLS2 data according to another embodiment of the present invention.
FIG. 16 illustrates a logical structure of a frame according to an embodiment of the present invention.

FIG. 15 illustrates PLS2 data according to another embodiment of the present invention.

FIG. 15 illustrates PLS2-DYN data of the PLS2 data. The values of the PLS2-DYN data may change during the duration of one frame-group, while the size of fields remains constant.

The details of fields of the PLS2-DYN data are as follows:

FRAME_INDEX: This 5-bit field indicates the frame index of the current frame within the super-frame. The index of the first frame of the super-frame is set to '0'.

PLS_CHANGE_COUNTER: This 4-bit field indicates the number of super-frames ahead where the configuration will change. The next super-frame with changes in the configuration is indicated by the value signaled within this field. If this field is set to the value '0000', it means that no scheduled change is foreseen: e.g., value '1' indicates that there is a change in the next super-frame.

FIC_CHANGE_COUNTER: This 4-bit field indicates the number of super-frames ahead where the configuration (i.e., the contents of the FIC) will change. The next super-frame with changes in the configuration is indicated by the value signaled within this field. If this field is set to the value '0000', it means that no scheduled change is foreseen: e.g. value '0001' indicates that there is a change in the next super-frame.

RESERVED: This 16-bit field is reserved for future use.

The following fields appear in the loop over NUM_DP, which describe the parameters associated with the DP carried in the current frame.

DP_ID: This 6-bit field indicates uniquely the DP within a PHY profile.

DP_START: This 15-bit (or 13-bit) field indicates the start position of the first of the DPs using the DPU addressing scheme. The DP_START field has differing length according to the PHY profile and FFT size as shown in the below table 27.

TABLE 27

| PHY profile | DP_START field size | |
|---|---|---|
| | 64 k | 16 k |
| Base | 13 bit | 15 bit |
| Handheld | — | 13 bit |
| Advanced | 13 bit | 15 bit |

DP_NUM_BLOCK: This 10-bit field indicates the number of FEC blocks in the current TI group for the current DP. The value of DP_NUM_BLOCK ranges from 0 to 1023

RESERVED: This 8-bit field is reserved for future use.

The following fields indicate the FIC parameters associated with the EAC.

EAC_FLAG: This 1-bit field indicates the existence of the EAC in the current frame. This bit is the same value as the EAC_FLAG in the preamble.

EAS_WAKE_UP_VERSION_NUM: This 8-bit field indicates the version number of a wake-up indication.

If the EAC_FLAG field is equal to '1', the following 12 bits are allocated for EAC_LENGTH_BYTE field. If the EAC_FLAG field is equal to '0', the following 12 bits are allocated for EAC_COUNTER.

EAC_LENGTH_BYTE: This 12-bit field indicates the length, in byte, of the EAC.

EAC_COUNTER: This 12-bit field indicates the number of the frames before the frame where the EAC arrives.

The following field appears only if the AUX_FLAG field is equal to '1':

AUX_PRIVATE_DYN: This 48-bit field is reserved for future use for signaling auxiliary streams. The meaning of this field depends on the value of AUX_STREAM_TYPE in the configurable PLS2-STAT.

CRC_32: A 32-bit error detection code, which is applied to the entire PLS2.

FIG. 16 illustrates a logical structure of a frame according to an embodiment of the present invention.

As above mentioned, the PLS, EAC, FIC, DPs, auxiliary streams and dummy cells are mapped into the active carriers of the OFDM symbols in the frame. The PLS1 and PLS2 are first mapped into one or more FSS(s). After that, EAC cells, if any, are mapped immediately following the PLS field, followed next by FIC cells, if any. The DPs are mapped next after the PLS or EAC, FIC, if any. Type 1 DPs follows first, and Type 2 DPs next. The details of a type of the DP will be described later. In some case, DPs may carry some special data for EAS or service signaling data. The auxiliary stream or streams, if any, follow the DPs, which in turn are followed by dummy cells. Mapping them all together in the above mentioned order, i.e. PLS, EAC, FIC, DPs, auxiliary streams and dummy data cells exactly fill the cell capacity in the frame.

Figure 17:
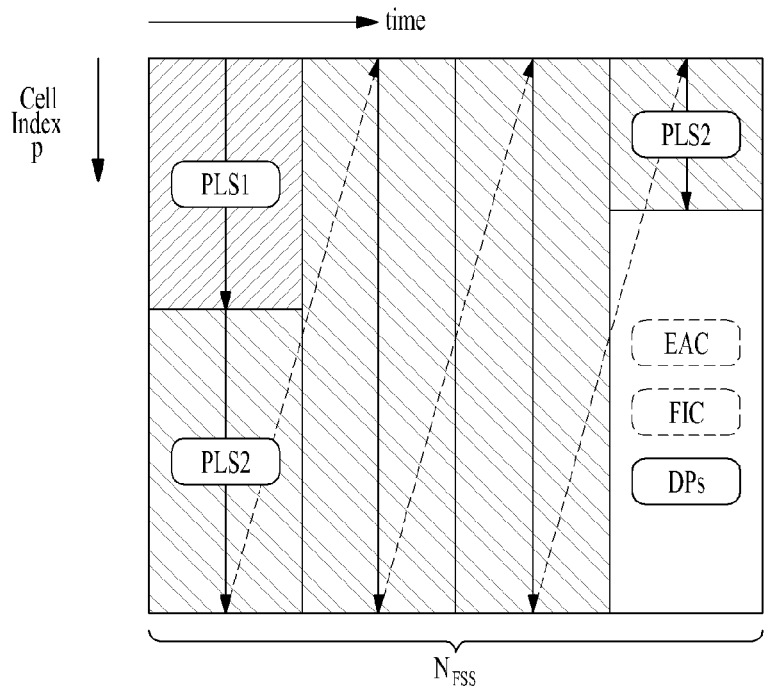
FIG. 17 illustrates PLS mapping according to an embodiment of the present invention.

FIG. 17 illustrates PLS mapping according to an embodiment of the present invention.

PLS cells are mapped to the active carriers of FSS(s). Depending on the number of cells occupied by PLS, one or more symbols are designated as FSS(s), and the number of FSS(s) NFSS is signaled by NUM_FSS in PLS1. The FSS is a special symbol for carrying PLS cells. Since robustness and latency are critical issues in the PLS, the FSS(s) has higher density of pilots allowing fast synchronization and frequency-only interpolation within the FSS.

PLS cells are mapped to active carriers of the NFSS FSS(s) in a top-down manner as shown in an example in FIG. 17. The PLS1 cells are mapped first from the first cell of the first FSS in an increasing order of the cell index. The PLS2 cells follow immediately after the last cell of the PLS1 and mapping continues downward until the last cell index of the first FSS. If the total number of required PLS cells exceeds the number of active carriers of one FSS, mapping proceeds to the next FSS and continues in exactly the same manner as the first FSS.

After PLS mapping is completed, DPs are carried next. If EAC, FIC or both are present in the current frame, they are placed between PLS and "normal" DPs.

Figure 18:
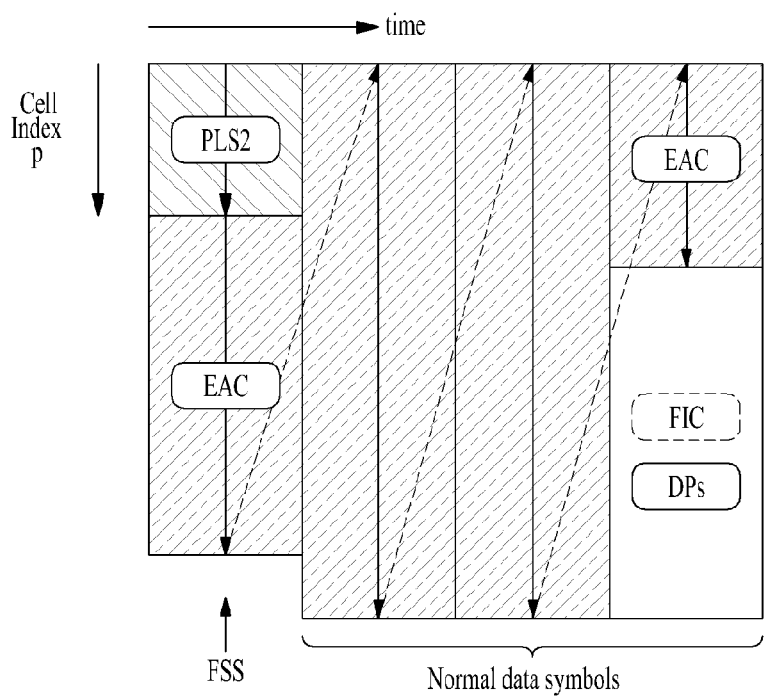
FIG. 18 illustrates EAC mapping according to an embodiment of the present invention.

FIG. 18 illustrates EAC mapping according to an embodiment of the present invention.

EAC is a dedicated channel for carrying EAS messages and links to the DPs for EAS. EAS support is provided but EAC itself may or may not be present in every frame. EAC, if any, is mapped immediately after the PLS2 cells. EAC is not preceded by any of the FIC, DPs, auxiliary streams or dummy cells other than the PLS cells. The procedure of mapping the EAC cells is exactly the same as that of the PLS.

The EAC cells are mapped from the next cell of the PLS2 in increasing order of the cell index as shown in the example in FIG. 18. Depending on the EAS message size, EAC cells may occupy a few symbols, as shown in FIG. 18.

EAC cells follow immediately after the last cell of the PLS2, and mapping continues downward until the last cell index of the last FSS. If the total number of required EAC cells exceeds the number of remaining active carriers of the last FSS mapping proceeds to the next symbol and continues in exactly the same manner as FSS(s). The next symbol for mapping in this case is the normal data symbol, which has more active carriers than a FSS.

After EAC mapping is completed, the FIC is carried next, if any exists. If FIC is not transmitted (as signaled in the PLS2 field), DPs follow immediately after the last cell of the EAC.

Figure 19A:
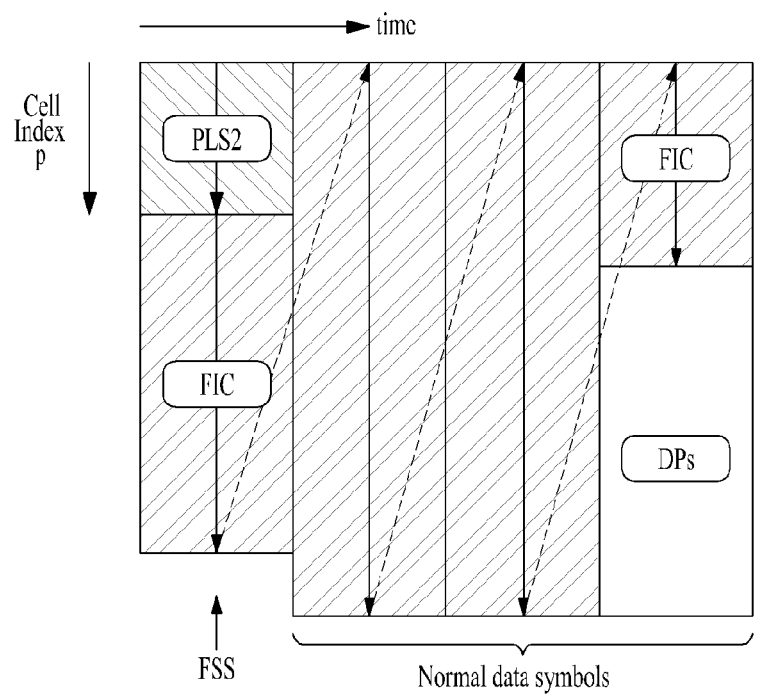
FIGS. 19(a) and 19(b) illustrate FIC mapping according to an embodiment of the present invention.
Figure 19B:
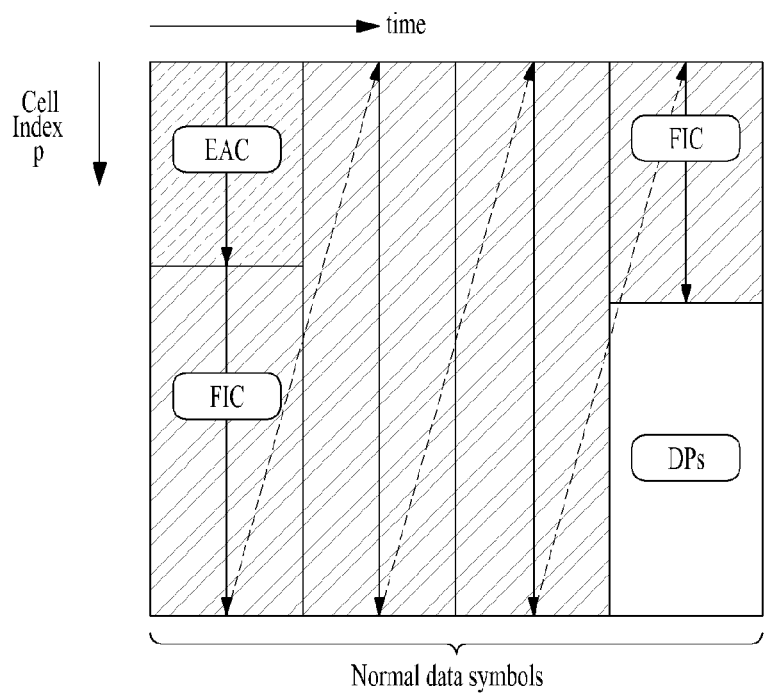

FIG. 19 illustrates FIC mapping according to an embodiment of the present invention.

shows an example mapping of FIC cell without EAC and (b) shows an example mapping of FIC cell with EAC.

FIC is a dedicated channel for carrying cross-layer information to enable fast service acquisition and channel scanning. This information primarily includes channel binding information between DPs and the services of each broadcaster. For fast scan, a receiver can decode FIC and obtain information such as broadcaster ID, number of services, and BASE_DP_ID. For fast service acquisition, in addition to FIC, base DP can be decoded using BASE_DP_ID. Other than the content it carries, a base DP is encoded and mapped to a frame in exactly the same way as a normal DP. Therefore, no additional description is required for a base DP. The FIC data is generated and consumed in the Management Layer. The content of FIC data is as described in the Management Layer specification.

The FIC data is optional and the use of FIC is signaled by the FIC_FLAG parameter in the static part of the PLS2. If FIC is used, FIC_FLAG is set to '1' and the signaling field for FIC is defined in the static part of PLS2. Signaled in this field are FIC_VERSION, and FIC_LENGTH_BYTE. FIC uses the same modulation, coding and time interleaving parameters as PLS2. FIC shares the same signaling parameters such as PLS2_MOD and PLS2_FEC. FIC data, if any, is mapped immediately after PLS2 or EAC if any. FIC is not preceded by any normal DPs, auxiliary streams or dummy cells. The method of mapping FIC cells is exactly the same as that of EAC which is again the same as PLS.

Without EAC after PLS, FIC cells are mapped from the next cell of the PLS2 in an increasing order of the cell index as shown in an example in (a). Depending on the FIC data size, FIC cells may be mapped over a few symbols, as shown in (b).

FIC cells follow immediately after the last cell of the PLS2, and mapping continues downward until the last cell index of the last FSS. If the total number of required FIC cells exceeds the number of remaining active carriers of the last FSS, mapping proceeds to the next symbol and continues in exactly the same manner as FSS(s). The next symbol for mapping in this case is the normal data symbol which has more active carriers than a FSS.

If EAS messages are transmitted in the current frame, EAC precedes FIC, and FIC cells are mapped from the next cell of the EAC in an increasing order of the cell index as shown in (b).

After FIC mapping is completed, one or more DPs are mapped, followed by auxiliary streams, if any, and dummy cells.

Figure 20A:
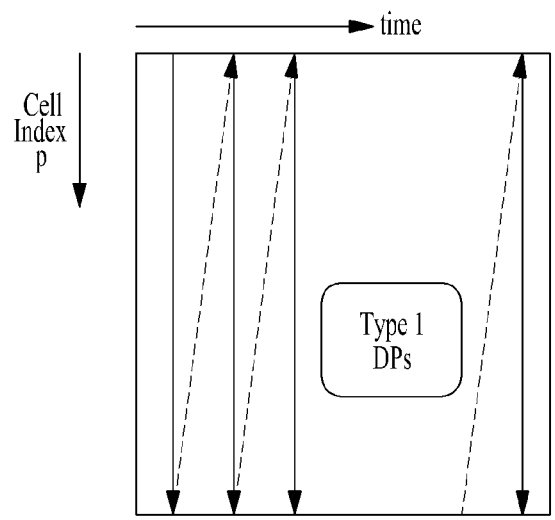
FIGS. 20(a) and 20(b) illustrate a type of DP according to an embodiment of the present invention.
Figure 20B:
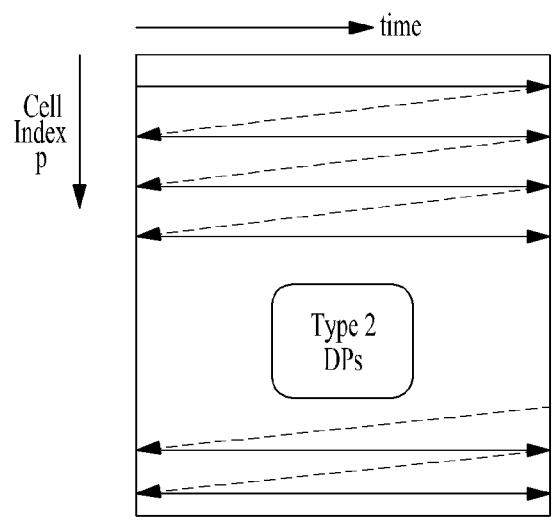

FIG. 20 illustrates a type of DP according to an embodiment of the present invention.

shows type 1 DP and (b) shows type 2 DP.

After the preceding channels, i.e., PLS, EAC and FIC, are mapped, cells of the DPs are mapped. A DP is categorized into one of two types according to mapping method:

Type 1 DP: DP is mapped by TDM
Type 2 DP: DP is mapped by FDM

The type of DP is indicated by DP_TYPE field in the static part of PLS2. FIG. 20 illustrates the mapping orders of Type 1 DPs and Type 2 DPs. Type 1 DPs are first mapped in the increasing order of cell index, and then after reaching the last cell index, the symbol index is increased by one. Within the next symbol, the DP continues to be mapped in the increasing order of cell index starting from p=0. With a number of DPs mapped together in one frame, each of the Type 1 DPs are grouped in time, similar to TDM multiplexing of DPs.

Type 2 DPs are first mapped in the increasing order of symbol index, and then after reaching the last OFDM symbol of the frame, the cell index increases by one and the symbol index rolls back to the first available symbol and then increases from that symbol index. After mapping a number of DPs together in one frame, each of the Type 2 DPs are grouped in frequency together, similar to FDM multiplexing of DPs.

Type 1 DPs and Type 2 DPs can coexist in a frame if needed with one restriction; Type 1 DPs always precede Type 2 DPs. The total number of OFDM cells carrying Type 1 and Type 2 DPs cannot exceed the total number of OFDM cells available for transmission of DPs:

$$D_{DP1}+D_{DP2} \leq D_{DP} \qquad \text{[Math figure 2]}$$

where DDP1 is the number of OFDM cells occupied by Type 1 DPs, DDP2 is the number of cells occupied by Type 2 DPs. Since PLS, EAC, FIC are all mapped in the same way as Type 1 DP, they all follow "Type 1 mapping rule". Hence, overall, Type 1 mapping always precedes Type 2 mapping.

Figure 21A:
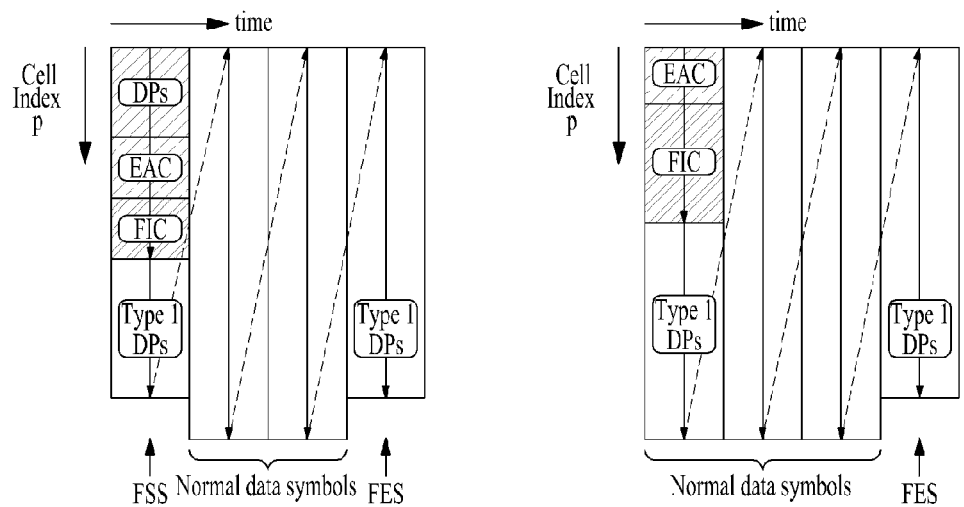
FIGS. 21(a) and 21(b) illustrate DP mapping according to an embodiment of the present invention.
Figure 21B:
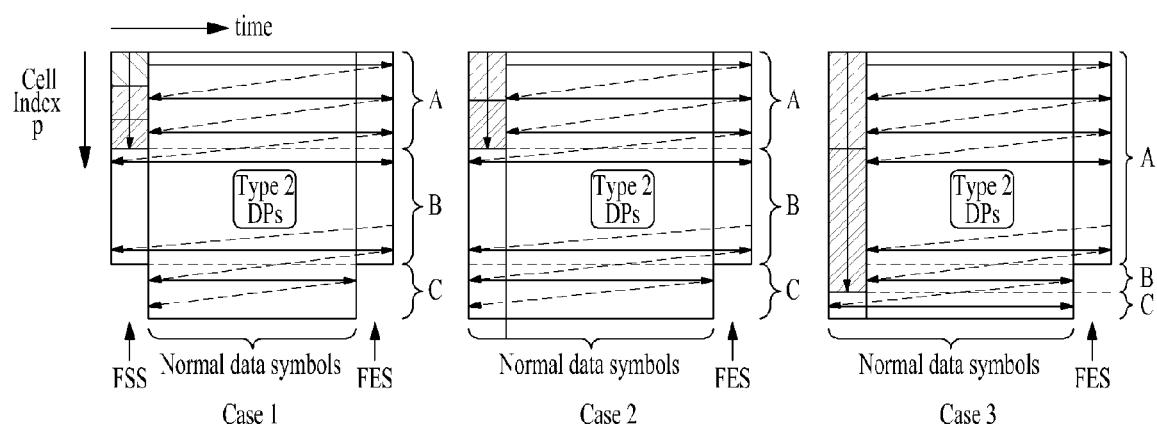

FIG. 21 illustrates DP mapping according to an embodiment of the present invention.

shows an addressing of OFDM cells for mapping type 1 DPs and (b) shows an addressing of OFDM cells for mapping for type 2 DPs.

Addressing of OFDM cells for mapping Type 1 DPs $(0, \ldots, DDP1-1)$ is defined for the active data cells of Type 1 DPs. The addressing scheme defines the order in which the cells from the TIs for each of the Type 1 DPs are allocated to the active data cells. It is also used to signal the locations of the DPs in the dynamic part of the PLS2.

Without EAC and FIC, address 0 refers to the cell immediately following the last cell carrying PLS in the last FSS. If EAC is transmitted and FIC is not in the corresponding frame, address 0 refers to the cell immediately following the last cell carrying EAC. If FIC is transmitted in the corresponding frame, address 0 refers to the cell immediately following the last cell carrying FIC. Address 0 for Type 1 DPs can be calculated considering two different cases as shown in (a). In the example in (a), PLS, EAC and FIC are assumed to be all transmitted. Extension to the cases where either or both of EAC and FIC are omitted is straightforward. If there are remaining cells in the FSS after mapping all the cells up to FIC as shown on the left side of (a).

Addressing of OFDM cells for mapping Type 2 DPs (0, . . . , DDP2-1) is defined for the active data cells of Type 2 DPs. The addressing scheme defines the order in which the cells from the TIs for each of the Type 2 DPs are allocated to the active data cells. It is also used to signal the locations of the DPs in the dynamic part of the PLS2.

Three slightly different cases are possible as shown in (b). For the first case shown on the left side of (b), cells in the last FSS are available for Type 2 DP mapping. For the second case shown in the middle, FIC occupies cells of a normal symbol, but the number of FIC cells on that symbol is not larger than CFSS. The third case, shown on the right side in (b), is the same as the second case except that the number of FIC cells mapped on that symbol exceeds CFSS.

The extension to the case where Type 1 DP(s) precede Type 2 DP(s) is straightforward since PLS, EAC and FIC follow the same "Type 1 mapping rule" as the Type 1 DP(s).

A data pipe unit (DPU) is a basic unit for allocating data cells to a DP in a frame.

A DPU is defined as a signaling unit for locating DPs in a frame. A Cell Mapper 7010 may map the cells produced by the TIs for each of the DPs. A Time interleaver 5050 outputs a series of TI-blocks and each TI-block comprises a variable number of XFECBLOCKs which is in turn composed of a set of cells. The number of cells in an XFECBLOCK, Ncells, is dependent on the FECBLOCK size, Nldpc, and the number of transmitted bits per constellation symbol. A DPU is defined as the greatest common divisor of all possible values of the number of cells in a XFECBLOCK, Ncells, supported in a given PHY profile. The length of a DPU in cells is defined as LDPU. Since each PHY profile supports different combinations of FECBLOCK size and a different number of bits per constellation symbol, LDPU is defined on a PHY profile basis.

Figure 22:
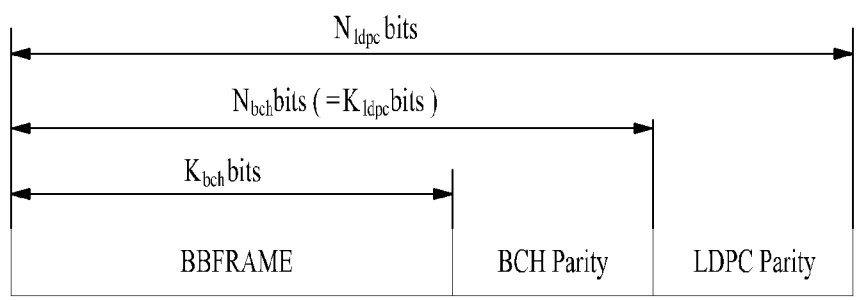
FIG. 22 illustrates an FEC structure according to an embodiment of the present invention.

FIG. 22 illustrates an FEC structure according to an embodiment of the present invention.

FIG. 22 illustrates an FEC structure according to an embodiment of the present invention before bit interleaving. As above mentioned, Data FEC encoder may perform the FEC encoding on the input BBF to generate FECBLOCK procedure using outer coding (BCH), and inner coding (LDPC). The illustrated FEC structure corresponds to the FECBLOCK. Also, the FECBLOCK and the FEC structure have same value corresponding to a length of LDPC codeword.

The BCH encoding is applied to each BBF (Kbch bits), and then LDPC encoding is applied to BCH-encoded BBF (Kldpc bits=Nbch bits) as illustrated in FIG. 22.

The value of Nldpc is either 64800 bits (long FECBLOCK) or 16200 bits (short FECBLOCK).

The below table 28 and table 29 show FEC encoding parameters for a long FECBLOCK and a short FECBLOCK, respectively.

TABLE 28

| LDPC Rate | $N_{ldpc}$ | $K_{ldpc}$ | $K_{bch}$ | BCH error correction capability | $N_{bch}$-$K_{bch}$ |
|---|---|---|---|---|---|
| 5/15 | 64800 | 21600 | 21408 | 12 | 192 |
| 6/15 | | 25920 | 25728 | | |
| 7/15 | | 30240 | 30048 | | |
| 8/15 | | 34560 | 34368 | | |
| 9/15 | | 38880 | 38688 | | |

TABLE 28-continued

| LDPC Rate | $N_{ldpc}$ | $K_{ldpc}$ | $K_{bch}$ | BCH error correction capability | $N_{bch}$-$K_{bch}$ |
|---|---|---|---|---|---|
| 10/15 | | 43200 | 43008 | | |
| 11/15 | | 47520 | 47328 | | |
| 12/15 | | 51840 | 51648 | | |
| 13/15 | | 56160 | 55968 | | |

TABLE 29

| LDPC Rate | $N_{ldpc}$ | $K_{ldpc}$ | $K_{bch}$ | BCH error correction capability | $N_{bch}$-$K_{bch}$ |
|---|---|---|---|---|---|
| 5/15 | 16200 | 5400 | 5232 | 12 | 168 |
| 6/15 | | 6480 | 6312 | | |
| 7/15 | | 7560 | 7392 | | |
| 8/15 | | 8640 | 8472 | | |
| 9/15 | | 9720 | 9552 | | |
| 10/15 | | 10800 | 10632 | | |
| 11/15 | | 11880 | 11712 | | |
| 12/15 | | 12960 | 12792 | | |
| 13/15 | | 14040 | 13872 | | |

The details of operations of the BCH encoding and LDPC encoding are as follows:

A 12-error correcting BCH code is used for outer encoding of the BBF. The BCH generator polynomial for short FECBLOCK and long FECBLOCK are obtained by multiplying together all polynomials.

LDPC code is used to encode the output of the outer BCH encoding. To generate a completed Bldpc (FECBLOCK), Pldpc (parity bits) is encoded systematically from each Ildpc (BCH-encoded BBF), and appended to Ildpc. The completed Bldpc (FECBLOCK) are expressed as follow Math figure.

$$B_{ldpc} = [I_{ldpc} P_{ldpc}] = [i_0, i_1, \ldots, i_{K_{ldpc}-1}, p_0, p_1, \ldots, p_{N_{ldpc}-K_{ldpc}-1}]$$ [Math figure 3]

The parameters for long FECBLOCK and short FECBLOCK are given in the above table 28 and 29, respectively.

The detailed procedure to calculate Nldpc–Kldpc parity bits for long FECBLOCK, is as follows:

1) Initialize the parity bits, $$p_0 = p_1 = p_2 = \cdots = p_{N_{ldpc}-K_{ldpc}-1} = 0$$ [Math figure 4]

2) Accumulate the first information bit—i0, at parity bit addresses specified in the first row of an addresses of parity check matrix. The details of addresses of parity check matrix will be described later. For example, for rate 13/15:

$$p_{983} = p_{983} \oplus i_0 \, p_{2815} = p_{2815} \oplus i_0$$

$$p_{4837} = p_{4837} \oplus i_0 \, p_{4989} = p_{4989} \oplus i_0$$

$$p_{6138} = p_{6133} \oplus i_0 \, p_{6458} = p_{6458} \oplus i_0$$

$$p_{6921} = p_{6921} \oplus i_0 \, p_{6974} = p_{6974} \oplus i_0$$

$$p_{7572} = p_{7572} \oplus i_0 \, p_{8260} = p_{8260} \oplus i_0$$

$$p_{8496} = p_{8496} \oplus i_0$$ [Math figure 5]

3) For the next 359 information bits, is, s=1, 2, . . . , 359 accumulate is at parity bit addresses using following Math figure.

$$\{x + (s \bmod 360) \times Q_{ldpc}\} \bmod (N_{ldpc} - K_{ldpc})$$ [Math figure 6]

where x denotes the address of the parity bit accumulator corresponding to the first bit i0, and Qldpc is a code rate dependent constant specified in the addresses of parity check matrix. Continuing with the example, Qldpc=24 for rate 13/15, so for information bit i1, the following operations are performed:

$$p_{1007}=p_{1007}\oplus i_1 \; p_{2839}=p_{2839}\oplus i_1$$

$$p_{4861}=p_{4861}\oplus i_1 \; p_{5013}=p_{5013}\oplus i_1$$

$$p_{6162}=p_{6162}\oplus i_1 \; p_{6482}=p_{6482}\oplus i_1$$

$$p_{6945}=p_{6945}\oplus i_1 \; p_{6998}=p_{6998}\oplus i_1$$

$$p_{7596}=p_{7596}\oplus i_1 \; p_{8284}=p_{8284}\oplus i_1$$

$$p_{8520}=p_{8520}\oplus i_1 \qquad \text{[Math figure 7]}$$

4) For the 361st information bit i360, the addresses of the parity bit accumulators are given in the second row of the addresses of parity check matrix. In a similar manner the addresses of the parity bit accumulators for the following 359 information bits is, s=361, 362, . . . , 719 are obtained using the Math figure 6, where x denotes the address of the parity bit accumulator corresponding to the information bit i360, i.e., the entries in the second row of the addresses of parity check matrix.

5) In a similar manner, for every group of 360 new information bits, a new row from addresses of parity check matrixes used to find the addresses of the parity bit accumulators.

After all of the information bits are exhausted, the final parity bits are obtained as follows:

6) Sequentially perform the following operations starting with i=1

$$p_i=p_i\oplus p_{i-1}, i=1,2,\ldots,N_{ldpc}-K_{ldpc}-1 \qquad \text{[Math figure 8]}$$

where final content of pi, i=0, 1, . . . Nldpc−Kldpc−1 is equal to the parity bit pi.

TABLE 30

| Code Rate | $Q_{ldpc}$ |
|---|---|
| 5/15 | 120 |
| 6/15 | 108 |
| 7/15 | 96 |
| 8/15 | 84 |
| 9/15 | 72 |
| 10/15 | 60 |
| 11/15 | 48 |
| 12/15 | 36 |
| 13/15 | 24 |

This LDPC encoding procedure for a short FECBLOCK is in accordance with t LDPC encoding procedure for the long FECBLOCK, except replacing the table 30 with table 31, and replacing the addresses of parity check matrix for the long FECBLOCK with the addresses of parity check matrix for the short FECBLOCK.

TABLE 31

| Code Rate | $Q_{ldpc}$ |
|---|---|
| 5/15 | 30 |
| 6/15 | 27 |
| 7/15 | 24 |
| 8/15 | 21 |
| 9/15 | 18 |
| 10/15 | 15 |

TABLE 31-continued

| Code Rate | $Q_{ldpc}$ |
|---|---|
| 11/15 | 12 |
| 12/15 | 9 |
| 13/15 | 6 |

Figure 23:
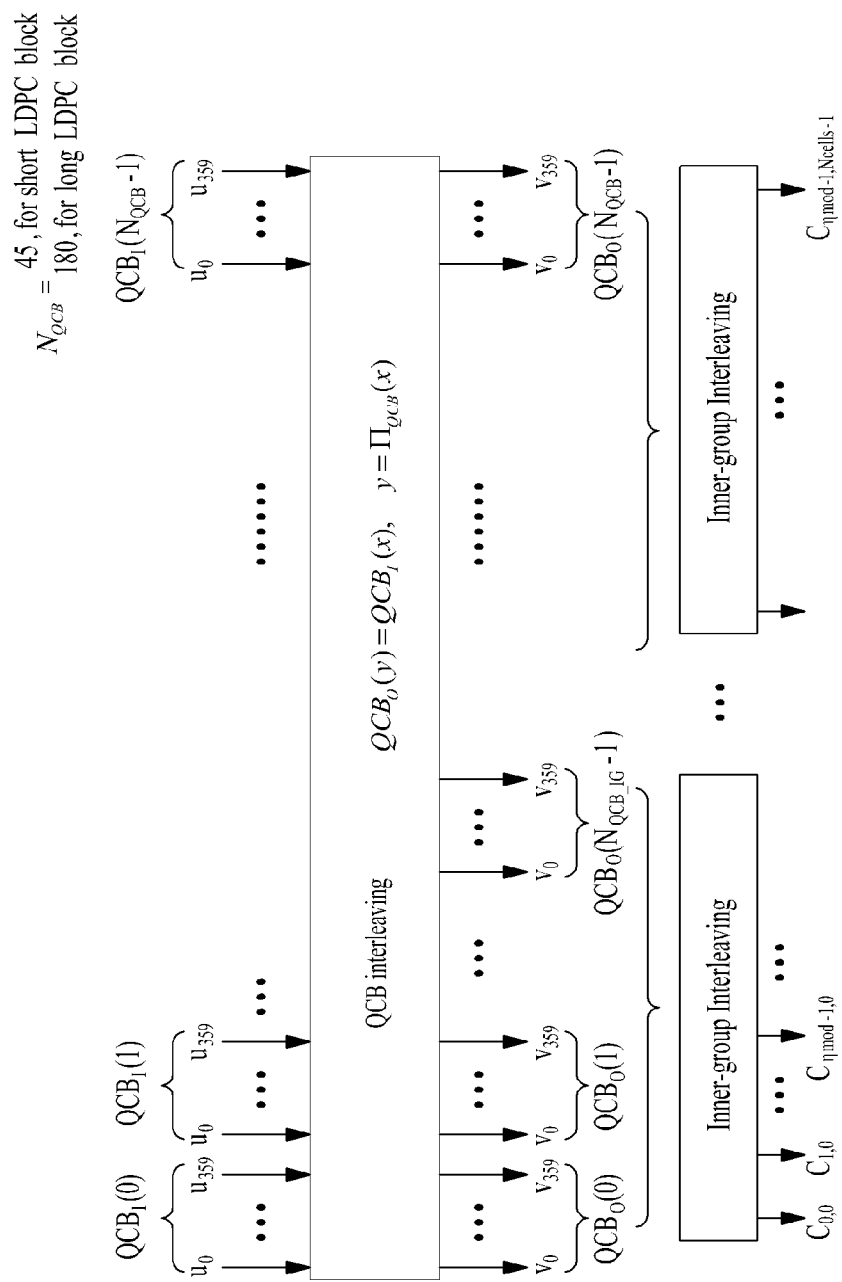
FIG. 23 illustrates a bit interleaving according to an embodiment of the present invention.

FIG. 23 illustrates a bit interleaving according to an embodiment of the present invention.

The outputs of the LDPC encoder are bit-interleaved, which consists of parity interleaving followed by Quasi-Cyclic Block (QCB) interleaving and inner-group interleaving.

shows Quasi-Cyclic Block (QCB) interleaving and (b) shows inner-group interleaving.

The FECBLOCK may be parity interleaved. At the output of the parity interleaving, the LDPC codeword consists of 180 adjacent QC blocks in a long FECBLOCK and 45 adjacent QC blocks in a short FECBLOCK. Each QC block in either a long or short FECBLOCK consists of 360 bits. The parity interleaved LDPC codeword is interleaved by QCB interleaving. The unit of QCB interleaving is a QC block. The QC blocks at the output of parity interleaving are permutated by QCB interleaving as illustrated in FIG. 23, where Ncells=64800/η mod or 16200/η mod according to the FECBLOCK length. The QCB interleaving pattern is unique to each combination of modulation type and LDPC code rate.

After QCB interleaving, inner-group interleaving is performed according to modulation type and order (η mod) which is defined in the below table 32. The number of QC blocks for one inner-group, NQCB_IG, is also defined.

TABLE 32

| Modulation type | $\eta_{mod}$ | $N_{QCB\_IG}$ |
|---|---|---|
| QAM-16 | 4 | 2 |
| NUC-16 | 4 | 4 |
| NUQ-64 | 6 | 3 |
| NUC-64 | 6 | 6 |
| NUQ-256 | 8 | 4 |
| NUC-256 | 8 | 8 |
| NUQ-1024 | 10 | 5 |
| NUC-1024 | 10 | 10 |

The inner-group interleaving process is performed with NQCB_IG QC blocks of the QCB interleaving output. Inner-group interleaving has a process of writing and reading the bits of the inner-group using 360 columns and NQCB_IG rows. In the write operation, the bits from the QCB interleaving output are written row-wise. The read operation is performed column-wise to read out m bits from each row, where m is equal to 1 for NUC and 2 for NUQ.

Figure 24A:
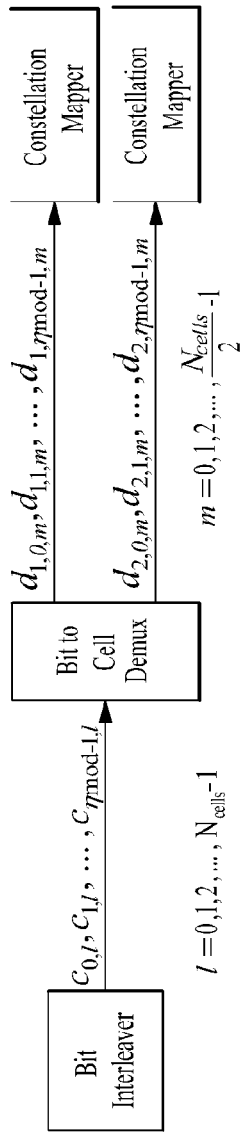
FIGS. 24(a) and 24(b) illustrate a cell-word demultiplexing according to an embodiment of the present invention.
Figure 24B:
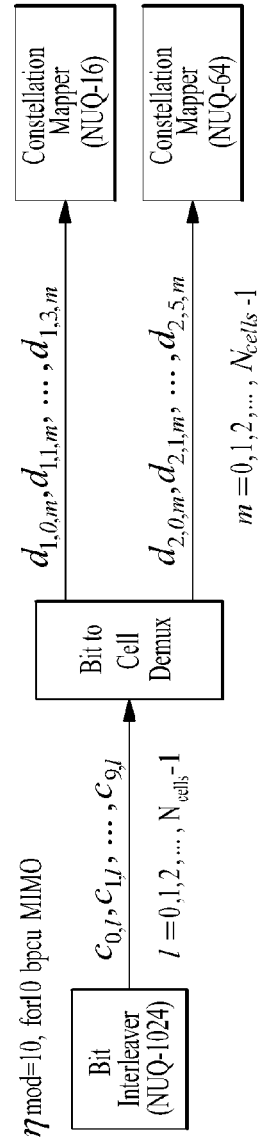

FIG. 24 illustrates a cell-word demultiplexing according to an embodiment of the present invention.

FIG. 24 shows a cell-word demultiplexing for 8 and 12 bpcu MIMO and (b) shows a cell-word demultiplexing for 10 bpcu MIMO.

Each cell word (c0,1, c1,1, . . . , cη mod−1,1) of the bit interleaving output is demultiplexed into (d1,0,m, d1,1,m . . . , d1,η mod−1,m) and (d2,0,m, d2,1,m . . . , d2,η mod−1,m) as shown in (a), which describes the cell-word demultiplexing process for one XFECBLOCK.

For the 10 bpcu MIMO case using different types of NUQ for MIMO encoding, the Bit Interleaver for NUQ-1024 is re-used. Each cell word (c0,1, c1,1, . . . , c9,1) of the Bit Interleaver output is demultiplexed into (d1,0,m, d1,1,m . . . , d1,3,m) and (d2,0,m, d2,1,m . . . , d2,5,m), as shown in (b).

Figure 25A:
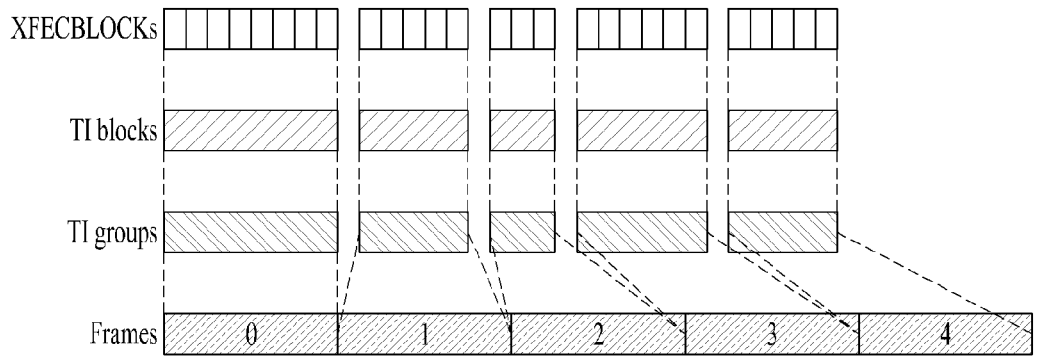
FIGS. 25(a), 25(b) and 25(c) illustrate a time interleaving according to an embodiment of the present invention.
Figure 25B:
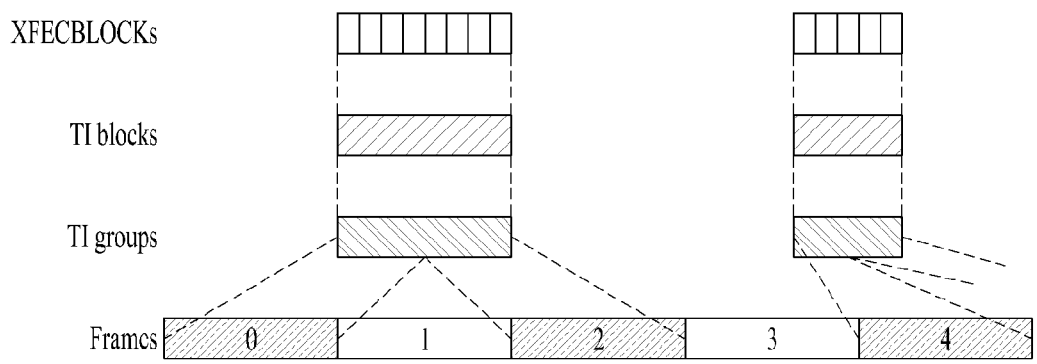
Figure 25C:
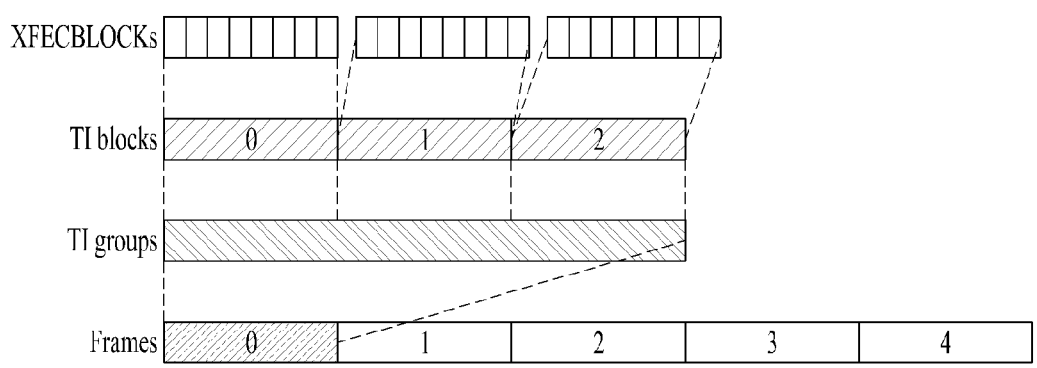

FIG. 25 illustrates a time interleaving according to an embodiment of the present invention.

to (c) show examples of TI mode.

The time interleaver operates at the DP level. The parameters of time interleaving (TI) may be set differently for each DP.

The following parameters, which appear in part of the PLS2-STAT data, configure the TI:

DP_TI_TYPE (allowed values: 0 or 1): Represents the TI mode; '0' indicates the mode with multiple TI blocks (more than one TI block) per TI group. In this case, one TI group is directly mapped to one frame (no inter-frame interleaving). '1' indicates the mode with only one TI block per TI group. In this case, the TI block may be spread over more than one frame (inter-frame interleaving).

DP_TI_LENGTH: If DP_TI_TYPE='0', this parameter is the number of TI blocks NTI per TI group. For DP_TI_TYPE='1', this parameter is the number of frames PI spread from one TI group.

DP_NUM_BLOCK_MAX (allowed values: 0 to 1023): Represents the maximum number of XFECBLOCKs per TI group.

DP_FRAME_INTERVAL (allowed values: 1, 2, 4, 8): Represents the number of the frames IJUMP between two successive frames carrying the same DP of a given PHY profile.

DP_TI_BYPASS (allowed values: 0 or 1): If time interleaving is not used for a DP, this parameter is set to '1'. It is set to '0' if time interleaving is used.

Additionally, the parameter DP_NUM_BLOCK from the PLS2-DYN data is used to represent the number of XFECBLOCKs carried by one TI group of the DP.

When time interleaving is not used for a DP, the following TI group, time interleaving operation, and TI mode are not considered. However, the Delay Compensation block for the dynamic configuration information from the scheduler will still be required. In each DP, the XFECBLOCKs received from the SSD/MIMO encoding are grouped into TI groups. That is, each TI group is a set of an integer number of XFECBLOCKs and will contain a dynamically variable number of XFECBLOCKs. The number of XFECBLOCKs in the TI group of index n is denoted by NxBLOCK_Group(n) and is signaled as DP_NUM_BLOCK in the PLS2-DYN data. Note that NxBLOCK_Group(n) may vary from the minimum value of 0 to the maximum value NxBLOCK_Group_MAX (corresponding to DP_NUM_BLOCK_MAX) of which the largest value is 1023.

Each TI group is either mapped directly onto one frame or spread over PI frames. Each TI group is also divided into more than one TI blocks(NTI), where each TI block corresponds to one usage of time interleaver memory. The TI blocks within the TI group may contain slightly different numbers of XFECBLOCKs. If the TI group is divided into multiple TI blocks, it is directly mapped to only one frame. There are three options for time interleaving (except the extra option of skipping the time interleaving) as shown in the below table 33.

TABLE 33

| Modes | Descriptions |
| --- | --- |
| Option-1 | Each TI group contains one TI block and is mapped directly to one frame as shown in (a). This option is signaled in the PLS2-STAT by DP_TI_TYPE = '0' and DP_TI_LENGTH = '1' ($N_{TI}$ = 1). |
| Option-2 | Each TI group contains one TI block and is mapped to more than one frame. (b) shows an example, where one TI group is mapped to two frames, i.e., DP_TI_LENGTH = '2' ($P_I$ = 2) and DP_FRAME_INTERVAL ($I_{JUMP}$ = 2). This provides greater time diversity for low data-rate services. This option is signaled in the PLS2-STAT by DP_TI_TYPE ='1'. |
| Option-3 | Each TI group is divided into multiple TI blocks and is mapped directly to one frame as shown in (c). Each TI block may use full TI memory, so as to provide the maximum bit-rate for a DP. This option is signaled in the PLS2-STAT signaling by DP_TI_TYPE='0' and DP_TI_LENGTH = $N_{TI}$, while $P_I$ = 1. |

In each DP, the TI memory stores the input XFECBLOCKs (output XFECBLOCKs from the SSD/MIMO encoding block). Assume that input XFECBLOCKs are defined as $$(d_{n,s,0,0}, d_{n,s,0,1}, \ldots, d_{n,s,0,N_{cells}-1}, d_{n,s,1,0}, \ldots, d_{n,s,1,N_{cells}-1}, \ldots,$$
$$d_{n,s,N_{xBLOCK\_TI}(n,s)-1,0}, \ldots, d_{n,s,N_{xBLOCK\_TI}(n,s)-1,N_{cells}-1}),$$

where $d_{n,s,r,q}$ is the qth cell of the rth XFECBLOCK in the sth TI block of the nth TI group and represents the outputs of SSD and MIMO encodings as follows $$d_{n,s,r,q} = \begin{cases} f_{n,s,r,q}, & \text{the output of } SSD \text{ ... encoding} \\ g_{n,s,r,q}, & \text{the output of } MIMO \text{ encoding} \end{cases}.$$

In addition, assume that output XFECBLOCKs from the time interleaver 5050 are defined as $$(h_{n,s,0}, h_{n,s,1}, \ldots, h_{n,s,i}, \ldots, h_{n,s,N_{xBLOCK\_TI}(n,s) \times N_{cells}-1}),$$

where $h_{n,s,i}$ is the ith output cell (for i=0, ..., $N_{xBLOCK\_TI}$(n,s)×$N_{cells}$−1) in the sth TI block of the nth TI group.

Typically, the time interleaver will also act as a buffer for DP data prior to the process of frame building. This is achieved by means of two memory banks for each DP. The first TI-block is written to the first bank. The second TI-block is written to the second bank while the first bank is being read from and so on.

The TI is a twisted row-column block interleaver. For the sth TI block of the nth TI group, the number of rows $N_r$ of a TI memory is equal to the number of cells $N_{cells}$, i.e., $N_r = N_{cells}$ while the number of columns $N_c$ is equal to the number $N_{xBLOCK\_TI}(n,s)$.

Figure 26A:
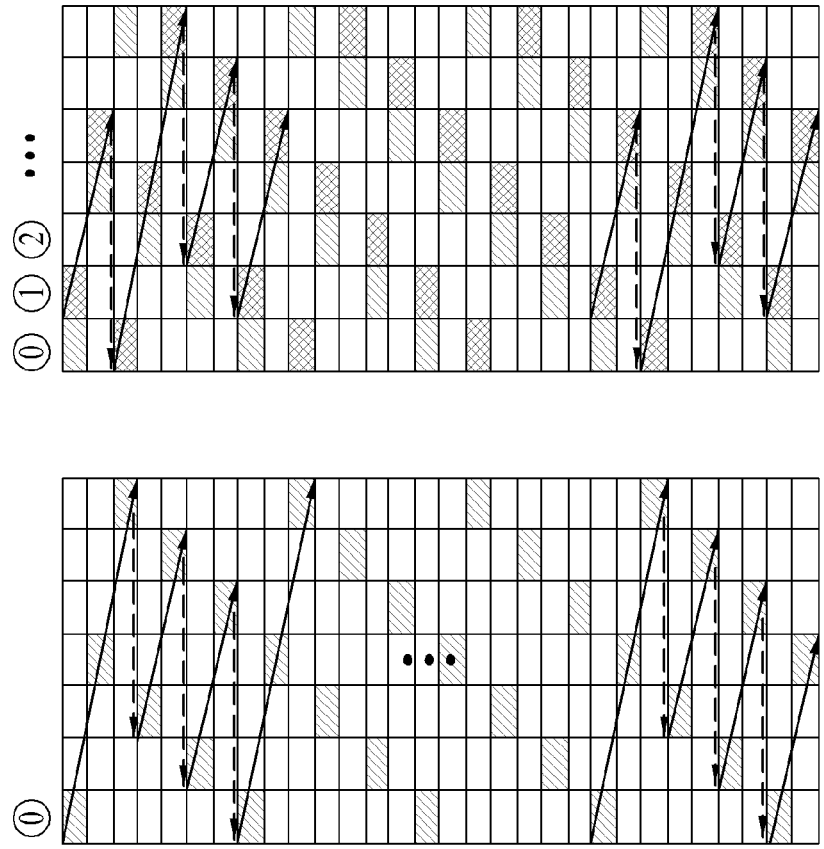
FIGS. 26(a) and 26(b) illustrate the basic operation of a twisted row-column block interleaver according to an embodiment of the present invention.

FIG. 26 illustrates the basic operation of a twisted row-column block interleaver according to an embodiment of the present invention.

Figure 26B:
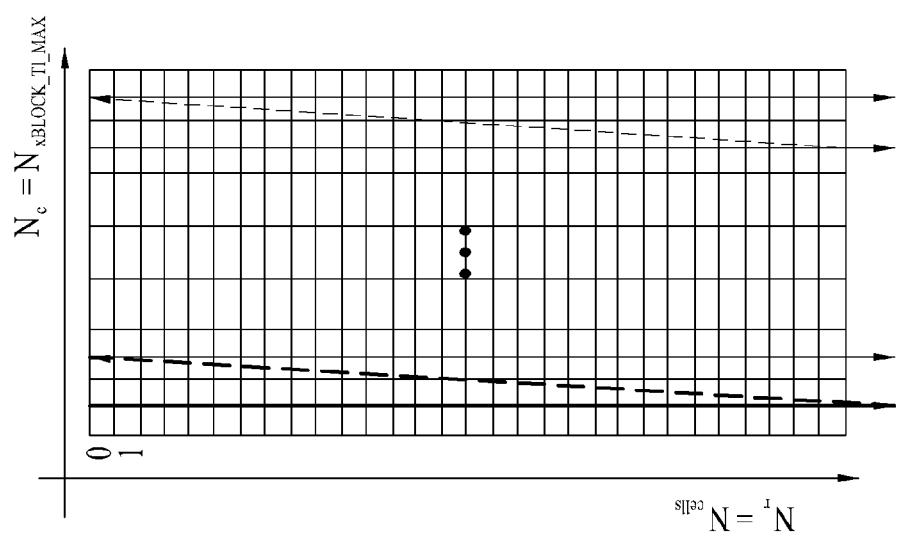

FIG. 26 (a) shows a writing operation in the time interleaver and FIG. 26(b) shows a reading operation in the time interleaver. The first XFECBLOCK is written column-wise into the first column of the TI memory, and the second XFECBLOCK is written into the next column, and so on as shown in (a). Then, in the interleaving array, cells are read out diagonal-wise. During diagonal-wise reading from the first row (rightwards along the row beginning with the left-most column) to the last row, $N_r$ cells are read out as shown in (b). In detail, assuming $z_{n,s,i}$ (i=0, ..., $N_rN_c$) as the TI memory cell position to be read sequentially, the reading process in such an interleaving array is performed by calculating the row index $R_{n,s,i}$, the column index $C_{n,s,i}$, and the associated twisting parameter $T_{n,s,i}$ as follows expression.

$$\text{GENERATE}(R_{n,s,i}, C_{n,s,i}) = \quad \text{[Math FIG. 9]}$$
$$\{$$
$$R_{n,s,i} = \mod(i, N_r),$$
$$T_{n,s,i} = \mod(S_{shift} \times R_{n,s,i}, N_c),$$
$$C_{n,s,i} = \mod\left(T_{n,s,i} + \left\lfloor \frac{i}{N_r} \right\rfloor, N_c\right)$$
$$\}$$

where $S_{shift}$ is a common shift value for the diagonal-wise reading process regardless of $N_{xBLOCK\_TI}(n,s)$, and it is determined by $N_{xBLOCK\_TI\_MAX}$ given in the PLS2-STAT as follows expression.

$$\text{for } \begin{cases} N'_{xBLOCK\_TI\_MAX} = N_{xBLOCK\_TI\_MAX} + 1, & \text{if } N_{xBLOCK\_TI\_MAX} \mod 2 = 0 \\ N'_{xBLOCK\_TI\_MAX} = N_{xBLOCK\_TI\_MAX}, & \text{if } N_{xBLOCK\_TI\_MAX} \mod 2 = 1 \end{cases}, \quad \text{[Math FIG. 10]}$$

$$S_{shift} = \frac{N'_{xBLOCK\_TI\_MAX} - 1}{2}$$

As a result, the cell positions to be read are calculated by a coordinate as $z_{n,s,i} = N_r C_{n,s,i} + R_{n,s,i}$.

Figure 27:
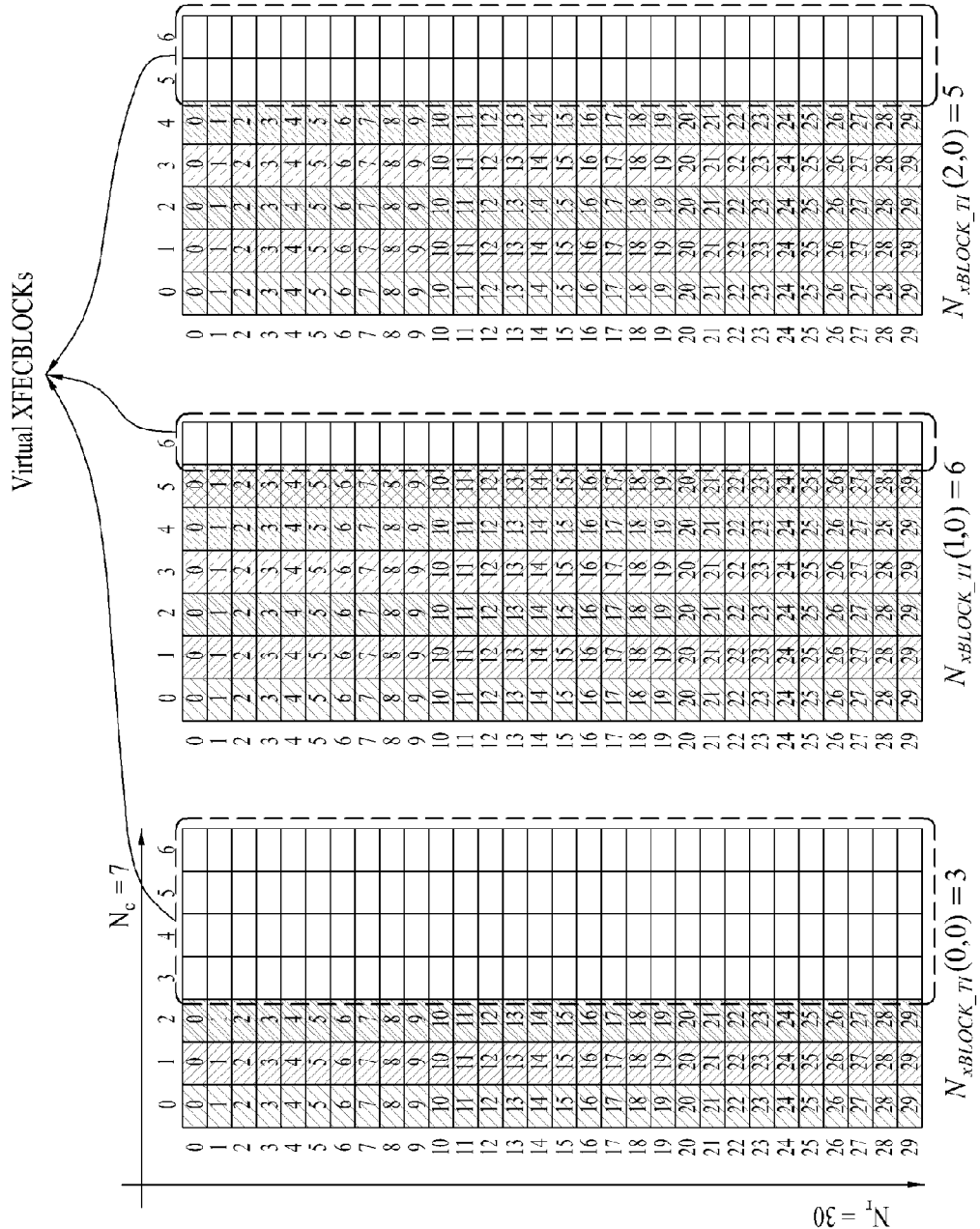
FIG. 27 illustrates an operation of a twisted row-column block interleaver according to another embodiment of the present invention.

FIG. 27 illustrates an operation of a twisted row-column block interleaver according to another embodiment of the present invention.

More specifically, FIG. 27 illustrates the interleaving array in the TI memory for each TI group, including virtual XFECBLOCKs when $N_{xBLOCK\_TI}(0,0)=3$, $N_{xBLOCK\_TI}(1,0)=6$, $N_{xBLOCK\_TI}(2,0)=5$.

The variable number $N_{xBLOCK\_TI}(n,s)=N_r$ will be less than or equal to $N'_{xBLOCK\_TI\_MAX}$. Thus, in order to achieve a single-memory deinterleaving at the receiver side, regardless of $N_{xBLOCK\_TI}(n,s)$, the interleaving array for use in a twisted row-column block interleaver is set to the size of $N_r \times N_c = N_{cells} \times N'_{xBLOCK\_TI\_MAX}$ by inserting the virtual XFECBLOCKs into the TI memory and the reading process is accomplished as follow expression.

$$p=0;$$

$$\text{for } i=0; i<N_{cells}N'_{xBLOCK\_TI\_MAX}; i=i+1$$

$$\{\text{GENERATE}(R_{n,s,i}, C_{n,s,i});$$

$$V_i = N_r C_{n,s,i} + R_{n,s,i}$$

$$\text{if } V_i < N_{cells} N_{xBLOCK\_TI}(n,s)$$

$$\{$$

$$Z_{n,s,p} = V_i; p = p+1;$$

$$\}$$

$$\} \quad \text{[Math figure 11]}$$

The number of TI groups is set to 3. The option of time interleaver is signaled in the PLS2-STAT data by DP_TI_TYPE='0', DP_FRAME_INTERVAL='1', and DP_TI_LENGTH='1', IJUMP=1, and PI=1. The number of XFECBLOCKs, each of which has Ncells=30 cells, per TI group is signaled in the PLS2-DYN data by NxBLOCK_TI(0,0)=3, NxBLOCK_TI(1,0)=6, and NxBLOCK_TI(2,0)=5, respectively. The maximum number of XFECBLOCK is signaled in the PLS2-STAT data by NxBLOCK_Group_MAX, which leads to $\lfloor N_{xBLOCK\_Group\_MAX}/N_{TI}\rfloor = N_{xBLOCK\_TI\_MAX}=6$.

Figure 28:
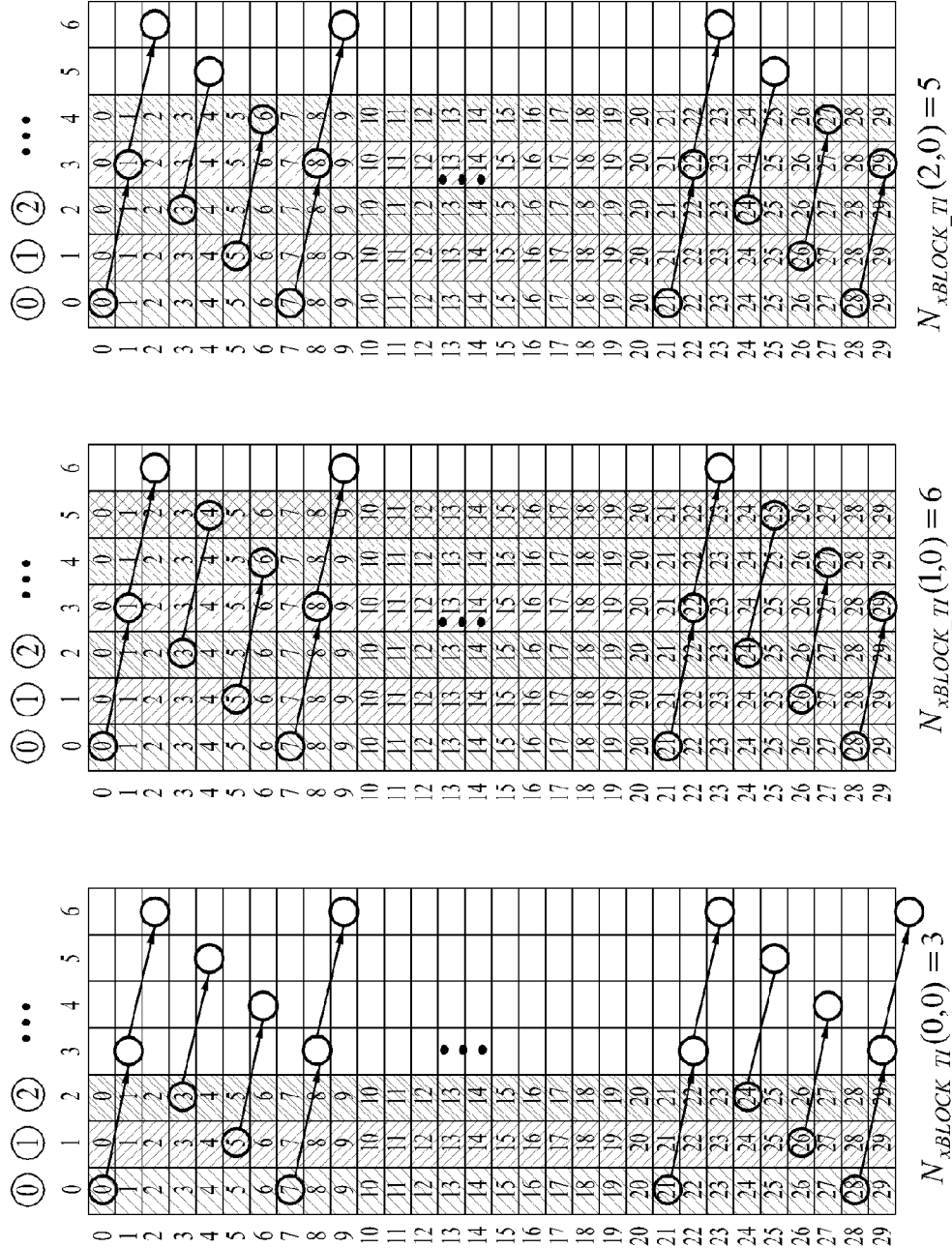
FIG. 28 illustrates a diagonal-wise reading pattern of a twisted row-column block interleaver according to an embodiment of the present invention.

FIG. 28 illustrates a diagonal-wise reading pattern of a twisted row-column block interleaver according to an embodiment of the present invention.

More specifically FIG. 28 shows a diagonal-wise reading pattern from each interleaving array with parameters of $N'_{xBLOCK\_TI\_MAX}=7$ and Sshift=(7−1)/2=3. Note that in the reading process shown as pseudocode above, if $V_i \geq N_{cells} N_{xBLOCK\_TI}(n,s)$, the value of Vi is skipped and the next calculated value of Vi is used.

Figure 29:
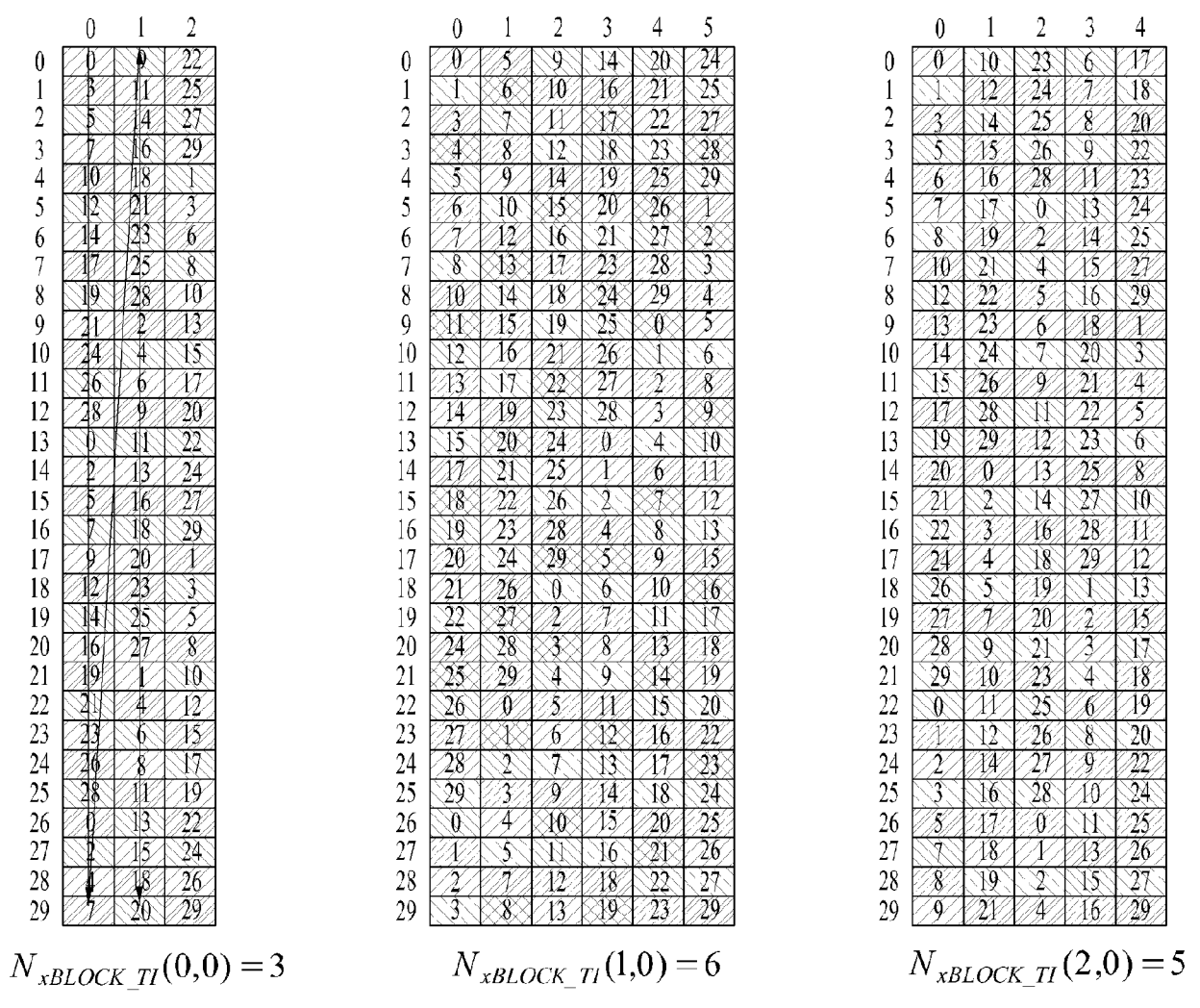

FIG. 29 illustrates interleaved XFECBLOCKs from each interleaving array according to an embodiment of the present invention.

FIG. 29 illustrates the interleaved XFECBLOCKs from each interleaving array with parameters of $N'_{xBLOCK\_TI\_MAX}=7$ and Sshift=3.

A description will be given of a method by which a broadcast signal transmitter protects PLS data by encoding the same according to an embodiment of the present invention. The PLS provides the receiver with a means to access physical layer DPs. The PLS data consists of PLS1 data and PLS2 data.

PLS1 data provides basic transmission parameters including parameters required to enable the reception and decoding of the PLS2. PLS1 fields remain unchanged for the entire duration of one frame-group.

The PLS2 contains parameters that provide sufficient information for the receiver to decode the desired DP. The PLS2 signaling further consists of two types of parameters, PLS2-STAT and PLS2-DYN. The PLS2-STAT parameters are the same within a frame-group, while the PLS2-DYN parameters provide information that is specific for the current frame. The values of the PLS2-DYN parameters may change during the duration of one frame-group, while the size of fields remains constant.

The PLS1 and the static part of the PLS2 can be changed only on the border of two super-frames. In the in-band signaling, there is a counter indicating the next super-frame with changes in PLS1 or the static part of the PLS2 parameters. The receiver can locate the change boundary by checking the new PLS parameters from the FSS(s) in the first frame of the announced super-frame, where the indicated change applies.

Figure 30:
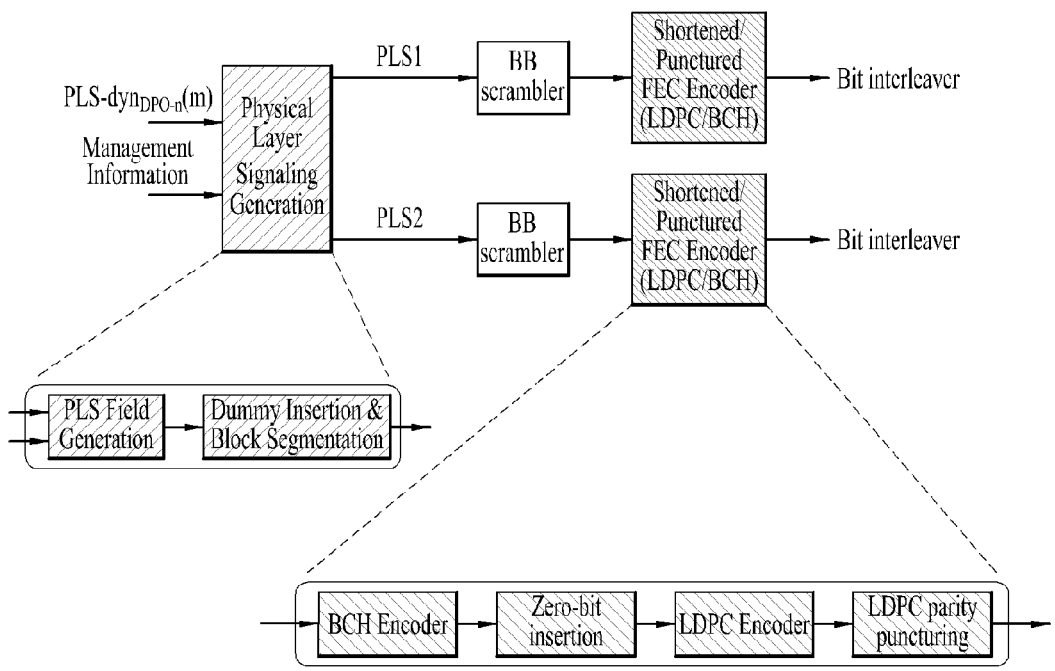
FIG. 30 is a block diagram showing a PLS data protection procedure according to one embodiment of the present invention.

FIG. 30 is a block diagram showing a PLS data protection procedure according to one embodiment of the present invention.

Specifically, FIG. 30 is a detailed block diagram of a physical layer signaling generation block and a shortened/punctured FEC encoder (LDPC/BCH) of the broadcast signal transmitter according to one embodiment of the present invention.

As shown in FIG. 30, the broadcast signal transmitter may include the physical layer signaling generation block, a BB scrambler, and the shortened/punctured FEC encoder (LDPC/BCH) for the PLS data protection procedure according to one embodiment. The physical layer signaling generation block may be called a signaling generation block. The BB scrambler may be called a scrambler or a PLS scrambler. The operation of each block will now be described.

The signaling generation block may include a PLS field generation block and a dummy insertion & block segmentation block.

The signaling generation block creates physical layer signaling information used for the operation of each functional block. This signaling information is also transmitted so that the services of interest are properly recovered at the receiver side.

The PLS generation block may generate PLS1 data and PLS2 data on the basis of management information and PLS-$dyn_{DP0-n}(m)$ input from the scheduler and output the generated PLS1 data and PLS2 data. PLS-$dyn_{DP0-n}(m)$ is PLS2-dyn data including information which indicates DP included in frame m. The dummy insertion & block segmentation block may insert dummy data (or padding bits) into PLS data and segment the PLS data into units for LDPC encoding. In this case, the PLS data segmented into units for LDPC encoding may be called $K_{sig}$. In addition, each segmented PLS data input to the LDPC encoder may be called an information block. The dummy insertion & block segmentation block may not segment the PLS1 data.

The PLS1 data and PLS2 data output from the PLS generation block may be independently processed.

The operation of each block may be performed on each of the PLS1 data and PLS2 data. In the following description, PLS data can be considered to include the PLS1 data or PLS2 data.

The BB scrambler block may scramble the PLS data input thereto and output the scrambled data. The PLS data are scrambled (randomized) for energy dispersal.

Subsequently, the shortened/punctured FEC encoder may encode the scrambled PLS data input thereto.

The shortened/punctured FEC encoder may output shortened and punctured LDPC encoded PLS data. The LDPC encoded PLS data output from the shortened/punctured FEC encoder is input to a bit interleaver. The bit interleaver may interleave bits of the shortened and punctured LDPC encoded PLS data input thereto.

As shown in FIG. 30, the shortened/punctured FEC encoder (LDPC/BCH) according to one embodiment of the present invention may include a BCH encoder, a zero-bit insertion block, an LDPC encoder and an LDPC parity puncturing block. A detailed description will be given of operations of the blocks of the shortened/punctured FEC encoder (LDPC/BCH).

The BCH encoder may BCH-encode the PLS data input thereto. After the BCH encoding, the zero-bit insertion block inserts zero bits prior to the bit BCH output to generate LDPC encoding input. The LDPC encoding input according to one embodiment may maintain a specific length according to the zero bits inserted by the zero-bit insertion block.

In this case, the size of the zero bits inserted into the PLS data may be determined on the basis of Table 4. Specifically, the size of the zero bits inserted into the PLS data may be determined as $(K_{bch}-K_{sig})$. $K_{sig}$ of PLS2 data may have a variable value distinguished from $K_{sig}$ of PLS1 data. Accordingly, the size of the zero bits inserted into PLS2 data may be changed according to $K_{sig}$ and $K_{bch}$.

The LDPC encoder may permute PLS1 data input from the BCH encoder. In this case, permutation may be performed based on shortening order or a permutation pattern. Permutation may be performed in the unit of 90 bits.

The LDPC encoder may perform column permutation of an H matrix on PLS2 data input from the BCH encoder after LDPC encoding so as to secure shortening performance. The broadcast signal transmitter and broadcast signal receiver according to one embodiment of the present invention can reduce complexity when encoding and decoding the permutated PLS data. The H matrix may be called a parity check matrix.

The LDPC encoder may LDPC-encode the permutated PLS1 data. In addition, the LDPC encoder may LDPC-encode the PLS2 data. The LDPC encoder may output the LDPC-encoded PLS data in the form of an H matrix. The H matrix output from the LDPC encoding block is sequential and a parity part is dual diagonal. According to this structure of the H matrix, the broadcast signal receiver can rapidly decode the PLS data.

The LDPC encoding block according to one embodiment of the present invention may output the H matrix by using a 4K-1/4 LDPC code in the case of PLS1 data and using a 4K-1/4 or 7K-3/10 LDPC code in the case of PLS2 data.

Subsequently, the LDPC parity puncturing block may puncture some of LDPC parity bits of LDPC encoded bits of PLS data. Then, the LDPC parity puncturing block may remove the zero bits, which have been inserted after BCH encoding, and output encoded PLS data. The LDPC parity puncturing block according to one embodiment may output encoded PLS data of a specific code rate by controlling puncturing bits and removed zero bits.

$K_{sig}$ is the size of scrambled PLS data output from the BB scrambler block. Kbch is determined as 1020 or 2100 depending on Ksig (refer to Table 4).

Figure 31:
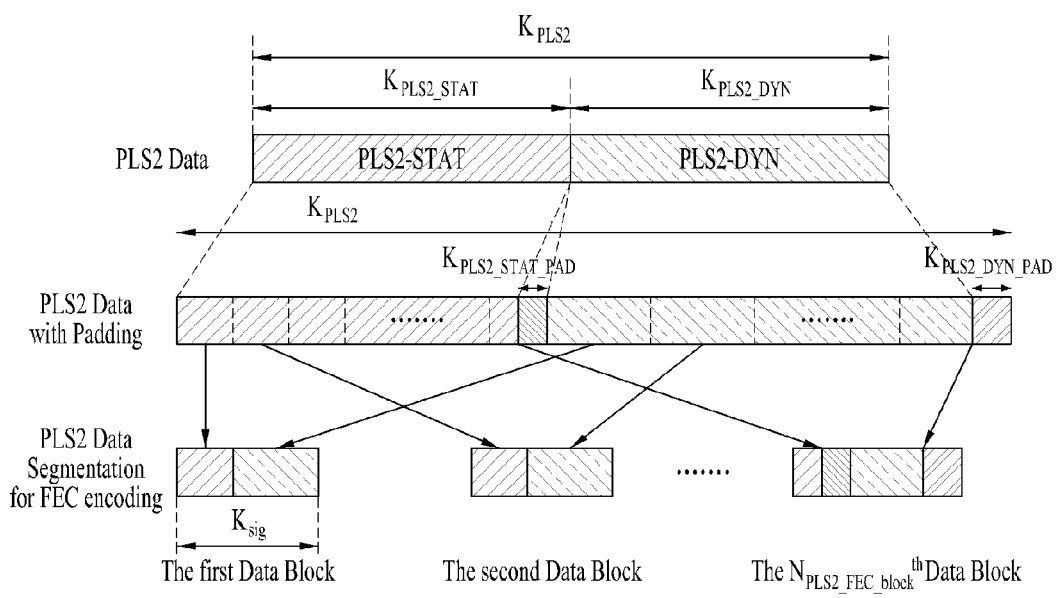
FIG. 31 illustrates a structure of PLS2 data corresponding to the operation of the physical layer signaling generation block according to one embodiment of the present invention.

FIG. 31 illustrates a structure of PLS2 data corresponding to the operation of the physical layer signaling generation block according to one embodiment of the present invention.

Specifically, FIG. 31 illustrates a structure of PLS2 data corresponding to the operation of the dummy insertion & block segmentation block of the physical layer signaling generation block.

As described above, PLS2 data includes PLS2-STAT and PLS2-DYN. In FIG. 31, the length of PLS2 data is indicated by $K_{PLS2}$, the length of PLS2-STAT is indicated by $K_{PLS2\_STAT}$, and the length of PLS2-DYN is indicated by $K_{PLS2\_DYN}$.

As described above, the dummy insertion & block segmentation block may insert dummy data (or padding bits) into PLS2 data. Specifically, the dummy insertion & block segmentation block may respectively insert the dummy data corresponding to $K_{PLS2\_STAT\_PAD}$ and $K_{PLS2\_DYN\_PAD}$ after PLS2-STAT and PLS2-DYN.

The length of PLS2 data may be different in different frame-groups. The data is segmented and transmitted over one or multiple LDPC coded blocks depending on the amount of PLS2 data. The parity bits of the LDPC codeword are appended to the signaling data. The LDPC code used is one of two LDPC codes depending on the length of $K_{sig}$ as described by Table 4. The number of LDPC codewords for PLS2 signaling, $N_{PLS2\_FEC\_block}$, is determined as follows:

$$N_{PLS2\_FEC\_block\_temp} = \left\lceil \frac{K_{PLS2\_STAT} + K_{PLS2\_DYN}}{K_{bch}} \right\rceil$$

$$N_{PLS2\_total\_temp} = \left\lceil \frac{K_{PLS2\_STAT}}{\eta_{MOD} \times N_{PLS2\_FEC\_block\_temp}} \right\rceil \times \eta_{MOD} + \left\lceil \frac{K_{PLS2\_DYN}}{N_{PLS2\_FEC\_block\_temp}} \right\rceil$$

$$N_{PLS2\_FEC\_block} = \begin{cases} N_{PLS2\_FEC\_block\_temp} + 1 & \text{if } K_{PLS2\_total\_temp} \geq K_{bch} \\ N_{PLS2\_FEC\_block\_temp} & \text{otherwise} \end{cases},$$

where $K_{bch}$ is 2100, $\eta_{MOD}$ is modulation order defined in Table 4, the length of $K_{PLS2\_STAT}$ and $K_{PLS2\_DYN}$ is defined as PLS2_STAT_SIZE_BIT and PLS2_DYN_SIZE_BIT in the PLS1 field.

$$K_{PLS2\_STAT\_MOD\_temp} = \left\lceil \frac{K_{PLS2\_STAT}}{\eta_{MOD}} \right\rceil$$

$$N_{PLS2\_STAT\_block} = \left\lceil \frac{K_{PLS2\_STAT\_MOD\_temp}}{N_{PLS2\_FEC\_block}} \right\rceil \times \eta_{MOD}$$

$$N_{PLS2\_DYN\_block} = \left\lceil \frac{K_{PLS2\_DYN}}{N_{PLS2\_FEC\_block}} \right\rceil$$

$$K_{PLS2\_STAT\_PAD} K_{PLS2\_STAT\_block} \times N_{PLS2\_FEC\_block} - K_{PLS2\_STAT}$$

$$K_{PLS2\_DYN\_PAD} = K_{PLS2\_DYN\_block} \times N_{PLS2\_FEC\_block} - K_{PLS2\_DYN}$$

The $K_{PLS2\_STAT\_PAD}$ and $K_{PLS2\_DYN\_PAD}$ denote the length of PLS2_STAT padding bits and PLS2_DYN padding bits, respectively.

The final length of PLS2 including the padding, $K_{PLS2}$, is calculated as follows:

$$K_{PLS2} = K_{PLS2\_STAT} + K_{PLS2\_DYN} + K_{PLS2\_STAT\_PAD} + K_{PLS2\_DYN\_PAD}$$

The number of information bits $K_{sig}$ in each $N_{PLS2\_FEC\_block}$ block is defined as:

$$K_{sig} = \frac{K_{PLS2}}{N_{PLS2\_FEC\_block}}$$

Each part of the PLS2 signaling is segmented into $N_{PLS2\_FEC\_block}$ segments spread uniformly across all the $N_{PLS2\_FEC\_block}$ blocks, as illustrated in FIG. 31. This operation guarantees uniform protection for all coded bocks.

Each segment except the last segment, $N_{PLS2\_FEC\_block}{}^{th}$, has the same configuration, with sequentially selected bits in increasing segment order, m=1, 2, . . . , $N_{PLS2\_FEC\_block}$−1.

While the last segment, $N_{PLS2\_FEC\_block}{}^{th}$, has Ksig like other segments, the last segment may include not only PLS2-STAT and PLS2-DYN but also PLS2_STAT_PAD and PLS2_DYN_PAD which are padding data.

From the first to the next-to-last segmentation, the $m^{th}$ segment consists of the following two parts:

The first part contains the portion of PLS2 static information, with indices from $\{(m-1) \times K_{PLS2\_STAT\_block}+1\}$ to $\{m \times K_{PLS2\_STAT\_block}\}$.

The second part contains the portion of PLS2 dynamic information, with indices from $\{(m-1) \times K_{PLS2\_DYN\_block}+1\}$ to $\{m \times K_{PLS2\_DYN\_block}\}$.

The last segmentation consists of the following two parts:

The first part contains the remaining portion of PLS2 static information, with indices from $\{(N_{PLS2\_FEC\_block}-1) \times K_{PLS2\_STAT\_block}+1\}$ to $\{K_{PLS2\_STAT}\}$, followed by the padding bits of PLS2 static information, $K_{PLS2\_STAT\_PAD}$.

The second part contains the remaining portion of PLS2 dynamic information, with indices from $\{(N_{PLS2\_FEC\_block}-1) \times K_{PLS2\_DYN\_block}+1\}$ to $\{K_{PLS2\_DYN}\}$ followed by the padding bits of PLS2 dynamic information, $K_{PLS2\_DYN\_PAD}$.

Figure 32:
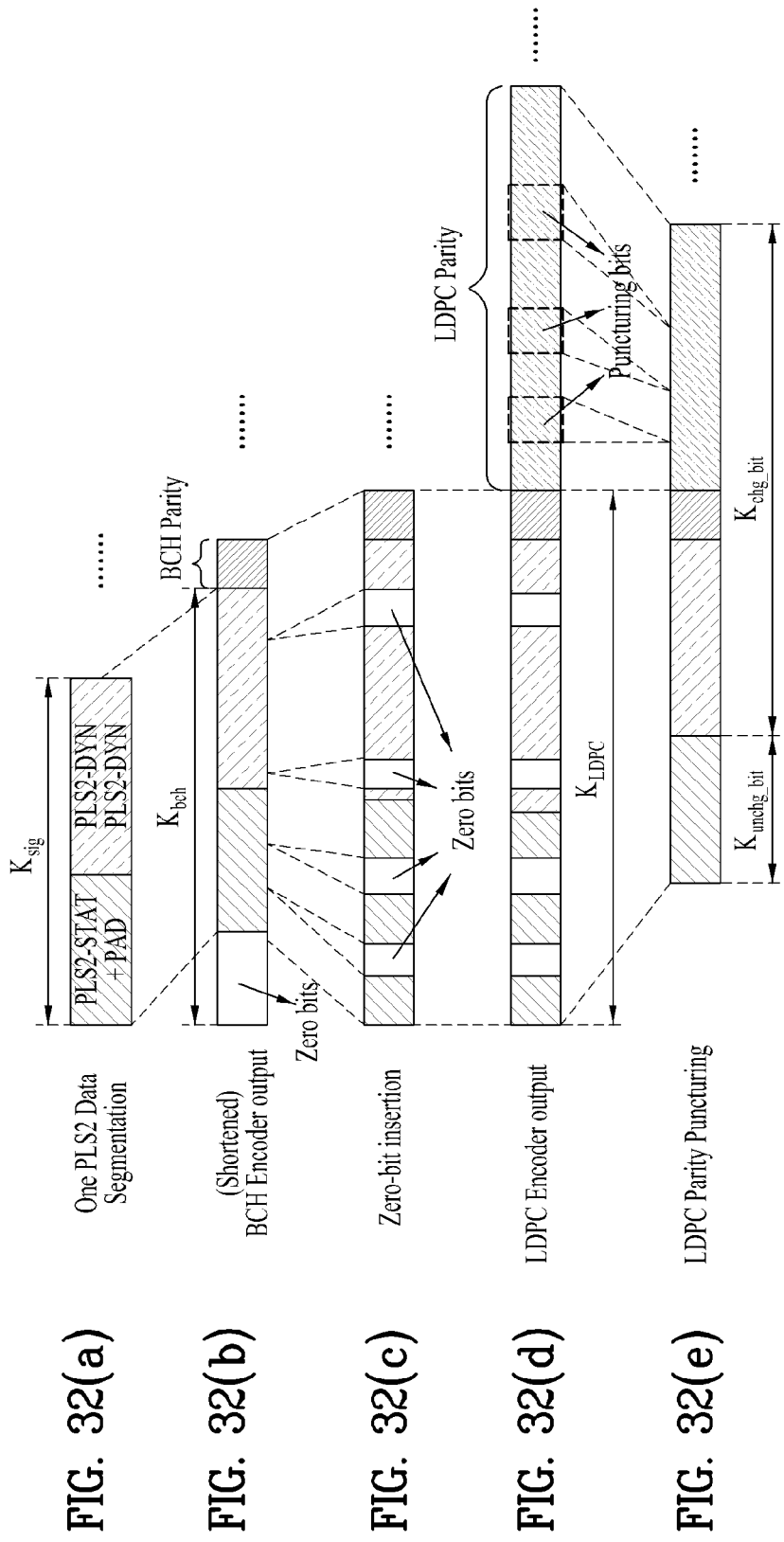
FIGS. 32(a), 32(b), 32(c), 32(d) and 32(e) illustrate a PLS data structure corresponding to the operation of the shortened/punctured FEC encoder (LDPC/BCH).

FIG. 32 illustrates a PLS data structure corresponding to the operation of the shortened/punctured FEC encoder (LDPC/BCH).

Specifically, FIG. 32 shows a PLS data structure corresponding to the operation of FEC-encoding each PLS data information block output from the physical layer signaling generation block according to one embodiment of the present invention.

FIG. 32(a) illustrates PLS2 data segmentation. As described above, the size of one PLS2 data segmentation is Ksig and one PLS2 data segmentation may include PLS2-STAT and PLS2-DYN. The last PLS2 data segmentation may include PLS2_STAT_PAD and PLS2_DYN_PAD, which are padding data, as well as PLS2-STAT and PLS2-DYN.

FIG. 32(b) illustrates (shortened) BCH encoder output. The BCH encoder may add BCH parity bits to PLS2 data segmentation input thereto. Since PLS2 data has a variable size, the zero-bit insertion block according to one embodiment of the present invention may insert zero bits corresponding to a difference between Kbch and Ksig.

FIG. 32(c) illustrates PLS2 data segmentation into which the zero bits have been inserted. The zero-bit insertion block may insert zero bits into PLS2 data segmentation. In this case, zero bit insertion positions may be determined on the basis of a specific shortening order or permutation pattern.

FIG. 32(d) illustrates a structure of LDPC encoded PLS2 data segmentation output from the LDPC encoder. The LDPC encoder may add LDPC parity bits to Kldpc. Kldpc denotes the size of PLS2 data segmentation input to the LDPC encoder.

FIG. 32(e) illustrates a structure of PLS2 data segmentation for which LDPC parity puncturing has been performed. The LDPC parity puncturing block may puncture some LDPC parity bits. Then, the LDPC parity puncturing block may remove the inserted zero bits. In this case, the LDPC parity puncturing block may perform puncturing on the basis of permutation order of parity group to be punctured.

The broadcast signal transmitter according to one embodiment of the present invention may change the positions and order of zero-padding bits and puncturing parity bits in order to secure error correction capabilities of a predetermined level or more.

As described above, the FEC encoder according to one embodiment may perform zero padding on PLS data, attach parity bits to the back of the zero-padded block, perform LDPC encoding on the zero-padded block with the parity bits attached thereto and puncture the parity bits so as to output an FEC block. The FEC block may include unchg_bit and chg_bit as shown in the figure. unchg_bit may include PLS2-DYN which is not changed in a frame group and chg_bit may include PLS2-DYN, BCH parity bits and LDPC parity bits, which are changed per frame. $K_{unchg\_bit}$ denotes the size of unchg_bit and $K_{chg\_bit}$ denotes the size of chg_bit.

A description will be given of operations of the respective blocks according to PLS2 data segmentation structure.

The BCH encoder may encode input PLS data. After BCH encoding, the zero-bit insertion block inserts zero bits prior to the bit BCH output to generate LDPC encoding input. The input of the LDPC encoder according to one embodiment may maintain a specific length according to zero bits inserted by the zero-bit insertion block.

In this case, the size of zero bits inserted into the PLS data may be determined on the basis of Table 4. Specifically, the size of the zero bits inserted into the PLS data may be determined as Kbch−Ksig. Ksig of PLS2 data may have a variable value, distinguished from Ksig of PLS1 data. Accordingly, the size and position of the zero bits inserted into PLS2 data may depend on Ksig and Kbch.

The LDPC encoding block according to one embodiment of the present invention may output an H matrix using a 4K-1/4 LDPC code in the case of PLS1 data and using a 4K-1/4 or 7K-3/10 LDPC code in the case of PLS2 data.

Subsequently, the parity puncturing block may puncture some LDPC parity bits from among LDPC encoded bits of PLS data and remove the zero bits inserted after BCH encoding so as to output encoded PLS data. The parity puncturing removal inserted-zeros block according to one embodiment of the present invention may control puncturing bits and removed zero bits to output encoded PLS data of a specific code rate.

While FIG. 32 shows that the broadcast signal transmitter according to one embodiment of the present invention encodes PLS-post data, the PLS-post data encoding operation is exemplary and the broadcast signal transmitter may encode PLS1 data in the same manner.

The operation of each block described in FIG. 32 is same with above described the operation of each block in FIG. 30.

Figure 33:
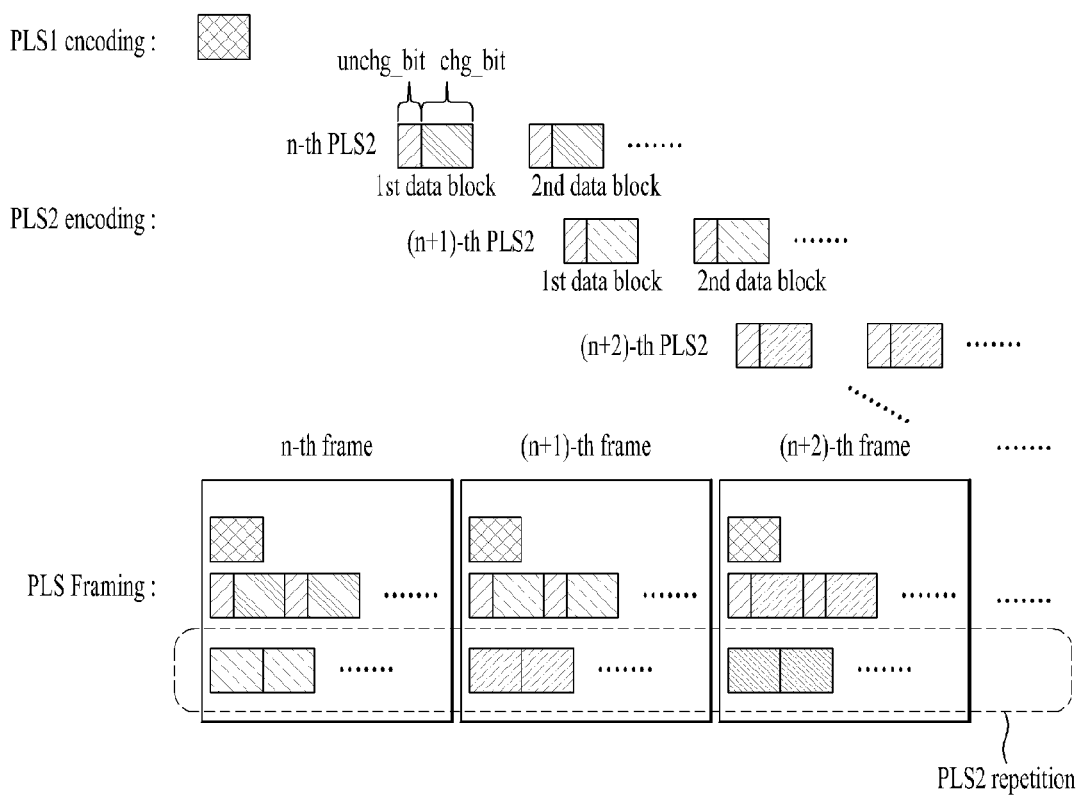
FIG. 33 illustrates a process of arranging encoded PLS data in signal frames according to PLS repetition.

FIG. 33 illustrates a process of arranging encoded PLS data in signal frames according to PLS repetition.

As described above, the encoded PLS data output from the FEC encoder may be arranged in signal frames. Signal frames belonging to the same frame group may include the same PLS1 data since encoded PLS1 data is not changed in a frame group.

Encoded PLS2 data for each signal frame may include unchg_bit and chg_bit, as shown in FIG. 32. That is, n-th PLS2 is PLS2 data for an n-th frame, (n+1)-th PLS2 is PLS2 data for an (n+1)-th frame, and (n+2)-th PLS2 is PLS2 data for an (n+2)-th frame. Each piece of PLS2 data may include a plurality of FEE encoded PLS2 segmentations. In this case, the n-th frame, (n+1)-th frame and (n+2)-th frame may include the same unchg_bit.

PLS repetition is a method of arranging, in a signal frame, encoded PLS2 data for the next signal frame in addition to encoded PLS data for the current signal frame. That is, the broadcast signal transmitter according to one embodiment of the present invention may arrange n-th PLS2 and (n+1)-th PLS2 in the n-th frame. In this case, unchg_bit of n-th PLS2 and (n+1)-th PLS2 may not be repeatedly arranged, and chg_bit of (n+1)-th PLS2 may be arranged in the n-th frame. PLS repetition may be called PLS2 repetition.

The broadcast signal transmitter according to one embodiment of the present invention may sequentially arrange chg_bits of PLS1, n-th PLS2 and (n+1)-th PLS2 in the current signal frame.

Upon reception of signal frames in which PLS data is arranged according to PLS2 repetition, the broadcast signal receiver can improve reception performance by acquiring PLS2 data of the next frame ((n+1)-th frame) from the current frame (n-th frame).

Figure 34:
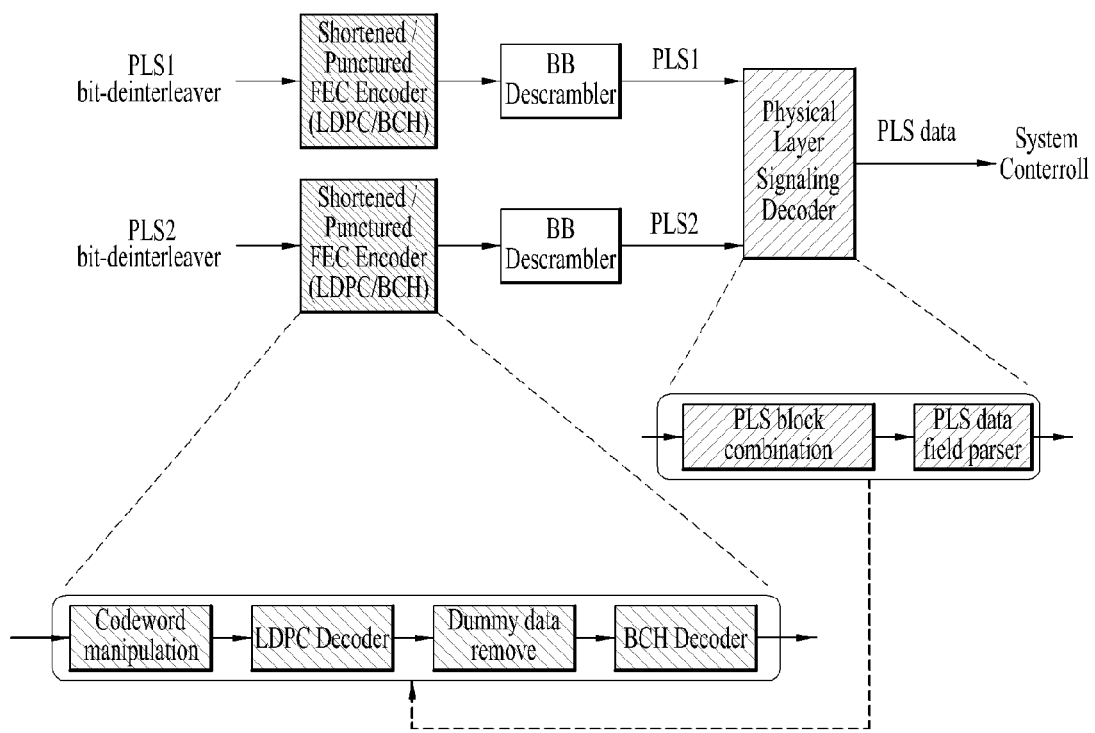
FIG. 34 is a block diagram showing PLS data decoding operation of the broadcast signal receiver according to one embodiment of the present invention.

FIG. 34 is a block diagram showing PLS data decoding operation of the broadcast signal receiver according to one embodiment of the present invention.

Blocks of the broadcast signal receiver shown in FIG. 34 may perform a reverse of the PLS data protection process of the broadcast signal transmitter, described above with reference to FIGS. 30 to 33.

Blocks for performing PLS data decoding according to one embodiment of the present invention may include a shortened/punctured FEC decoder (LDPC/BCH), a BB descrambler and a physical layer signaling decoder. The shortened/punctured FEC decoder (LDPC/BCH) may include a codeword manipulation block, an LDPC decoder, a dummy data remove block, and a BCH decoder.

The physical layer signaling decoder may include a PLS block combination block and a PLS data field parser.

The broadcast signal receiver according to one embodiment of the present invention may independently process PLS1 data and PLS2 data.

A description will be given of operation of the respective blocks.

The codeword manipulation block may combine the same data from among input bit-deinterleaved PLS data. PLS2-STAT in PLS2 repetition mode and PLS1 data may be repeatedly transmitted in two or more signal frames. Accordingly, the codeword manipulation block may combine repeatedly transmitted PLS data and output the connected data. In the case of PLS1 data, the codeword manipulation block may combine the PLS1 data with equal gain. In addition, the codeword manipulation block may combine the PLS1 data at a maximum ratio on the basis of an estimate PLS1 data transport channel.

In the case of PLS2-STAT, the codeword manipulation block may combine the PLS2-STAT with an equal gain or combine the PLS2-STAT at a maximum ratio on the basis of an estimated PLS1 data transport channel.

The codeword manipulation block may receive information about an error in decoded PLS data from the physical layer signaling decoder. When the decoded PLS data has no error, the broadcast signal receiver may use the decoded PLS data as known data. Specifically, the physical layer signaling decoder of the broadcast signal receiver according to one embodiment of the present invention may send, to the shortened/punctured FEC decoder (LDPC/BCH) (or codeword manipulation block), information used to determine whether PLS2 data has an error. As described above, PLS1 data may include information by which whether PLS2 data has an error can be determined and information used to decode PLS2. Specifically, PLS1 data may include the size of PLS2 data which is not changed in a frame group and the size of PLS2 data changed in the frame group as the information by which whether PLS2 data has an error can be determined. In this case, the information included in PLS1 data corresponds to PLS2_STAT_SIZE_BIT and PLS2_DYN_SIZE_BIT described above with reference to FIG. 13. The shortened/punctured FEC decoder (LDPC/BCH), which processes PLS2, may determine whether FEC-decoded PLS2 data has an error on the basis of PLS2_STAT_SIZE_BIT and PLS2_DYN_SIZE_BIT.

Upon determining that the FEC-decoded PLS2-STAT data has no error, the codeword manipulation block may determine the FEC-decoded PLS2-STAT data as known data.

The LDPC decoder may LDPC-decode PLS data. In addition, the LDPC decoder according to one embodiment of the present invention may control LLR on the basis of the known data (the aforementioned decoded PLS data). Accordingly, performance of the LDPC decoder according to one embodiment of the present invention can be improved in proportion to the quantity of known data.

Subsequently, the dummy data remove block may remove dummy data that has been inserted for LDPC decoding. The BCH decoder may BCH-decode the PLS data from which the dummy data has been removed.

Then, the BB descrambler may descramble the BCH-decoded PLS data. This operation may correspond to a reverse of the operation of the BB scrambler of the broadcast signal transmitter.

The PLS block combination block may rearrange data segmented for FEC encoding and decoding so as to output one piece of PLS1 or PLS2 data. That is, the PLS block combination block may perform a reverse of the operation of the dummy insertion & block segmentation block, which is described above with reference to FIGS. 30 and 31, to output one piece of PLS1 or PLS2.

The PLS data field parser may extract signaling fields of PLS1/2 described above with reference to FIGS. 13 and 14.

The signaling fields of PLS1/2 may include transmission parameters and higher layer information inserted by the broadcast signal transmitter. The extracted signaling fields of PLS1/2 may be sent to a system controller. The system controller may correspond to the frame parsing module 9010, demapping & decoding module 9020 and output processor 9030, which are described above with reference to FIG. 9.

The above-described blocks may be omitted or replaced by blocks having similar or identical functions.

Hereinafter, a scheme of protecting PLS data according to an embodiment of the present invention is described. Specifically, a broadcast signal transmission apparatus according to an embodiment of the present invention may encode and protect PLS data. As described above with reference to FIG. 2, the PLS data may include PLS1 data and PLS2 data. The PLS2 data may include PLS2 static data and PLS2 dynamic data.

In this specification, the PLS2 data may be referred to as PLS-post data, the PLS2 static data may be referred to as PLS-post-STAT data, and the PLS2 dynamic data may be referred to as PLS-post-DYN data.

As described in the foregoing, each frame included in a frame group may include the PLS data.

The PLS2-STAT parameters are the same within a frame group, while the PLS2-DYN parameters provide information that is specific to the current frame. The values of the PLS2-DYN parameters may change during the duration of one frame group, while the field size remains constant.

The broadcast signal transmission apparatus according to the present embodiment may encode the PLS data having a variable length in code having a constant length (or size). In this case, latency and complexity occurring in a decoding process of a broadcast signal reception apparatus may decrease when compared to an existing decoding scheme.

Hereinafter, a PLS data encoding scheme according to an embodiment of the present invention may be applied to both the PLS1 data and the PLS2 data, and be applied to either the PLS1 data or the PLS2 data. This may be changed according to intent of a designer.

FIG. 35 illustrates an operation of encoding PLS data by the broadcast signal transmission apparatus according to the present embodiment.

The broadcast signal transmission apparatus according to the present embodiment may divide PLS data having a variable length into at least one block, and encode each block in a codeword having a constant size. As described in the foregoing, since the PLS data has a variable size, the broadcast signal transmission apparatus according to the present embodiment may add dummy data to the PLS data to generate a payload for performing encoding.

FIG. 35(*a*) illustrates a single PLS-post payload having a data length of L. The PLS-post payload includes PLS-post-STAT data and PLS-post-DYN data as described in the foregoing, and may additionally include dummy data. The dummy data may be inserted into the rear of the PLS-post-STAT data and the rear of the PLS-post-DYN data.

FIG. 35(*b*) illustrates that the single PLS-post payload is divided into M blocks. The broadcast signal reception apparatus may divide the PLS-post payload into the M blocks to encode the PLS-post payload in a codeword having a constant size N. In this instance, each separated block has a size X equal to L/M, and each separated block may include the PLS-post-STAT data and the PLS-post-DYN data.

In this instance, divided PLS-post-STAT data in the respective blocks may have the same size. Therefore, PLS-post-STAT data having the same size within the same frame group is repeatedly transmitted and thus an error correction function of the broadcast signal reception apparatus may be uniformly enhanced for all blocks.

In addition, the dummy data additionally provided in FIG. 35(*a*) may be included in the last block among the divided blocks. The dummy data included in the last block may be positioned between PLS-post-STAT data and PLS-post-DYN data included in the corresponding block, or may be positioned at the rear of the PLS-post-DYN data. A position of the dummy data may be changed according to intent of a designer.

FIG. 35(*c*) illustrates an operation of encoding each block by the broadcast signal transmission apparatus. Each character in brackets of FIG. 35 indicates a length of data. The broadcast signal transmission apparatus may encode a separated block in which a codeword has a length of N and an information part has a length of K. A code rate may be defined as a value obtained by dividing the length of the information part by the length of the codeword. Therefore, a code rate of a codeword according to an embodiment of the present invention is K/N. The broadcast signal transmission apparatus may perform zero padding on each block, perform LDPC encoding by attaching parity bits to the rear of the zero-padded block, and output an FEC block by performing puncturing on the parity bits. As illustrated in FIG. 35, the FEC block may include an information part (K) and a parity part (N-K). PLS-post data encoded based on a code rate K/N may include the information part (K) and the parity part (N-K). The information part (K) may include PLS-post-STAT data, PLS-post-DYN data, and zero-padding bits. The zero-padding bits may be referred to as zero-inserted bits. A portion of bits included in the parity part (N-K) may be punctured, and the portion may be referred to as puncturing bits.

The broadcast signal transmission apparatus according to the present embodiment may successively insert zero-padding bits to maintain a constant length of an information part depending on a size of a separated block. In this case, the broadcast signal transmission apparatus according to the present embodiment may encode PLS data by inserting zero-padding bits corresponding to K-L/M which is obtained by subtracting a length L/M of PLS data from a length K of an information part. A scheme of encoding PLS data by inserting zero-padding bits may be identical to a processing scheme in general shortened code.

The broadcast signal transmission apparatus according to the present embodiment may encode PLS-post data having various lengths based on a particular code rate (for example, K/N). In this case, the broadcast signal transmission apparatus according to the present embodiment may insert parity bits to ensure an error correction ability exceeding a particular level. A length of the inserted parity bits may be changed depending on a length of PLS-post data to be protected, a length of L/M, and the like.

A scheme of encoding PLS-post data based on the particular code rate (for example, K/N) may be an LDPC encoding scheme. The above-mentioned particular code rate may be changed according to intent of a designer.

In addition, the broadcast signal transmission apparatus according to the present embodiment may change positions of zero-padding bits and puncturing parity bits to ensure an error correction ability exceeding a particular level.

Figures 35A, 35B, 35C, 35D:
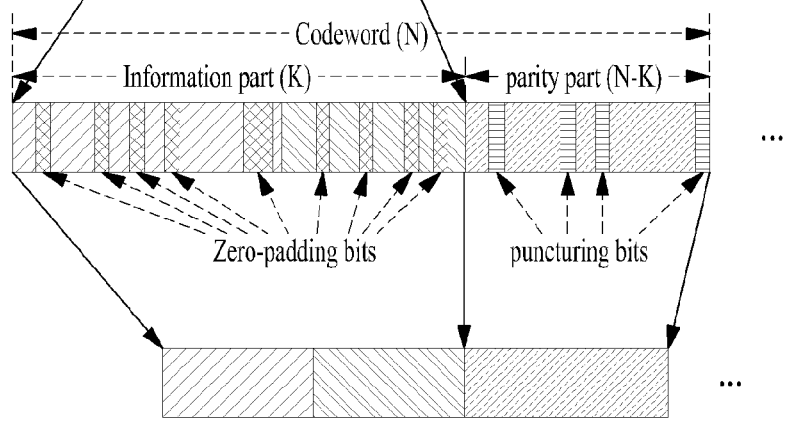
FIGS. 35(a), 35(b), 35(c) and 35(d) illustrate an operation of encoding PLS data by the broadcast signal transmission apparatus according to the present embodiment.

FIG. 35(d) illustrates an FEC block according to an embodiment of the present invention. In the present invention, the FEC block may be referred to as a transmitting block. FIG. 35(d) illustrates the FEC block in which the inserted zero-padding bits are deleted, and a portion of the parity bits is punctured. Hereinafter, the FEC block according to the present embodiment may be input as a bit interleaving block.

FIG. 35 illustrates an operation of encoding PLS-post data by the broadcast signal transmission apparatus according to the present embodiment. However, the operation is merely an example. The broadcast signal transmission apparatus according to the present embodiment may similarly encode PLS1 data.

Hereinafter, a scheme of specifying a position of zero-padding according to an embodiment of the present invention is specifically described.

FIG. 36 illustrates a scheme of encoding PLS data according to an embodiment of the present invention.

FIG. 36 illustrates a structure of data in which the broadcast signal transmission apparatus according to the present embodiment inserts zero padding bits into an information portion of a codeword, and rearranges and outputs bits of the information portion.

FIG. 36 illustrates an example in which a codeword includes an information portion (information part) having 10 bits and PLS-post data having 8 bits.

As described in the foregoing, the broadcast signal transmission apparatus according to the present embodiment may encode PLS data by inserting zero-padding bits corresponding to K−L/M which is obtained by subtracting a length L/M of PLS data from a length K of an information part. In this case, the zero-padding bits may be inserted into an information portion according to a zero-padding sequential order. Thereafter, the broadcast signal transmission apparatus may permute the inserted zero-padding bits according to permutation information based on the zero-padding sequential order.

FIG. 36(a) shows a table including the zero-padding sequential order and the permutation information. FIG. 36(b) illustrates an information portion of a codeword into which zero-padding bits are inserted. FIG. 36(c) illustrates the information portion of the codeword reordered according to the permutation information. FIG. 36(d) illustrates a matrix H including rearranged bits of the information portion.

Hereinafter, the respective figures are described.

In the table shown in FIG. 36(a), a column on the right side indicates the zero-padding sequential order, and a column on the left side indicates the permutation information.

As described in the foregoing, the broadcast signal transmission apparatus according to the present embodiment may successively insert zero-padding bits into an information part according to a determined zero-padding sequential order to ensure an error correction ability exceeding a particular level when encoding PLS data.

The zero-padding sequential order shown in FIG. 36(a) indicates positions of zero bits inserted into an information portion. When two zero bits are to be inserted, the zero bits may be successively inserted into a fourth position and a seventh position of the information portion according to the zero-padding sequential order. When three zero bits are to be inserted, the zero bits may be successively inserted into a fourth position, a seventh position, and a sixth position of the information portion according to the zero-padding sequential order.

A character n of $\pi_s(n)$ shown in FIG. 36(a) indicates an order of rearranged (or permuted) bits of an information portion. Therefore, $\pi_s(0)$ indicates a first rearranged (or permuted) bit of the information portion, and $\pi s(1)$ indicates a second rearranged (or permuted) bit of the information portion. Rearrangement (or permutation) is performed according to a zero-padding sequential order corresponding to $\pi s(n)$. Thus, when an information part is rearranged (or permuted), zero-padding bits may be successively arranged first at the front of the information part. The zero bits successively inserted into the fourth position and the seventh position may be rearranged at the front, that is, at a first position and a second position of an information part according to permutation information.

FIG. 36(b) illustrates a structure of the codeword in which the zero-padding bits are successively inserted into the information portion according to the zero-padding sequential order shown in FIG. 36(a). As described in the foregoing, the information portion according to an embodiment of the present invention has 10 bits, and the PLS-post data has 8 bits. The broadcast signal transmission apparatus may perform permutation based on the zero-padding sequential order. The permutation information may be referred to as permutation pattern information.

The bits of the information portion may be permuted before LDPC encoding. The zero-inserted bits are successively divided into bit interleaving groups. Each of digits shown in FIG. 36(b) indicates an order of each bit of the information portion. The order of each bit of the information portion is the same as an order of a column of the matrix H to be described below.

FIG. 36(c) illustrates a structure of the information portion in which the bits of the information portion are rearranged (permuted) based on the zero-padding sequential order according to an embodiment of the present invention.

FIG. 36(d) illustrates the matrix H including the rearranged bits of the information portion according to an embodiment of the present invention. The matrix H may be referred to as a parity check matrix.

The zero-padding sequential order according to the present embodiment corresponds to 3, 6, 5, 9, 1, 8, 7, 4, 0 and 2 as shown in FIG. 36(a). The character n of $\pi s(n)$ indicates an order of the rearranged (permuted) bits of the information portion. Thus, $\pi s(0)$ indicates a first rearranged (permuted) bit of the information portion, and $\pi s(1)$ indicates a second rearranged (permuted) bit of the information portion. The broadcast signal transmission apparatus according to the present embodiment may rearrange the bits of the information portion based on the zero-padding sequential order. Since $\pi s(0)$ equals 3, a fourth bit of the information portion before permutation is arranged at the first rearranged bit of the information portion. In addition, since $\pi s(1)$ equals 6, a seventh bit of the information portion before permutation is arranged at the second rearranged bit of the information portion.

As shown in FIG. 36(b), the broadcast signal transmission apparatus according to the present embodiment may successively insert zero-padding bits according to the determined zero-padding sequential order to ensure an error correction ability exceeding a particular level when encoding PLS data.

In this way, an information part having a constant length is input to an LDPC encoder. A PLS FEC encoder 6000 according to an embodiment of the present invention may successively insert zero-padding bits to maintain a constant length of an information part when a size of a separated block of PLS data input to the PLS FEC encoder 6000 decreases. In this case, the zero-padding bits may be inserted into the information part according to the determined zero-padding sequential order.

As shown in FIG. 36(c), the broadcast signal transmission apparatus according to the present embodiment may successively arrange the zero-padding bits at the front of the information portion. As described in the foregoing, the zero-padding sequential order may indicate the order of the inserted zero-padding bits and a permutation order of the information part. Rearrangement (or permutation) is performed according to the zero-padding sequential order corresponding to πs(n). Thus, when an information part is rearranged (or permuted), zero-padding bits may be successively arranged first at the front of the information part.

The PLS FEC encoder 6000 according to the present embodiment may insert the zero-padding bits and rearrange the bits of the information portion as described with reference to FIGS. 35 and 36. The PLS FEC encoder 6000 according to the present embodiment may rearrange the bits of the information portion according to the determined zero-padding sequential order of FIG. 36. Therefore, the zero-padding bits may be arranged at the front of the information portion, followed by the PLS-post-STAT data and the PLS-post-DYN data arranged in order.

When the broadcast signal reception apparatus according to the present embodiment decodes LDPC code including the information portion rearranged according to the above-described zero-padding sequential order, the broadcast signal reception apparatus may acquire positions or order information of all bits that may be designated as known bits based on information about the zero-padding sequential order.

The matrix H of FIG. 36(c) includes the bits of the information portion rearranged according to the zero-padding sequential order. In this case, an order of columns of the matrix H is identical to an order of the rearranged bits of the information portion. A column of the matrix H may be a unit in which the broadcast signal transmission apparatus performs interleaving on LDPC code thereafter. In addition, each row of the matrix H may refer to LDPC code.

The zero-padding sequential order proposed in the present invention is merely an example, and may be changed according to intent of a designer.

PLS-post data rearranged according to the zero-padding sequential order has an effect as below. The zero-padding sequential order may refer to a position and an order of all bits that may be designated as known bits when the broadcast signal reception apparatus performs LDPC decoding. Thus, when the broadcast signal reception apparatus successfully decodes PLS-post data of one of signal frames received for a constant period so that an error is corrected, all PLS-post-STAT data received thereafter may be used as known bits in the LDPC decoder. PLS data encoding according to an embodiment of the present invention may enhance an LDPC code error correction ability of the broadcast signal transmission apparatus.

FIG. 37 illustrates a codeword rearranged according to the method described in FIG.

Original QC-IRA column table (Table 1) shows an information portion of a parity check matrix (H matrix) of QC-IRA LDPC code Codeword shortening order (Table 2) shows the order of shortening the columns of the original QC-IRA column table (Table 1)

Modified QC-IRA column table (Table 3) is a table in which the columns of the original QC-IRA column table (Table 1) are rearranged according to codeword shortening order (Table 2).

Table 1 and Table 3 correspond to an H matrix having 12 columns. Rows of Table 1 and Table 3 can respectively correspond to columns of the parity check matrix.

Table 1 and Table 3 shown in FIG. 37 correspond to a parity check matrix (or H matrix) having a codeword length of 4320 and a code rate of ¼. Table 1 and Table 3 may indicate address 1 in the parity check matrix and may be referred to as addresses of parity check matrix The position of each column of Table 1 and Table 3 may be indicated by i which represents the position of a block generated when the length of the H matrix or codeword is divided by the length of a sub-matrix. The sub-matrix according to one embodiment of the present invention may be a 360×360 matrix. When the length of the codeword is 4320, the number of blocks may be 12 obtained by dividing 4320 by 360. Positions of blocks may be sequentially indicated from 0 or 1. Table 2 according to one embodiment of the present invention sequentially indicates block positions from 1. Accordingly, i may have a value in the range of 1 to 12. Shortening order of Table 2 indicates the positions of the columns of Table 1 and column position of Table 2 indicates the column positions of Table 3

Numbers in Table 1 and Table 3 denote positions (or addresses) of is (or edges) in blocks (columns).

A description will be given of a process of rearranging the columns of the H matrix shown in FIG. 37. As described above, the second column (corresponding to the second row in the figure) of the original QC-IRA column table (Table 1) may be positioned at the first column (corresponding to the first row in the figure) of the modified QC-IRA column table (Table 3) on the basis of the codeword shortening order (Table 2). Similarly, the fifth column (corresponding to the fifth row in the figure) of the original QC-IRA column table (Table 1) may be positioned at the second column (corresponding to the second row in the figure) of the modified QC-IRA column table (Table 3). In the same manner, the first column (corresponding to the first row in the figure) of the original QC-IRA column table (Table 1) may be positioned at the twelfth column (corresponding to the twelfth row in the figure) of the modified QC-IRA column table (Table 3).

A broadcast signal transmission apparatus according to an embodiment of the present invention may perform based on the tables described in FIG. 46 to FIG. 47, when the broadcast signal transmission apparatus according to an embodiment of the present invention permutes PLS1 and PLS2 in above described FIG. 35 to FIG. 37.

FIG. 38 is a view illustrating exemplary structures of three types of mother codes applicable to perform LDPC encoding on PLS data in a PLS FEC encoder module according to another embodiment of the present invention.

Mother codes according to one embodiment of the present invention may be classified into three types on the basis of the length and code rate of LDPC codeword.

PLS1 data and PLS2 data output from the above-described PLS (Physical Layer Signaling) generation module 4050 are independently input to the PLS scrambler module 4060. In the following description, the PLS-pre data and the PLS2 data may be collectively called PLS data. The PLS scrambler module 4060 may perform initialization to randomize the input PLS data. The PLS scrambler module 4060 may initialize the PLS data located and to be transmitted in frame, on a frame basis.

If the PLS located and to be transmitted in frame includes information about a plurality of frames, the PLS scrambler module 4060 may initialize the PLS data on a frame basis. An example thereof is the case of a PLS repetition frame structure to be described below. According to an embodiment of the present invention, PLS repetition refers to a frame configuration scheme for transmitting PLS data for a current frame and PLS data for a next frame together in the current frame. When PLS repetition is applied, the PLS scrambler module 4060 may independently initialize the PLS data for the current frame and the PLS data for the next frame. A detailed description of PLS repetition will be given below.

The PLS scrambler module 4060 may randomize the PLS1 data and the PLS2 data initialized on a frame basis.

Randomized PLS1 data and PLS2 data are input to the PLS FEC Encoder 6000. The randomized PLS1 data and PLS2 data may be independently processed by the PLS FEC Encoder 6000. The PLS FEC encoder 6000 may perform BCH encoding and LDPC encoding on the PLS1 data and PLS2 data input thereto.

BCH parity may be added to the randomized PLS data input to the PLS FEC encoder modules 6000 due to BCH encoding, and then LDPC encoding may be performed on the BCH-encoded data. LDPC encoding may be performed based on one of mother code types having different sizes in information portion (hereinafter, the size of information portion is called K_ldpc) according to the size of input data including BCH parity (hereinafter, the size of data input to an LDPC encoder module is called N_BCH). The PLS FEC encoder module may shorten data of an information portion of an LDPC mother code corresponding to the difference 36010 in size between K_ldpc and N_BCH, to 0 or 1, and may puncture a part of data included in a parity portion, thereby outputting a shortened/punctured LDPC code. The LDPC encoder module may perform LDPC encoding on the input PLS data or the BCH-encoded PLS data based on the shortened/punctured LDPC code and output the LDPC-encoded PLS data.

Here, BCH encoding is omittable according to the intention of a designer. If BCH encoding is omitted, the PLS FEC encoder module may generate an LDPC mother code by encoding the PLS data input to the PLS FEC encoder module. The PLS FEC encoder module may shorten data of an information portion of the generated LDPC mother code corresponding to the difference 36010 in size between K_ldpc and PLS data, to 0 or 1, and may puncture a part of data included in a parity portion, thereby outputting a shortened/punctured LDPC code. The FEC encoder module 5310 may perform LDPC encoding on the input PLS data based on the shortened/punctured LDPC code and output the LDPC-encoded PLS data.

Figure 38A:
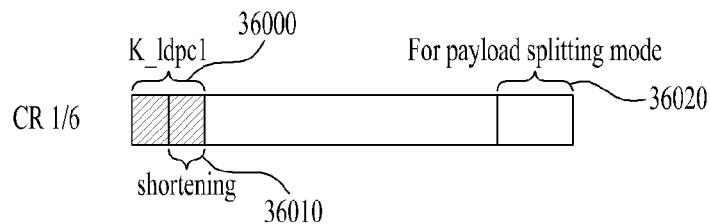
FIGS. 38(a), 38(b) and 38(c) illustrating are views exemplary structures of three types of mother codes applicable to perform LDPC encoding on PLS data in a PLS FEC encoder module according to another embodiment of the present invention.
Figure 38B:
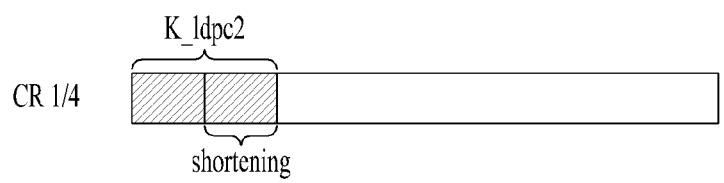
Figure 38C:
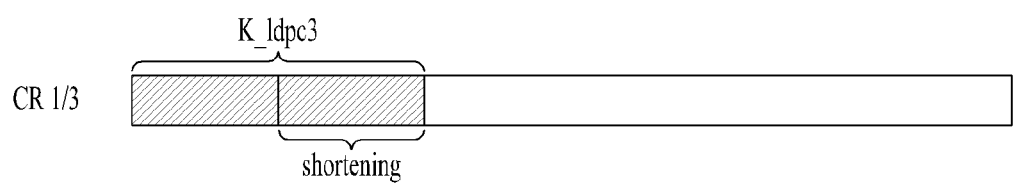

FIG. 38(a) illustrates an exemplary structure of mother code type1. In this case, mother code type1 has a code rate of ⅙. FIG. 38(b) illustrates an exemplary structure of mother code type2. In this case, mother code type2 has a code rate of ¼. FIG. 38(c) illustrates an exemplary structure of mother code type3. In this case, mother code type3 has a code rate of ⅓.

As illustrated in FIG. 38, each mother code may include an information portion and a parity portion. According to an embodiment of the present invention, the size of data corresponding to an information portion 36000 of a mother code may be defined as K_ldpc. K_ldpc of mother code type1, mother code type2 and mother code type3 may be respectively called k_ldpc1, k_ldpc2 and k_ldpc3.

A description is now given of an LDPC encoding procedure performed by a PLS FEC encoder based on mother code type1 illustrated in FIG. 38(a). In the following description, encoding may refer to LDPC encoding.

When BCH encoding is applied, the information portion of the mother code may include BCH-encoded PLS data including BCH parity bits and input to the LDPC encoder module of the PLS FEC encoder.

When BCH encoding is not applied, the information portion of the mother code may include PLS data input to the LDPC encoder module of the PLS FEC encoder.

The size of the PLS data input to the PLS FEC encoder may vary according to the size of additional information (management information) to be transmitted and the size of data of transmission parameters. The PLS FEC encoder may insert "0" bits to the BCH-encoded PLS data. If BCH encoding is not performed, the FEC encoder module may insert "0" bits to the PLS data.

The present invention may provide three types of dedicated mother codes used to perform the above-described LDPC encoding according to another embodiment. The PLS FEC encoder may select a mother code according to the size of PLS data, and the mother code selected by the PLS FEC encoder according to the size of PLS data may be called a dedicated mother code. The PLS FEC encoder may perform LDPC encoding based on the selected dedicated mother code.

According to an embodiment of the present invention, the size 36000 of K_ldpc1 of mother code type1 may be assumed as ½ of the size of K_ldpc2 of mother code type2 and ¼ of the size of K_ldpc3 of mother code type3. The relationship among the sizes of K_ldpc of mother code types is variable according to the intention of a designer. The designer may design a mother code having a small size of K_ldpc to have a low code rate. To maintain a constant signaling protection level of PLS data having various sizes, an effective code rate after shortening and puncturing should be lowered as the size of PLS data is small. To reduce the effective code rate, a parity ratio of a mother code having a small size of K_ldpc may be increased.

If the PLS data has an excessively large size and thus cannot be encoded based on one of a plurality of mother code types by the PLS FEC encoder, the PLS data may be split into a plurality of pieces for encoding. Here, each piece of the PLS data may be called fragmented PLS data. The above-described procedure for encoding the PLS data by the PLS FEC encoder may be replaced with a procedure for encoding each fragmented PLS data if the PLS data has an excessively large size and thus cannot be encoded based on one of a plurality of mother code types by the PLS FEC encoder.

When the PLS FEC encoder encodes mother code type1, to secure a signaling protection level in a very low signal to noise ratio (SNR) environment, payload splitting may be performed. The length of parity of mother code type1 may be increased due to a portion 36020 for executing a payload splitting mode. A detailed description of the mother code selection method and the payload splitting mode will be given below.

If the PLS FEC encoder encodes PLS data having various sizes based on a single mother code type having a large size of K_ldpc, a coding gain may be rapidly reduced. For example, when the above-described PLS FEC encoder performs shortening using a method for determining a shortening data portion (e.g., K_ldpc−N_BCH), since K_ldpc is constant, small-sized PLS data is shortened more than large-sized PLS data.

To solve the above-described problem, the PLS FEC encoder according to an embodiment of the present invention may apply a mother code type capable of achieving an optimal coding gain among a plurality of mother code types differently according to the size of PLS data.

The PLS FEC encoder according to an embodiment of the present invention may restrict the size of a portion to be shortened by the PLS FEC encoder to achieve an optimal coding gain. Since the PLS FEC encoder restricts the size 36010 of a shortening portion to be shortened to a certain ratio of K_ldpc 36000 of each mother code, a coding gain of a dedicated mother code of each PLS data may be constantly maintained. The current embodiment shows an example in which shortening can be performed up to 50% of the size of K_ldpc. Accordingly, when the above-described PLS FEC encoder determines a shortening data portion as the difference between K_ldpc and N_BCH, if the difference between K_ldpc and N_BCH is greater than ½ of K_ldpc, the PLS FEC encoder may determine the size of a data portion to be shortened by the PLS FEC encoder as K_ldpc*1/2 instead of K_ldpc-N_BCH.

LDPC encoding procedures performed by the PLS FEC encoder based on mother code type2 and mother code type3 illustrated in FIGS. 40(*b*) and 40(*c*) may be performed in the same manner as the above-described LDPC encoding procedure performed by the PLS FEC encoder based on mother code type1 illustrated in FIG. 38(*a*).

The PLS FEC encoder may perform encoding based on an extended LDPC code by achieving an optimal coding gain by encoding PLS data having various sizes based on a single mother code.

However, a coding gain achievable when encoding is performed based on an extended LDPC code is approximately 0.5 dB lower than the coding gain achievable when encoding is performed based on dedicated mother codes optimized to different sizes of PLS data as described above. Thus, if the PLS FEC encoder according to an embodiment of the present invention encodes PLS data by selecting a mother code type structure according to the size of PLS data, redundancy data may be reduced and PLS signaling protection capable of ensuring the same reception performance may be designed.

Figure 39:
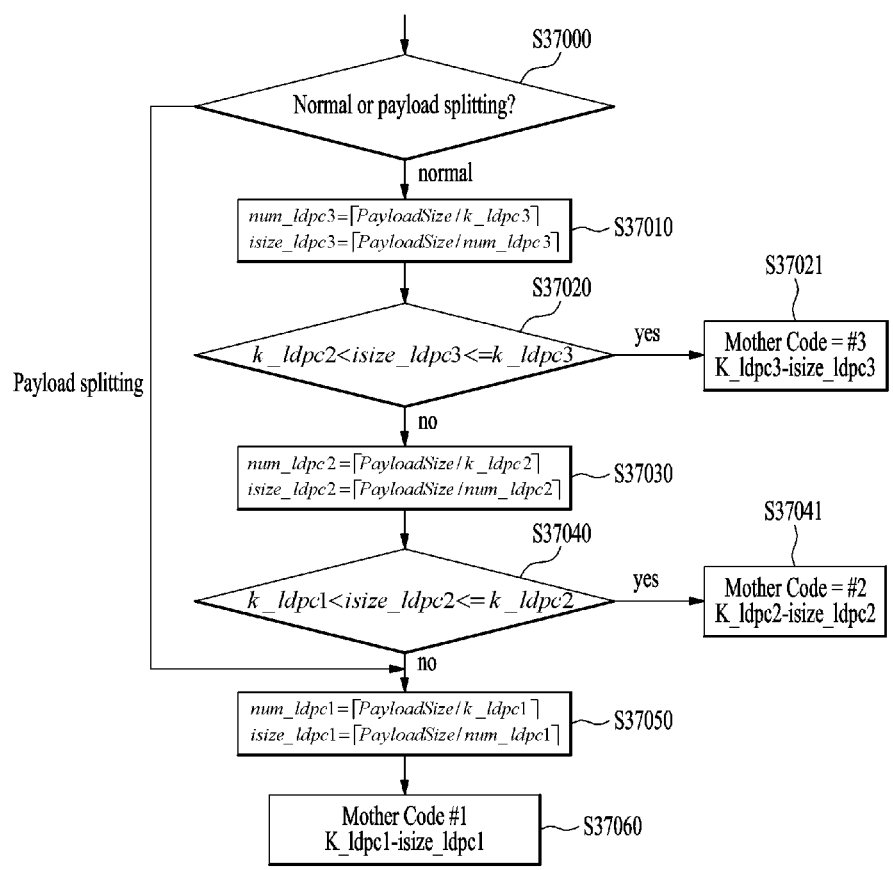
FIG. 39 is a flowchart of a procedure for selecting a mother code type used for LDPC encoding and determining the size of shortening according to another embodiment of the present invention.

FIG. 39 is a flowchart of a procedure for selecting a mother code type used for LDPC encoding and determining the size of shortening according to another embodiment of the present invention.

A description is now given of a procedure for selecting a mother code type according to the size of PLS data (payload size) to be LDPC-encoded and determining the size of shortening by the PLS FEC encoder module. The following description is assumed that all operations below are performed by the PLS FEC encoder module.

It is checked whether an LDPC encoding mode is a normal mode or a payload splitting mode (S37000). If the LDPC encoding mode is a payload splitting mode, mother code1 may be selected irrespective of the size of PLS data and the size of shortening is determined based on the size of K_ldpc of mother code type1 (k_ldpc1) (S37060). A detailed description of the payload splitting mode will be given below.

If the LDPC encoding mode is a normal mode, the PLS FEC encoder module selects a mother code type according to the size of PLS data. A description is now given of the procedure for selecting a mother code type in the normal mode by the PLS FEC encoder module.

Num_ldpc refers to the number of fragmented PLS data which can be included in a single piece of PLS data. Isi-ze_ldpc refers to the size of fragmented PLS data input to the PLS FEC encoder module. Num_ldpc3 may be determined as a rounded-up value of a value obtained by dividing the size of input PLS data (payload size) by k_ldpc3 for encoding. The value of isize_ldpc3 may be determined as a rounded-up value of a value obtained by dividing the size of PLS data (payload size) by the determined num_ldpc3 (S37010). It is determined whether the value of isize_ldpc3 is in a range greater than k_ldpc2 and equal to or less than k_ldpc3 (S37020). If the size of isize_ldpc3 is in a range greater than k_ldpc2 and equal to or less than k_ldpc3, mother code type3 is determined. In this case, the size of shortening may be determined based on a difference value between k_ldpc3 and isize_ldpc3 (S37021).

If the value of isize_ldpc3 is not in a range greater than k_ldpc2 and equal to or less than k_ldpc3, a rounded-up value of a value obtained by dividing the size of PLS data (marked as "payload size" in FIG. 39) by k_ldpc2 is determined as num_ldpc2. The value of isize_ldpc2 may be determined as a rounded-up value of a value obtained by dividing the size of PLS data (payload size) by the determined num_ldpc2 (S37030). It is determined whether the value of isize_ldpc2 is in a range greater than k_ldpc1 and equal to or less than k_ldpc2 (S37040). If the value of isize_ldpc2 is in a range greater than k_ldpc1 and equal to or less than k_ldpc2, mother code type2 is determined. In this case, the size of shortening may be determined based on a difference value between k_ldpc2 and isize_ldpc2 (S37041).

If the value of isize_ldpc2 is in not a range greater than k_ldpc1 and equal to or less than k_ldpc2, a rounded-up value of a value obtained by dividing the size of PLS data (payload size) by k_ldpc1 is determined as num_ldpc1. The value of isize_ldpc1 may be determined as a rounded-up value of a value obtained by dividing the size of PLS data (payload size) by the determined num_ldpc1 (S37050). In this case, mother code type1 is determined and the size of shortening may be determined based on a difference value between k_ldpc1 and isize_ldpc1 (S37060).

The above-described num_ldpc and isize_ldpc may have different values according to the size of PLS data. However, k_ldpc1, k_ldpc2 and k_ldpc3 according to the mother code type are not influenced by the size of PLS data and have constant values.

FIG. 40 is a view illustrating a procedure for encoding adaptation parity according to another embodiment of the present invention.

FIG. 40(*a*) illustrates an example of PLS data input to the PLS FEC encoder module for LDPC encoding.

FIG. 40(*b*) illustrates an exemplary structure of an LDPC code after performing LDPC encoding and before performing shortening and puncturing.

FIG. 40(*c*) illustrates an exemplary structure of an LDPC code after performing LDPC encoding, shortening and puncturing (38010) (hereinafter referred to as a shortened/punctured LDPC code), which is output from the PLS FEC encoder module.

FIG. 40(*d*) illustrates an exemplary structure of a code output by adding adaptation parity (38011) to the LDPC code which is LDPC-encoded, shortened and punctured by the PLS FEC encoder module, according to another embodiment of the present invention. Here, a scheme for outputting the code by adding adaptation parity (38011) to the shortened/punctured LDPC code by the PLS FEC encoder module is called an adaptation parity scheme.

To maintain a signaling protection level, the PLS FEC encoder module may perform LDPC-encode and then shorten the PLS data, puncture (38010) some of parity bits, and thus output the shortened/punctured LDPC code. In a poor reception environment, the signaling protection level needs to be strengthened compared to the robustness constantly supported by a broadcast system, i.e., a constant target threshold of visibility (TOV). According to an embodiment of the present invention, to strengthen the signaling protection level, an LDPC code may be output by adding adaptation parity bits to the shortened/punctured LDPC code. The adaptation parity bits may be determined as some parity bits (38011) of the parity bits (38010) punctured after LDPC encoding.

FIG. 40(c) illustrates a basic target TOV in a case when an effective code rate is approximately ⅓. According to an embodiment of the present invention, if the PLS FEC encoder module adds the adaptation parity bits (38011), actually punctured parity bits may be reduced. The PLS FEC encoder module may adjust the effective code rate to approximately ¼ by adding adaptation parity bits as illustrated in FIG. 40(d). According to an embodiment of the present invention, a mother code used for LDPC encoding may additionally include a certain number of parity bits to acquire the adaptation parity bits 38011. Accordingly, the coding rate of a mother code used for adaptation parity encoding may be designed to be lower than the code rate of an original mother code.

The PLS FEC encoder module may output the added parity (38011) included in the LDPC code by arbitrarily reducing the number of punctured parity bits. A diversity gain may be achieved by including the output added parity (38011) included in the LDPC code, in a temporally previous frame and transmitting the previous frame via a transmitter. The end of an information portion of a mother code is shortened and the end of a parity portion of the mother code is punctured in FIG. 40(b). However, this merely corresponds to an exemplary embodiment and the shortening and puncturing portions in the mother code may vary according to the intention of a designer.

FIG. 41 is a view illustrating a payload splitting mode for splitting PLS data input to the PLS FEC encoder module before LDPC-encoding the input PLS data according to another embodiment of the present invention. In the following description, the PLS data input to the PLS FEC encoder module may be called payload.

FIG. 41(a) illustrates an example of PLS data input to the PLS FEC encoder module for LDPC encoding.

FIG. 41(b) illustrates an exemplary structure of an LDPC code obtained by LDPC-encoding each split piece of payload. The structure of the LDPC code illustrated in FIG. 41(b) is the structure before performing shortening/puncturing.

FIG. 41(c) illustrates an exemplary structure of a shortened/punctured LDPC code output from the PLS FEC encoder module according to another embodiment of the present invention. The structure of the shortened/punctured LDPC code illustrated in FIG. 41(c) is the structure of the shortened/punctured LDPC code output when a payload splitting mode is applied to the PLS FEC encoder module.

Payload splitting is performed by the PLS FEC encoder module to achieve the robustness strengthened compared to a constant target TOV for signaling.

As illustrated in FIG. 41(b), the payload splitting mode is a mode for splitting PLS data before LDPC encoding and performing LDPC encoding on each split piece of the PLS data by the PLS FEC encoder module.

As illustrated in FIG. 41(c), in the payload splitting mode, the input PLS data may be encoded and shortened/punctured using only a mother code type having the lowest code rate among mother code types provided by the PLS FEC encoder module (e.g., mother code type1 according to the current embodiment).

A method for selecting one of three mother code types based on the size of PLS data and performing LDPC encoding on the LDPC encoding based on the selected mother code type to adjust a signaling protection level by PLS FEC encoder module has been described above. However, if a mother code type having the highest code rate is selected among mother code types provided by the PLS FEC encoder module (e.g., mother code type3 according to the current embodiment), the signaling protection level may be restricted. In this case, the PLS FEC encoder module may apply the payload splitting mode to the PLS data and LDPC-encode every piece of the PLS data using only a mother code type having the lowest code rate among mother code types provided by the PLS FEC encoder module, thereby adjusting the signaling protection level to be low. When the payload splitting mode is used, the PLS FEC encoder module may adjust the size of punctured data according to a strengthened target TOV after shortening.

According to the previous embodiment of the present invention, when the PLS FEC encoder module does not use the payload splitting mode for LDPC encoding, the effective code rate of the shortened/punctured LDPC code was approximately ⅓. However, in FIG. 41(c), the effective code rate of the output LDPC code to which the payload splitting mode is applied by the PLS FEC encoder module is approximately 11/60. Accordingly, the effective code rate of the output LDPC code to which the payload splitting mode is applied may be reduced.

The end of an information portion of an LDPC code is shortened and the end of a parity portion of the LDPC code is punctured in FIG. 41(b). However, this merely corresponds to an exemplary embodiment and the shortening and puncturing portions in the LDPC code may vary according to the intention of a designer.

FIG. 42 is a view illustrating a procedure for performing PLS repetition and outputting a frame according to another embodiment of the present invention.

According to another embodiment of the present invention, PLS repetition performed by the frame structure module corresponds to a frame structure scheme for including two or more pieces of PLS data including information about two or more frames in a single frame.

A description is now given of PLS repetition according to an embodiment of the present invention.

FIG. 42(a) illustrates an exemplary structure of a plurality of pieces of PLS data encoded by the PLS FEC encoder module.

FIG. 42(b) illustrates an exemplary structure of a frame including a plurality of pieces of encoded PLS data due to PLS repetition by the frame structure module.

FIG. 42(c) illustrates an exemplary structure of a current frame including PLS data of the current frame and PLS data of a next frame.

Specifically, FIG. 42(c) illustrates an exemplary structure of an nth frame (current frame) including PLS data (PLS n) of the nth frame and PLS data 40000 of an (n+1)th frame (next frame), and the (n+1)th frame (current frame) including PLS data (PLS n+1) of the (n+1)th frame and PLS data of an (n+2)th frame (next frame). A detailed description is now given of FIG. 42.

FIG. 42(a) illustrates the structure in which PLS n for the nth frame, PLS n+1 for the (n+1)th frame, and PLS n+2 for the (n+2)th frame are encoded. The PLS FEC encoder module according to another embodiment of the present invention may output an LDPC code by encoding static PLS signaling data and dynamic PLS signaling data together. PLS n including physical signaling data of the nth frame may include static PLS signaling data (marked as "stat"), dynamic PLS signaling data (marked as "dyn"), and parity data (marked as "parity"). Likewise, each of PLS n+1 and PLS n+2 including physical signaling data of the (n+1)th frame and the (n+2)th frame may include static PLS signaling data (marked as "stat"), dynamic PLS signaling data (marked as "dyn"), and parity data (marked as "parity"). In FIG. 42(a), I includes static PLS signaling data and dynamic PLS signaling data, and P includes parity data.

FIG. 42(b) illustrates an example of PLS formatting for splitting the data illustrated in FIG. 42(a) to locate the data in frames.

If PLS data transmitted by a transmitter is split according to whether the PLS data is changed for each frame and then transmitted by excluding redundancy data which is not changed in every frame, a receiver may have a higher PLS decoding performance. Accordingly, PLS n and PLS n+1 are mapped to the nth frame using PLS repetition, the frame structure module according to an embodiment of the present invention may split PLS n+1 to include the dynamic PLS signaling data of PLS n+1 and the parity data of PLS n+1 excluding the static PLS signaling data of PLS n+1 which is repeated from the static PLS signaling data of PLS n. A splitting scheme for transmitting PLS data of a next frame in a current frame by the frame structure module may be called PLS formatting.

Here, when the frame structure module splits PLS n+1 to be mapped to the nth frame, the parity data of PLS n+1 may be determined as a part of parity data (marked as "P") illustrated in FIG. 42(a), and the size thereof can scalably vary. Parity bits of PLS data of a next frame to be transmitted in a current frame, which are determined by the frame structure module due to PLS formatting, may be called scalable parity.

FIG. 42(c) illustrates an example in which data split in FIG. 42(b) is located in the nth frame and the (n+1)th frame.

Each frame may include a preamble, PLS-pre, PLS and service data (marked as "Data n"). A description is now given of the detailed stricture of each frame illustrated in FIG. 42(c). PLS-pre and PLS according to one embodiment of the present invention may respectively correspond to the aforementioned PLS1 and PLS2. The nth frame illustrated in FIG. 42(c) may include a preamble, PLS-pre, encoded PLS n, a part of encoded PLS n+1 40000, and service data (marked as "Data n"). Likewise, the (n+1)th frame may include a preamble, PLS-pre, encoded PLS n+1 40010, a part of encoded PLS n+2, and service data (marked as "Data n+1"). In the following description according to an embodiment of the present invention, a preamble may include PLS-pre.

PLS n+1 included in the nth frame is different from that included in the (n+1)th frame in FIG. 42(c). PLS n+1 40000 included in the nth frame is split due to PLS formatting and does not include static PLS signaling data while PLS n+1 40010 includes static PLS signaling data.

When scalable parity is determined, the frame structure module may maintain the robustness of PLS n+1 40000 included in the nth frame in such a manner that a receiver can decode PLS n+1 included in the nth frame before receiving the (n+1)th frame and may consider a diversity gain achievable when PLS n+1 40000 included in the nth frame and PLS n+1 40010 included in the (n+1)th frame are decoded in the (n+1)th frame.

If parity bits of PLS n+1 40000 included in the nth frame are increased, data (Data n+1) included in the (n+1)th frame may be rapidly decoded based on data achieved by decoding PLS n+1 40000 included in the nth frame before the (n+1)th frame is received. On the other hand, scalable parity included in PLS n+1 40000 may be increased and thus data transmission may be inefficient. Further, if small scalable parity of PLS n+1 40000 is transmitted in the n frame to achieve a diversity gain for decoding PLS n+1 40010 included in the (n+1)th frame, the effect of rapidly decoding service data (Dana n+1) included in the (n+1)th frame by previously decoding PLS n+1 40000 included in the n frame before the (n+1)th frame is received may be reduced.

To achieve an improved diversity gain by a receiver, the frame structure module according to an embodiment of the present invention may determine the configuration of parity of PLS n+1 40000 included in the nth frame to be different from that of parity of PLS n+1 40010 included in the (n+1)th frame as much as possible in the PLS formatting procedure.

For example, if parity P of PLS n+1 includes 5 bits, the frame structure module may determine scalable parity of PLS n+1 which can be included in the nth frame as second and fourth bits and determine scalable parity of PLS n+1 which can be included in the (n+1)th frame as first, third and fifth bits. As such, if the frame structure module determines scalable parity bits not to overlap, a coding gain as well as a diversity gain may be achieved. According to another embodiment of the present invention, when the frame structure module performs PLS formatting, a diversity gain of a receiver may be maximized by soft-combining repeatedly transmitted information before LDPC decoding.

The frame structure illustrated in FIG. 42 is merely an exemplary embodiment of the present invention and may vary according to the intention of a designer. The order of PLS n and PLS n+1 40000 in the nth frame merely an example and PLS n+1 40000 may be located prior to PLS n according to the intention of a designer. This may be equally applied to the (n+1)th frame.

Figure 43:
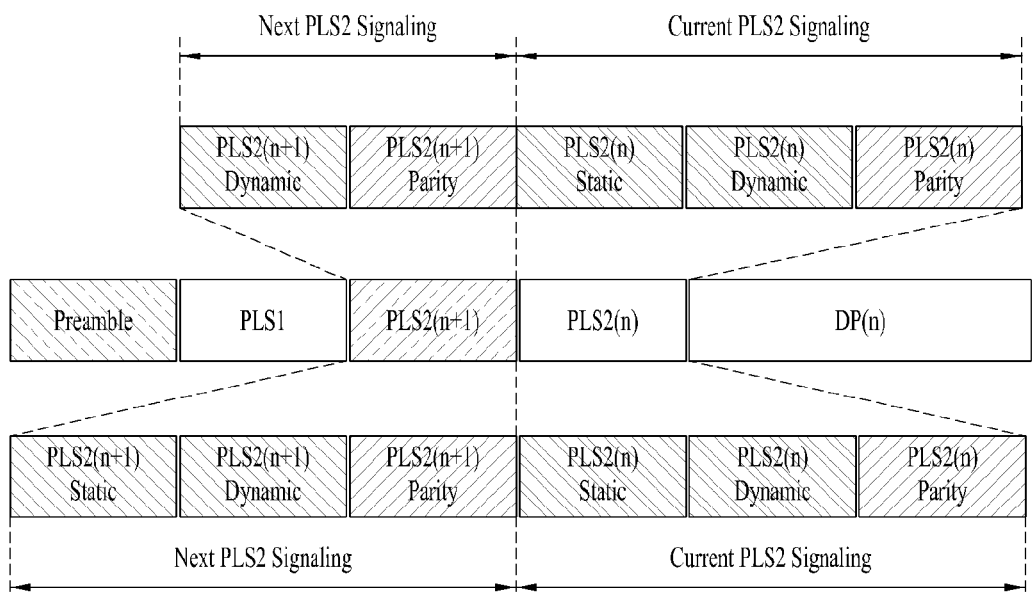
FIG. 43 illustrates a signal frame structure to which PLS repetition is applied.

FIG. 43 illustrates a signal frame structure to which PLS repetition is applied.

Specifically, FIG. 43 shows a PLS2 structure to which PLS repetition is applied.

As shown, the n-th signal frame may include a preamble, PLS1, PLS2(n+1), PLS2(n) and DP(n). In this case, PLS2(n+1) may be positioned prior to PLS2(n) in the signal frame. FIG. 43(a) shows a PLS2 structure included in a signal frame which is not the end signal frame of a superframe. FIG. 43(b) shows a PLS2 structure included in the end signal frame of the superframe.

The PLS2 structures shown in FIGS. 43(a) and (b) include a next PLS2 signaling part and a current PLS2 signaling part.

The next PLS2 signaling part may include PLS2(n+1) Static, PLS2(n+1) Dynamic and PLS2(n+1) Parity, whereas the current PLS2 signaling part may include PLS2(n) Static, PLS2(n) Dynamic and PLS2(n) Parity.

The structure of $(n+1)^{th}$ PLS2 which is transmitted by PLS2 repetition may be changed according to the location of signal frame of super frame is located end of the super frame or not. In the following description, the structure of PLS2 repetition according to the embodiment of the present invention is changed according to location of signal frame of the super frame.

FIG. 43(a) shows the structure of PLS2 included signal frame of the super frame. PLS2 static data according to the embodiment of the present invention may constant in the super frame. Therefore PLS2(n+1) Static data and PLS2(n) Static data may equal. Consequently, a broadcast signal transmission apparatus according to an embodiment of the present invention may not transmit the PLS2(n+1) Static.

However, end signal frame of super frame may transmit the structure of PLS2 described in FIG. 43(*b*), that is, PLS2 data including PLS2(n+1) Static. Because PLS2(n+1) Static for next frame may be changed.

super-frame may be replaced by frame-group or a plurality of the signal frame for a specific time period can be interpreted.

The structure of the current PLS2 signaling part may be fixed irrespective of the position of the signal frame.

Optional repetition schemes can be used to increase the robustness and reliability of PLS2 signaling by soft-combining of the repeated collection of coded blocks prior to LDPC decoding in the receiver.

There are two cases for the repetition scheme depending on the position of PLS2 in the current frame-group:

In the case of the last frame of the current frame-group:

If the PLS2_NEXT_REP_FLAG bit in PLS1 field is set to '1' and the PLS_CHANGE_COUNTER bits in the PLS2-DYN field are set to '0001', the collection of full coded blocks for the PLS2 carrying the first frame parameters in the next frame-group is transmitted.

If the PLS2_NEXT_REP_FLAG bit in PLS1 field is set to '1' and the PLS_CHANGE_COUNTER bits in the PLS2-DYN field are set to any number except '0001', the collection of partial coded blocks for the PLS2 carrying the first frame parameters in the next frame-group is transmitted.

In the cases of the other frames of the current frame-group:

If the PLS2_REP_FLAG bit in the PLS1 field is set to '1', the collection of partial coded blocks for the PLS2 carrying next frame parameters is transmitted along with the collection of full coded blocks for the PLS2 carrying current frame parameters.

These two operational cases are shown in FIG. 43.

When the repetition of PLS2 signaling is processed, bit interleaving and mapping operations are applied to each repeated coded block according to the next frame-group parameters. The collection of partial or full coded blocks for $(n+1)^{th}$ frame PLS2 signaling is placed ahead of it for the $n^{th}$ frame PLS2 signaling in the $n^{th}$ frame, as shown in FIG. 43.

Figure 44:
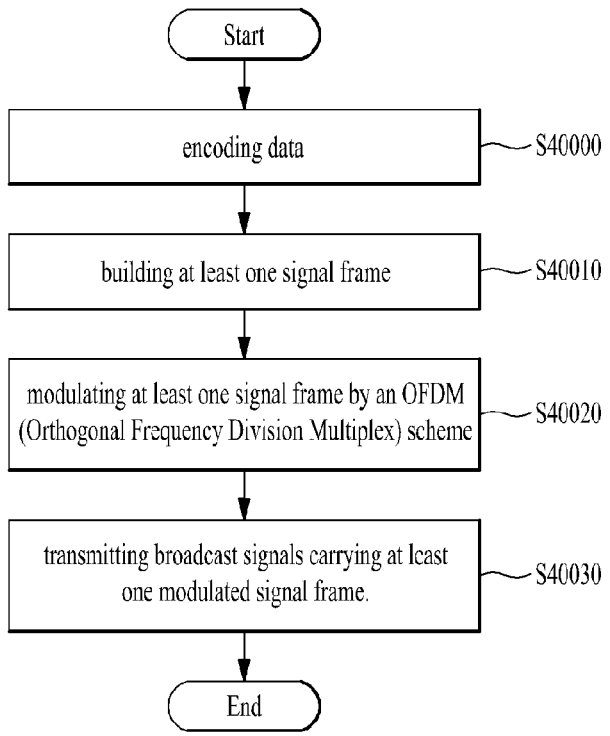
FIG. 44 is a flowchart illustrating a method of transmitting a broadcast signal according to an embodiment of the present invention.

FIG. 44 is a flowchart illustrating a method of transmitting a broadcast signal according to an embodiment of the present invention.

The broadcast signal transmission apparatus according to the present embodiment may encode data (or service data) for transmission of at least one broadcast service component in S40000. As described in the foregoing, the data according to the present embodiment may be processed for each DP corresponding to each of the data. The data may be encoded by the bit interleaved coding & modulation block 1010.

The broadcast signal transmission apparatus according to the present embodiment may encode signaling data (which may be referred to as physical signaling data or PLS). As described in the foregoing, the signaling data according to the present invention may include PLS1 data and PLS2 data. The PLS2 data may include PLS2 static data and PLS2 dynamic data. The PLS2 data may be referred to as PLS-post data, the PLS2 static data may be referred to as PLS-post-STAT data, and the PLS2 dynamic data may be referred to as PLS-post-DYN data.

As described in the foregoing, each frame included in a frame group may include PLS data.

The PLS2-STAT parameters are the same within a frame group, while the PLS2-DYN parameters provide information that is specific to the current frame. The values of the PLS2-DYN parameters may change during the duration of one frame group, while the field size remains constant.

The broadcast signal reception apparatus according to the present embodiment may divide a PLS-post payload into M blocks to encode the PLS-post payload in a codeword having a constant size N. Thereafter, the broadcast signal transmission apparatus according to the present embodiment may perform BCH encoding on each block, perform zero padding on each BCH-encoded block, add parity bits to the rear of the zero-padded block to perform LDPC encoding, and puncture the parity bits to output an FEC block.

The broadcast signal transmission apparatus according to the present embodiment may successively insert zero-padding bits into each block according to a determined zero-padding sequential order at the time of the zero padding. Thereafter, the broadcast signal transmission apparatus according to the present embodiment may permute the zero-padded block based on the zero-padding sequential order. Thereafter, the broadcast signal transmission apparatus according to the present embodiment may add parity bits to the rear of the permuted block to perform LDPC encoding and perform parity bit interleaving. Thereafter, the broadcast signal transmission apparatus according to the present embodiment may delete the inserted zero-padding bits. The broadcast signal transmission apparatus according to the present embodiment may determine LDPC mother code type according to the size of PLS data. Thereafter, if PLS2 repetition mode, the one current signal frame may include next PLS2 signaling part and current PLS2 signaling part. The specific description of the PLS2 repetition mode is same with above described in FIG. 42 to FIG. 43.

The above-described PLS data encoding may be performed by the PLS FEC encoder 6000 of the broadcast signal transmission apparatus according to the present embodiment.

Thereafter, the broadcast signal transmission apparatus according to the present embodiment may generate at least one signal frame in S40010. The signal frame may include PLS data and service data. The signal frame may be generated by the frame building block 1020.

Thereafter, the broadcast signal transmission apparatus according to the present embodiment may modulate the at least one generated signal frame using an OFDM scheme in S40020. The signal frame may be modulated using the OFDM scheme by the waveform generation module 1300.

Thereafter, the broadcast signal transmission apparatus according to the present embodiment may transmit at least one broadcast signal including the at least one generated and modulated signal frame in S40030.

Figure 45:
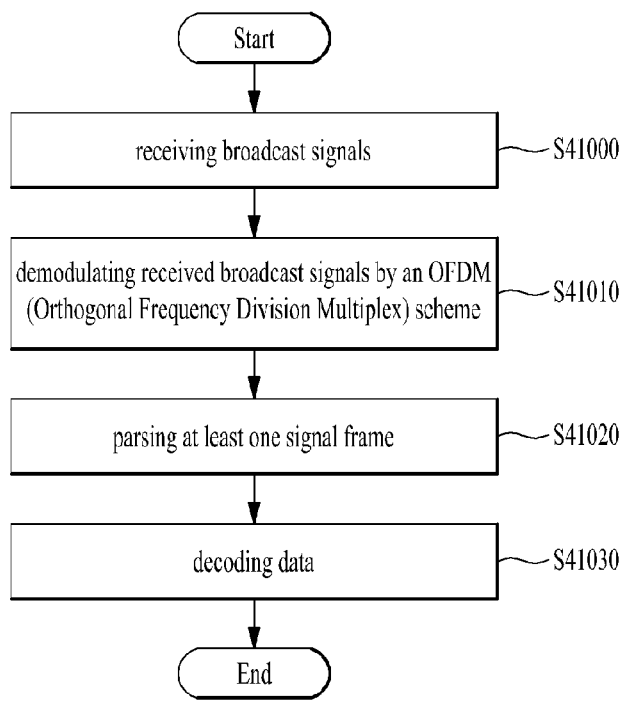
FIG. 45 is a flowchart illustrating a method of receiving a broadcast signal according to an embodiment of the present invention.

FIG. 45 is a flowchart illustrating a method of receiving a broadcast signal according to an embodiment of the present invention.

FIG. 45 corresponds to a reverse process of the broadcast signal transmission method described with reference to FIG. 44.

The broadcast signal reception apparatus according to the present embodiment may receive at least one broadcast signal in S41000. The broadcast signal may include at least one signal frame, and each signal frame may include PLS data and service data.

The broadcast signal reception apparatus according to the present embodiment may demodulate the at least one received broadcast signal using an OFDM scheme in S41010. The broadcast signal may be demodulated by the synchronization & demodulation module 9000.

Thereafter, the broadcast signal reception apparatus according to the present embodiment may operate in reverse order of the operation of the PLS FEC encoder 6000 described with reference to FIG. 32. The broadcast signal reception apparatus according to the present embodiment may perform LDPC decoding and then BCH decoding of PLS transmission bits included in the signal frame. When the broadcast signal reception apparatus according to the present embodiment performs BCH decoding of signaling data undergoing the above-described PLS encoding scheme, the broadcast signal reception apparatus may perform the BCH decoding of the signaling data except for zero-padding bits.

PLS decoding may be performed by the signaling decoding module 9040.

Thereafter, the broadcast signal reception apparatus according to the present embodiment may separate at least one signal frame from the demodulated broadcast signal in S41020. The signal frame may be separated by the frame parsing module 9010.

Thereafter, the broadcast signal reception apparatus according to the present embodiment may decode service data for transmission of at least one broadcast service component in S41030. The data may be decoded by the demapping & decoding module 9020.

FIG. 46 shows tables that represents permutation pattern for PLS1 data and permutation order for PLS1 data which are described in FIG. 35 to FIG. 37.

FIG. 46(*a*) shows table that represents permutation pattern of interleaving group for PLS1 according to an embodiment of the present invention.

FIG. 46(*b*) shows table that represents permutation order of parity group to be punctured for PLS1 according to an embodiment of the present invention.

FIG. 47 shows table that represents permutation order for PLS2 which is described in FIG. 35 to FIG. 37.

FIG. 47(*a*) shows table that represents permutation order of parity group to be punctured for PLS2 for 4K-1/4 according to an embodiment of the present invention.

FIG. 47(*b*) shows table that represents permutation order of parity group to be punctured for PLS2 for 7K-3/10 according to an embodiment of the present invention.

The broadcast signal reception apparatus according to the present embodiment may perform permutation of each PLS1 and PLS2 based on the tables that are represented in FIG. 46 to FIG. 47. When the broadcast signal reception apparatus according to the present embodiment permutes PLS2, the broadcast signal reception apparatus according to the present embodiment may use different permutation order according to size of FEC block and code rate.

Further, when the broadcast signal reception apparatus according to the present embodiment perform PLS repetition in above described FIG. 42 to FIG. 43, the broadcast signal reception apparatus according to the present embodiment may select additional parity bits based on one of the table in represented FIG. 46 to FIG. 47.

permutation patterns and permutation orders in the present invention is merely an exemplary embodiment of the present invention and may vary according to the intention of a designer.

It will be appreciated by those skilled in the art that various modifications and variations can be made in the present invention without departing from the spirit or scope of the inventions. Thus, it is intended that the present invention covers the modifications and variations of this invention provided they come within the scope of the appended claims and their equivalents.

Both apparatus and method inventions are mentioned in this specification and descriptions of both of the apparatus and method inventions may be complementarily applicable to each other.

What is claimed is:

1. A method for transmitting broadcast signals, the method comprising:
encoding service data corresponding to each of a plurality of data transmission path, wherein each of the data transmission path carries at least one service component for broadcast services;
encoding signaling data, wherein a protection level of the signaling data is determined based on a variable size of the signaling data;
padding zero bits to the encoded signaling data;
LDPC encoding the zero padded signaling data by appending parity bits, wherein a size of the padded zero bits is related to the variable size of the signaling data;
building signal frames, wherein each of signal frames includes the encoded service data and the LDPC encoded signaling data;
modulating the signal frames by an OFDM (Orthogonal Frequency Division Multiplex) scheme; and
transmitting the broadcast signals carrying the modulated signal frames.

2. The method of claim 1, the method further includes:
segmenting the signaling data for the encoding.

3. The method of claim 1, the method further includes:
scrambling the segmented signaling data.

4. The method of claim 1, the method further includes:
time interleaving the encoded service data by a skip operation.

5. The method of claim 1, the method further includes:
adding additional parity bits for next signal frame into a current frame, wherein a number of additional parity bits is decided based on the variable size of the signaling data in the current frame.

6. An apparatus for transmitting broadcast signals, the apparatus comprising:
an encoder to encode service data corresponding to each of a plurality of data transmission path, wherein each of the data transmission path carries at least one service component for broadcast services;
a signaling encoder to encode signaling data, wherein a protection level of the signaling data is determined based on a variable size of the signaling data;
a padding module to pad zero bits to the encoded signaling data;
an LDPC encoder to LDPC encode the zero padded signaling data by appending parity bits, wherein a size of the padded zero bits is related to the variable size of the signaling data;
a frame builder to build signal frames, wherein each of signal frames includes the encoded service data and the LDPC encoded signaling data;
a modulator to modulate the signal frames by an OFDM (Orthogonal Frequency Division Multiplex) scheme; and
a transmitter to transmit the broadcast signals carrying the modulated signal frames.

7. The apparatus of claim 6, the apparatus further includes:
a segmentation module to segment the signaling data for encoding.

8. The apparatus of claim 6, the apparatus further includes:
a time interleaver to time interleave the encoded service data by a skip operation.

9. The apparatus of claim 7, wherein the apparatus further includes:
a scrambler to scramble the segmented signaling data.

10. The apparatus of claim 8, the apparatus further includes:
   an adder to add additional parity bits for next signal frame into a current frame, wherein a number of additional parity bits is decided based on the variable size of the signaling data in the current frame.

\* \* \* \* \*